US012751143B2

(12) United States Patent
Huang et al.

(10) Patent No.: US 12,751,143 B2
(45) Date of Patent: Sep. 29, 2026

(54) DISPLAY SUBSTRATE WITH MULTIPLE INSULATING LAYERS AND PREPARATION METHOD THEREFOR, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Yao Huang, Beijing (CN); Yang Zhou, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 445 days.

(21) Appl. No.: 18/279,395

(22) PCT Filed: Oct. 24, 2022

(86) PCT No.: PCT/CN2022/127055

§ 371 (c)(1),
(2) Date: Aug. 30, 2023

(87) PCT Pub. No.: WO2024/086976

PCT Pub. Date: May 2, 2024

(65) Prior Publication Data

US 2025/0089459 A1 Mar. 13, 2025

(51) Int. Cl.

*H10K 59/12* (2023.01)
*H10K 59/121* (2023.01)
*H10K 59/124* (2023.01)

(52) U.S. Cl.

CPC ..... *H10K 59/1216* (2023.02); *H10K 59/1201* (2023.02); *H10K 59/124* (2023.02)

(58) Field of Classification Search

CPC ........... H10K 59/1216; H10K 59/1201; H10K 59/124

(Continued)

(56) References Cited

U.S. PATENT DOCUMENTS

2015/0123084 A1 5/2015 Kim et al.
2016/0365404 A1 12/2016 Seol et al.

(Continued)

FOREIGN PATENT DOCUMENTS

CN 109147648 A 1/2019
CN 109493806 A 3/2019

(Continued)

*Primary Examiner* — Phuc T Dang

(57) ABSTRACT

The display substrate includes a plurality of circuit units, wherein at least one circuit unit includes a pixel drive circuit, the pixel drive circuit includes a storage capacitor and a plurality of oxide transistors, the storage capacitor includes a first capacitor plate and a second capacitor plate, and a capacitor insulating layer is arranged between the first capacitor plate and the second capacitor plate; and on a plane perpendicular to the display substrate, at least one circuit unit includes a semiconductor layer and a first source-drain metal layer arranged on a base substrate in a direction away from the base substrate, at least one capacitor insulating layer is arranged on a side of the semiconductor layer close to the base substrate, or at least one capacitor insulating layer is arranged on a side of the first source-drain metal layer away from the base substrate.

8 Claims, 48 Drawing Sheets

(58) Field of Classification Search
USPC .......................................................... 257/71
See application file for complete search history.

(56) References Cited

U.S. PATENT DOCUMENTS

| | | | | |
|---|---|---|---|---|
| 2018/0130910 | A1* | 5/2018 | Yoshitani | H10D 86/411 |
| 2020/0243012 | A1 | 7/2020 | Jin et al. | |
| 2021/0104558 | A1 | 4/2021 | Kim et al. | |
| 2021/0158755 | A1 | 5/2021 | Li et al. | |
| 2021/0193049 | A1 | 6/2021 | Lin et al. | |
| 2022/0285476 | A1 | 9/2022 | Li et al. | |
| 2022/0320212 | A1 | 10/2022 | Gui et al. | |
| 2023/0038017 | A1 | 2/2023 | Wei et al. | |

FOREIGN PATENT DOCUMENTS

| | | | | | |
|---|---|---|---|---|---|
| CN | 110610684 | A | | 12/2019 | |
| CN | 110649046 | A | | 1/2020 | |
| CN | 111564476 | A | | 8/2020 | |
| CN | 112509519 | A | | 3/2021 | |
| CN | 112614870 | A | | 4/2021 | |
| CN | 112968032 | A | * | 6/2021 | H10D 86/481 |
| CN | 113097247 | A | | 7/2021 | |
| CN | 113261106 | A | | 8/2021 | |
| CN | 114586155 | A | | 6/2022 | |
| CN | 115000092 | A | | 9/2022 | |
| CN | 115000147 | A | * | 9/2022 | H10D 86/60 |
| KR | 1020150051824 | A | | 5/2015 | |
| WO | 2021133461 | A1 | | 7/2021 | |

* cited by examiner

DISPLAY SUBSTRATE WITH MULTIPLE INSULATING LAYERS AND PREPARATION METHOD THEREFOR, AND DISPLAY APPARATUS

CROSS-REFERENCE TO RELATED APPLICATION

The present application is a U.S. National Phase Entry of International PCT Application No. PCT/CN2022/127055 having an international filing date of Oct. 24, 2022, the above-identified application is incorporated by reference herein in their entirety.

TECHNICAL FIELD

The present disclosure relates to, but is not limited to, the field of display technology, and particularly to a display substrate and a preparation method therefor, and a display apparatus.

BACKGROUND

An Organic Light Emitting Diode (OLED) and a Quantum-dot Light Emitting Diode (QLED) are active light emitting display devices and have advantages such as self-luminescence, a wide viewing angle, a high contrast, low power consumption, an extremely high response speed, lightness and thinness, flexibility, and a low cost. With constant development of display technology, a flexible display apparatus (Flexible Display) in which an OLED or a QLED is used as a light emitting device and signal control is performed through a Thin Film Transistor (TFT) has become a mainstream product in the field of display at present.

SUMMARY

The following is a summary of subject matter described herein in detail. The summary is not intended to limit the protection scope of claims.

In an aspect, the present disclosure provides a display substrate, including a plurality of circuit units, wherein at least one circuit unit includes a pixel drive circuit, the pixel drive circuit includes a storage capacitor and a plurality of oxide transistors, the storage capacitor at least includes a first capacitor plate and a second capacitor plate, an orthographic projection of the first capacitor plate on a plane of the display substrate at least partially overlaps an orthographic projection of the second capacitor plate on the plane of the display substrate, and a capacitor insulating layer is arranged between the first capacitor plate and the second capacitor plate; and on a plane perpendicular to the display substrate, at least one circuit unit includes a semiconductor layer and a first source-drain metal layer arranged on a base substrate in a direction away from the base substrate, at least one capacitor insulating layer is arranged on a side of the semiconductor layer close to the base substrate, or at least one capacitor insulating layer is arranged on a side of the first source-drain metal layer away from the base substrate.

In an exemplary implementation, on the plane perpendicular to the display substrate, at least one circuit unit at least includes a shielding conductive layer, a first insulating layer, a first gate metal layer, a second insulating layer, a semiconductor layer, a third insulating layer, a second gate metal layer, a fourth insulating layer and a first source-drain metal layer arranged sequentially on the base substrate in a direction away from the base substrate, the first capacitor plate includes a first plate arranged in the shielding conductive layer, the second capacitor plate includes a second plate arranged in the first gate metal layer, an orthographic projection of the first plate on the base substrate at least partially overlaps an orthographic projection of the second plate on the base substrate, and the first plate and the second plate form a first storage capacitor.

In an exemplary implementation, the first capacitor plate further includes a third plate arranged in the second gate metal layer, an orthographic projection of the third plate on the base substrate at least partially overlaps the orthographic projection of the second plate on the base substrate, and the third plate and the second plate form a second storage capacitor.

In an exemplary implementation, the third plate is connected to the first plate through a connection electrode, and the first storage capacitor and the second storage capacitor form a storage capacitor with a parallel structure.

In an exemplary implementation, the plurality of oxide transistors at least include a drive transistor, the drive transistor includes a bottom gate electrode and a top gate electrode, the bottom gate electrode of the drive transistor is arranged in the first gate metal layer, the top gate electrode of the drive transistor is arranged in the second gate metal layer, the bottom gate electrode of the drive transistor and the second plate are connected to each other to form an integrated structure, and the top gate electrode of the drive transistor and the third plate are connected to each other to form an integrated structure.

In an exemplary implementation, the plurality of oxide transistors further include a compensation transistor and a first reset transistor, a first electrode of the first reset transistor is connected to a first initial signal line, a second electrode of the compensation transistor is connected to a first electrode of the drive transistor, and a second electrode of the first reset transistor and a first electrode of the compensation transistor are connected to the top gate electrode of the drive transistor.

In an exemplary implementation, the plurality of oxide transistors further include a light emitting transistor and a second reset transistor, a first electrode of the light emitting transistor is connected to a second electrode of the drive transistor, a first electrode of the second reset transistor is connected to a second initial signal line, and a second electrode of the light emitting transistor and a second electrode of the second reset transistor are connected to the bottom gate electrode of the drive transistor.

In an exemplary implementation, on the plane perpendicular to the display substrate, at least one circuit unit at least includes a shielding conductive layer, a first insulating layer, a semiconductor layer, a second insulating layer, a first gate metal layer, a fourth insulating layer, a first source-drain metal layer, a first planarization layer and a second source-drain metal layer arranged sequentially on the base substrate in a direction away from the base substrate, the first capacitor plate includes a fourth plate arranged in the first source-drain metal layer, the second capacitor plate includes a fifth plate arranged in the second source-drain metal layer, an orthographic projection of the fourth plate on the base substrate at least partially overlaps an orthographic projection of the fifth plate on the base substrate, and the fourth plate and the fifth plate form a third storage capacitor.

In an exemplary implementation, the first source-drain metal layer and the first planarization layer are further provided with a fifth insulating layer, the first planarization layer is provided with a planarization groove, the first planarization layer in the planarization groove is removed to expose the fifth insulating layer, the fifth plate is arranged in the planarization groove, and an orthographic projection of the planarization groove on the base substrate includes the orthographic projections of the fourth plate and the second plate on the base substrate.

In an exemplary implementation, at least one circuit unit further includes a second planarization layer arranged on a side of the second source-drain metal layer away from the base substrate and a third source-drain metal layer arranged on a side of the second planarization layer away from the base substrate, the first capacitor plate further includes a sixth plate arranged in the third source-drain metal layer, an orthographic projection of the sixth plate on the base substrate at least partially overlaps the orthographic projection of the fifth plate on the base substrate, and the fifth plate and the sixth plate form a fourth storage capacitor.

In an exemplary implementation, the sixth plate is connected to the fourth plate through a connection electrode, and the third storage capacitor and the fourth storage capacitor form a storage capacitor with a parallel structure.

In an exemplary implementation, the plurality of oxide transistors at least include a drive transistor, the drive transistor includes a bottom gate electrode and a top gate electrode, the bottom gate electrode of the drive transistor is arranged in the shielding conductive layer, the top gate electrode of the drive transistor is arranged in the first conductive layer, and the fourth plate is connected to the top gate electrode of the drive transistor through a via.

In an exemplary implementation, the plurality of oxide transistors further include a compensation transistor and a first reset transistor, a first electrode of the first reset transistor is connected to a first initial signal line, a second electrode of the compensation transistor is connected to a first electrode of the drive transistor, and a second electrode of the first reset transistor and a first electrode of the compensation transistor are connected to the top gate electrode of the drive transistor.

In an exemplary implementation, the plurality of oxide transistors further include a data write transistor, a first electrode of the data write transistor is connected to a data signal line, and a second electrode of the data write transistor and a second electrode of the drive transistor are connected to the bottom gate electrode of the drive transistor.

In another aspect, the present disclosure further provides a display apparatus, including the display substrate described above.

In a further aspect, the present disclosure further provides a preparation method for a display substrate, wherein the display substrate includes a plurality of circuit units, at least one circuit unit includes a pixel drive circuit, the pixel drive circuit includes a storage capacitor and a plurality of oxide transistors, the storage capacitor includes a first capacitor plate and a second capacitor plate, an orthographic projection of the first capacitor plate on a plane of the display substrate at least partially overlaps an orthographic projection of the second capacitor plate on the plane of the display substrate, and a capacitor insulating layer is arranged between the first capacitor plate and the second capacitor plate; the preparation method including:

forming a semiconductor layer and a first source-drain metal layer on a base substrate in a direction away from the base substrate, at least one capacitor insulating layer being arranged on a side of the semiconductor layer close to the base substrate, or at least one capacitor insulating layer being arranged on a side of the first source-drain metal layer away from the base substrate.

Other aspects may be understood upon reading and understanding the drawings and detailed description.

BRIEF DESCRIPTION OF DRAWINGS

Accompanying drawings are used for providing understanding of technical solutions of the present disclosure, and form a part of the specification. They are used for explaining the technical solutions of the present disclosure together with embodiments of the present disclosure, but do not form a limitation on the technical solutions of the present disclosure.

Reference signs are described as follows.

| | | |
|---|---|---|
| 10-base substrate; | 11-first shielding line; | 12-second shielding line; |
| 13-third shielding line; | 14-fourth shielding line; | 15-fifth shielding line; |
| 16-shielding electrode; | 20-drive circuit layer; | 21-first active layer; |
| 22-second active layer; | 23-third active layer; | 24-fourth active layer; |
| 25-fifth active layer; | 26-sixth active layer; | 27-seventh active layer; |
| 30-light emitting structure layer; | 31-first scan signal line; | 32-second scan signal line; |
| 33-third scan signal line; | 34-fourth scan signal line; | 35-light emitting control line; |
| 40-encapsulation structure layer; | 41-first initial sub-line; | 42-second initial sub-line; |
| 43-opening; | 44-third gate electrode; | 51-first connection electrode; |
| 52-second connection electrode; | 53-third connection electrode; | 54-fourth connection electrode; |
| 55-fifth connection electrode; | 56-sixth connection electrode; | 57-seventh connection electrode; |
| 58-eighth connection electrode; | 59-ninth connection electrode; | 60-tenth connection electrode; |
| 61-anode connection electrode; | 62-first power supply line; | 63-data signal line; |
| 64-initial connection line; | 71-first plate; | 72-second plate; |
| 73-third plate; | 74-fourth plate; | 75-fifth plate; |
| 76-sixth plate; | 77-seventh plate; | 78-eighth plate; |
| 81-first connection block; | 82-second connection block; | 83-third connection block; |
| 91-first insulating layer; | 92-second insulating layer; | 93-third insulating layer; |
| 94-fourth insulating layer; | 95-fifth insulating layer; | 96-first planarization layer; |
| 97-second planarization layer. | | |

Figure 24:
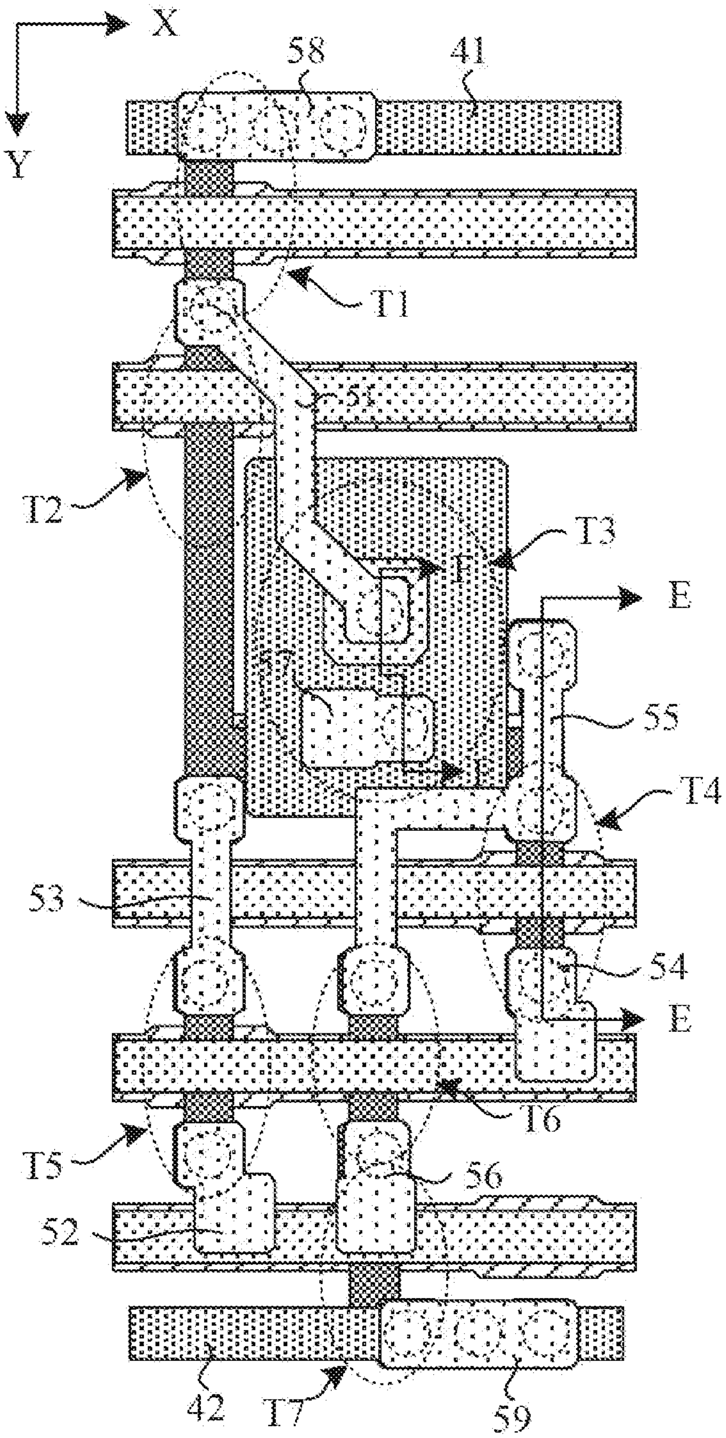

FIG. 24 is a schematic diagram of a planar structure of a further display substrate according to an exemplary embodiment of the present disclosure.

Figure 25A:
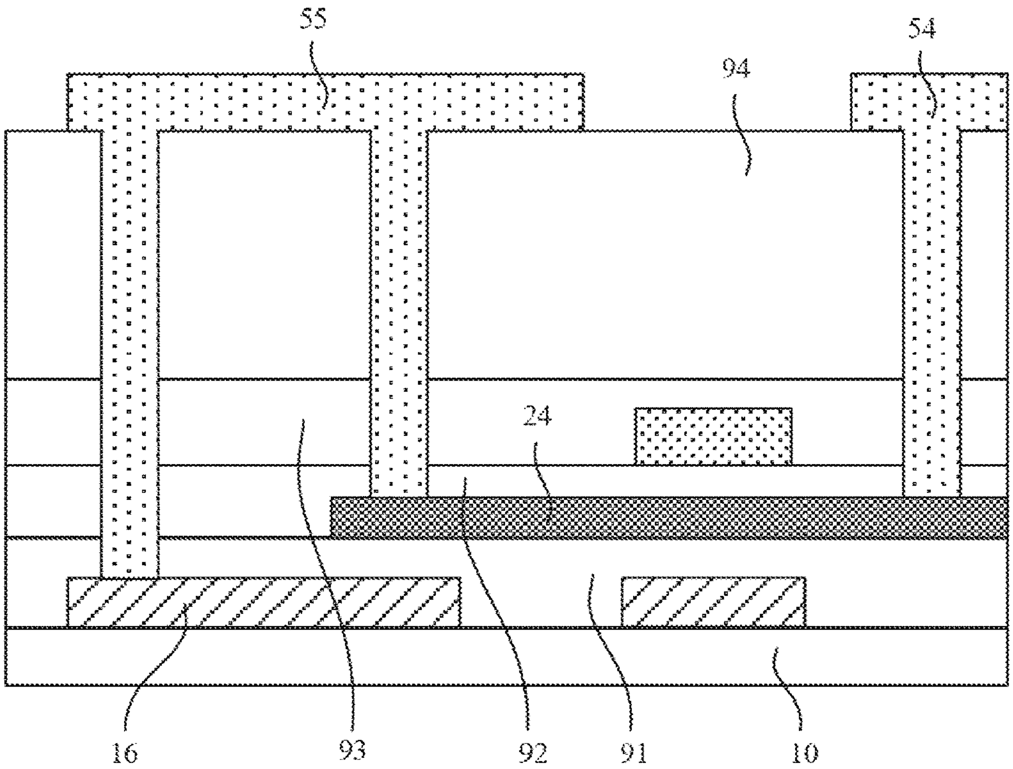

FIG. 25A is a schematic sectional view in a direction E-E in FIG. 24.

Figure 25B:
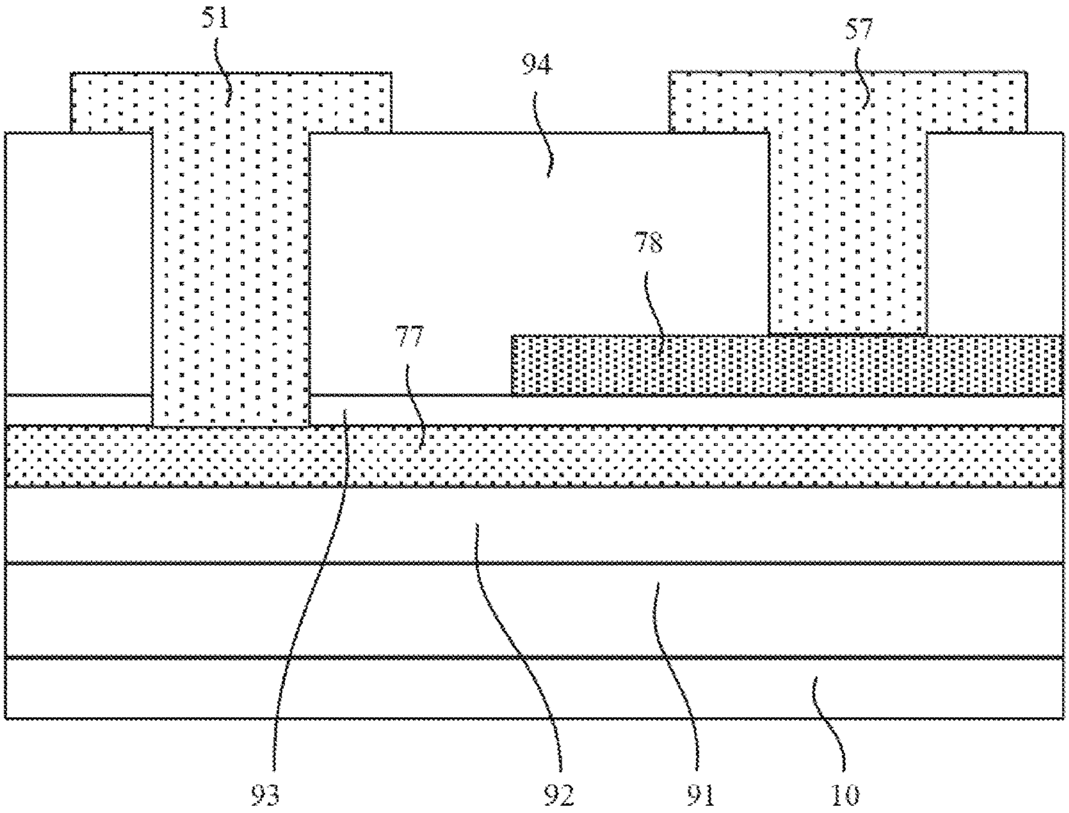

FIG. 25B is a schematic sectional view in a direction F-F in FIG. 24.

Figure 25C:
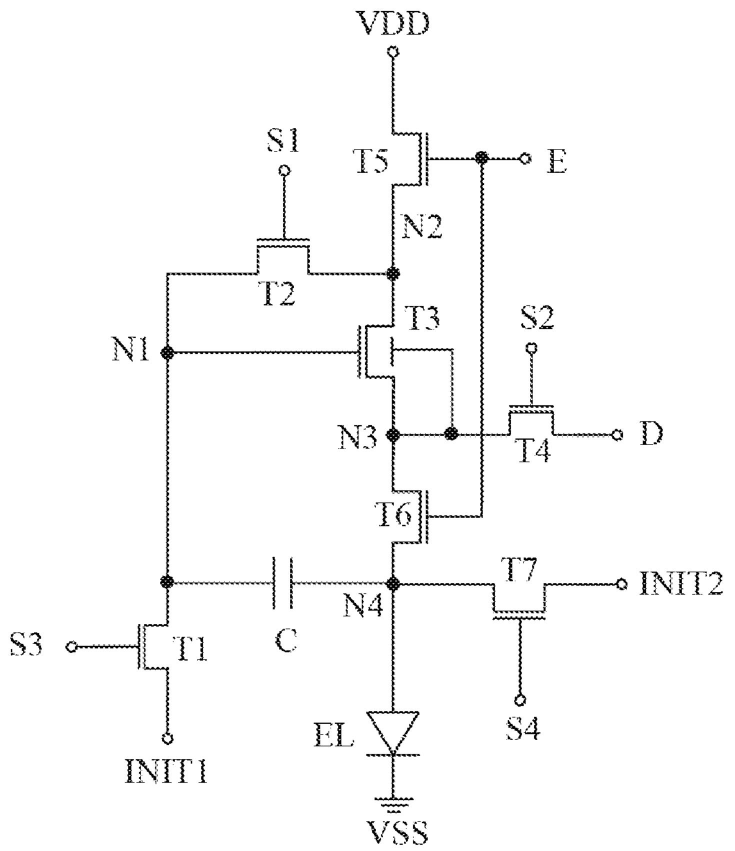

FIG. 25C is an equivalent circuit diagram of a pixel drive circuit shown in FIG. 24.

Figure 26:
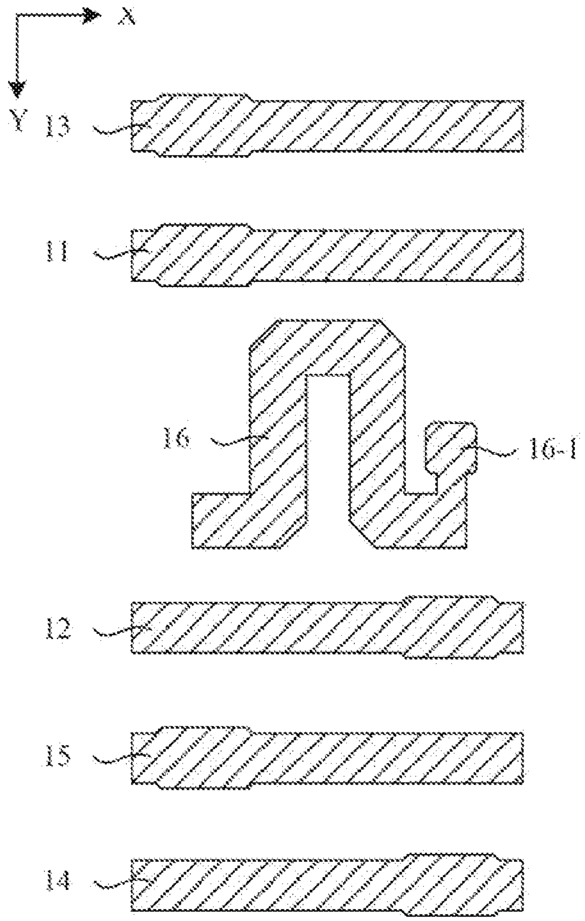

FIG. 26 is a schematic diagram of a further display substrate after a pattern of a shielding conductive layer is formed according to the present disclosure.

Figure 27:
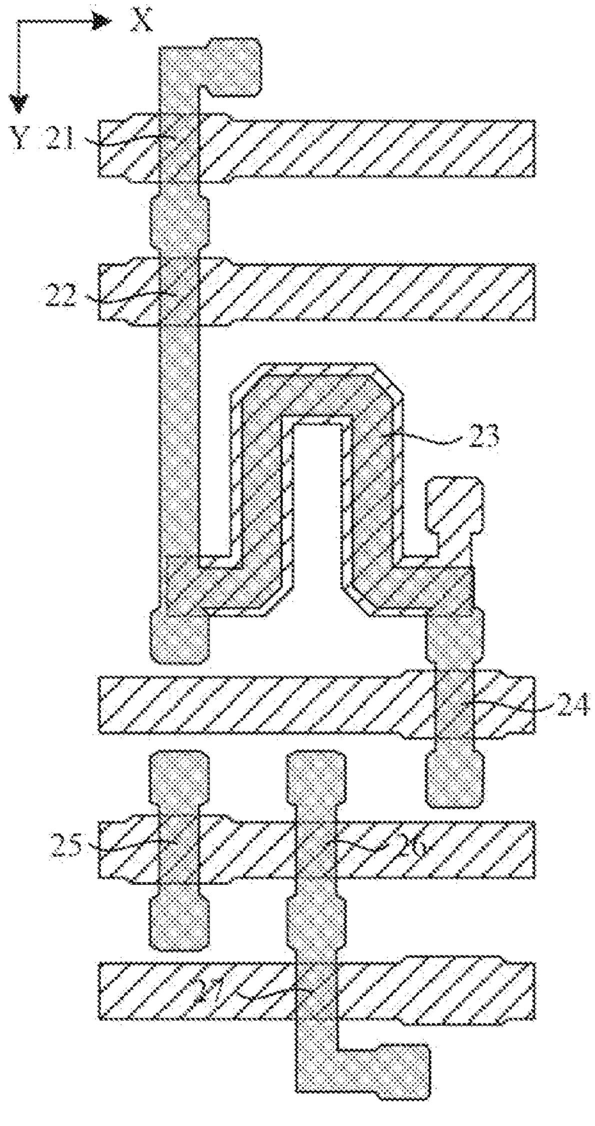

FIG. 27 is a schematic diagram of a further display substrate after a pattern of a semiconductor layer is formed according to the present disclosure.

Figure 28:
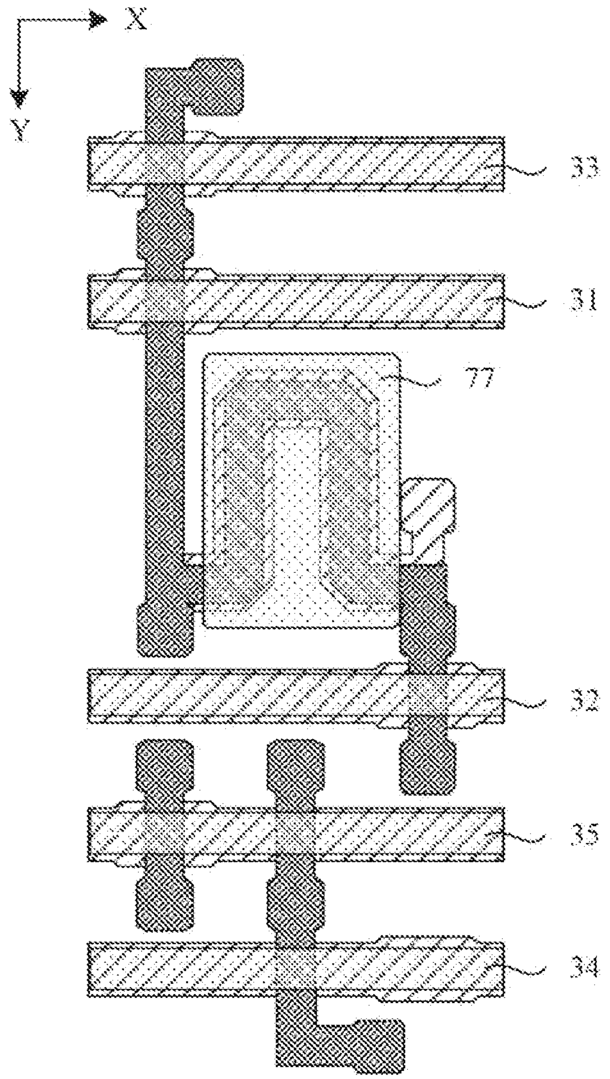

FIG. 28 is a schematic diagram of a further display substrate after a pattern of a first conductive layer is formed according to the present disclosure.

DETAILED DESCRIPTION

To make objectives, technical solutions, and advantages of the present disclosure clearer, embodiments of the present disclosure will be described in detail with reference to the accompanying drawings. It is to be noted that implementations may be practiced in a plurality of different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

Scales of the drawings in the present disclosure may be used as a reference in actual processes, but are not limited thereto. For example, a width-length ratio of a channel, a thickness and spacing of each film layer, and a width and spacing of each signal line may be adjusted according to actual needs. The number of pixels in the display substrate and the number of sub-pixels in each pixel are not limited to the numbers shown in the drawings. The drawings described in the present disclosure are schematic structural diagrams only, and one implementation of the present disclosure is not limited to the shapes, numerical values or the like shown in the drawings.

Ordinal numerals such as "first", "second", and "third" in the specification are set to avoid confusion between constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection; it may be a mechanical connection or an electrical connection; and it may be a direct mutual connection, or an indirect connection through middleware, or an internal communication between two elements. Those of ordinary skills in the art may understand specific meanings of these terms in the present disclosure according to specific situations.

In the specification, a transistor refers to an element which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode; or, the first electrode may be a source electrode, and the second electrode may be a drain electrode. In cases that transistors with opposite polarities are used, a current direction changes during operation of a circuit, or the like, functions of the "source electrode" and the "drain electrode" are sometimes interchanged. Therefore, the "source electrode" and the "drain electrode", as well as the "source terminal" and the "drain terminal", are interchangeable in the specification.

In the specification, "electrical connection" includes a case that constituent elements are connected together through an element with a certain electrical effect. The "element with a certain electrical effect" is not particularly limited as long as electrical signals may be sent and received between the connected constituent elements. Examples of the "element with a certain electrical effect" not only include electrodes and wirings, but also include switch elements such as transistors, resistors, inductors, capacitors, other elements with various functions, etc.

In the specification, "parallel" refers to a state in which an angle formed by two straight lines is −10° or more and 100 or less, and thus also includes a state in which the angle is −5° or more and 5° or less. In addition, "perpendicular" refers to a state in which an angle formed by two straight lines is 800 or more and 1000 or less, and thus also includes a state in which the angle is 850 or more and 950 or less.

In the specification, a "film" and a "layer" are interchangeable. For example, a "conductive layer" may be replaced with a "conductive film" sometimes. Similarly, an "insulating film" may be replaced with an "insulating layer" sometimes.

Triangle, rectangle, trapezoid, pentagon, hexagon, etc. in this specification are not strictly defined, and they may be approximate triangle, rectangle, trapezoid, pentagon, hexagon, etc. There may be some small deformations caused by tolerance, and there may be chamfer, arc edge, deformation, etc. In the present disclosure, "about" refers to that a boundary is defined not so strictly and numerical values within process and measurement error ranges are allowed.

Figure 1:
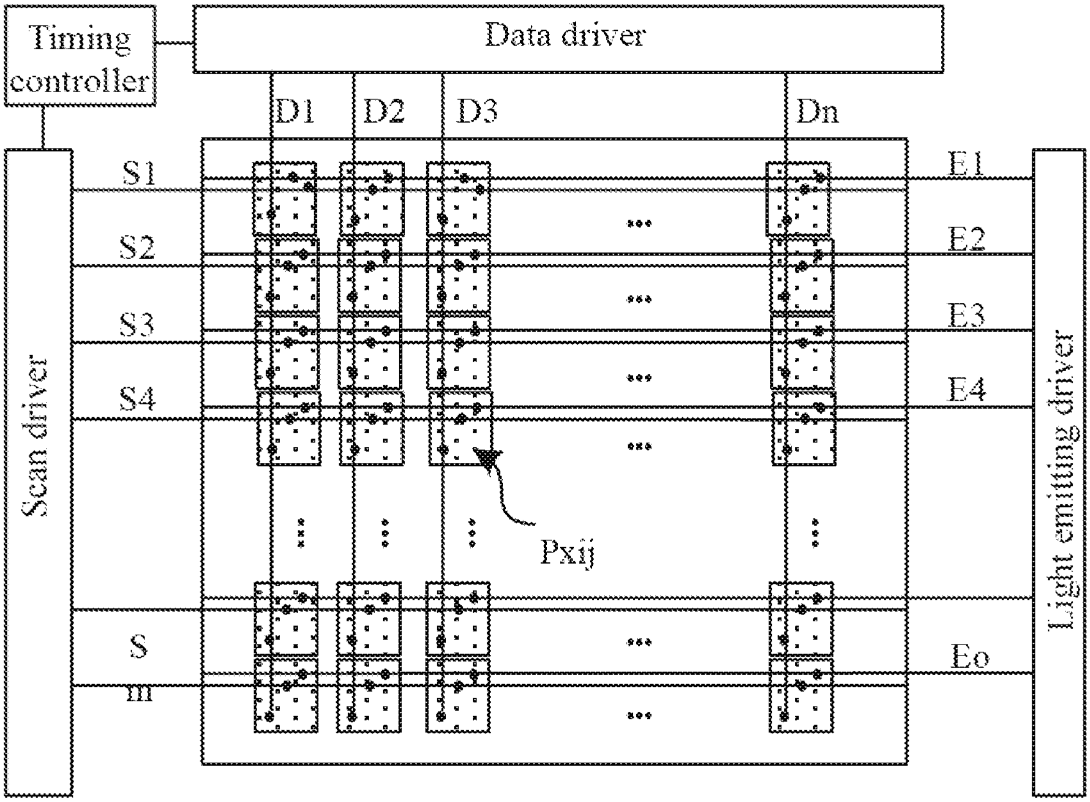
FIG. 1 is a schematic diagram of a structure of a display apparatus.

FIG. 1 is a schematic diagram of a structure of a display apparatus. As shown in FIG. 1, the display apparatus may include a timing controller, a data driver, a scan driver, a light emitting driver and a pixel array. The timing controller is connected to the data driver, the scan driver and the light emitting driver, respectively, the data driver is connected to a plurality of data signal lines (D1 to Dn) respectively, the scan driver is connected to a plurality of scan signal lines (S1 to Sm) respectively, and the light emitting driver is connected to a plurality of light emitting signal lines (E1 to Eo) respectively. The pixel array may include multiple sub-pixels Pxij, wherein i and j may be natural numbers. At least one sub-pixel Pxij may include a circuit unit and a light emitting device connected to the circuit unit. The circuit unit may include a pixel drive circuit, and the pixel drive circuit is connected to a scan signal line, a light emitting signal line, and a data signal line. In an exemplary implementation, the timing controller may provide the data driver with a gray scale value and a control signal which are suitable for a specification of the data driver, provide the scan driver with a clock signal, a scan start signal, etc., which are suitable for a specification of the scan driver, and provide the light emitting driver with a clock signal, an emission stop signal, etc., which are suitable for a specification of the light emitting driver. The data driver may generate data voltages to be provided to the data signal lines D1, D2, D3, . . . , and Dn using the gray scale value and the control signal that are received from the timing controller. For example, the data driver may sample the gray scale value using the clock signal and apply a data voltage corresponding to the gray scale value to the data signal lines D1 to Dn by taking a unit row as a unit, wherein n may be a natural number. The scan driver may generate scan signals to be provided to the scan signal lines S1, S2, S3, . . . , and Sm by receiving the clock signal, the scan start signal, etc. from the timing controller. For example, the scan driver may sequentially provide a scan signal with an on-level pulse to the scan signal lines S1 to Sm. For example, the scan driver may be configured in a form of a shift register and may generate a scan signal in a manner in which the scan start signal provided in a form of an on-level pulse is transmitted to a next-stage circuit sequentially under the control of the clock signal, wherein m may be a natural number. The light emitting driver may receive a clock signal, an emission stop signal, etc., from the timing controller to generate an emission signal to be provided to the light emitting signal lines E1, E2, E3, . . . , and Eo. For example, the light emitting driver may provide an emission signal with an off-level pulse to the light emitting signal lines E1 to Eo sequentially. For example, the light emitting driver may be constructed in a form of a shift register and may generate an emission signal in a manner in which an emission stop signal provided in a form of an off-level pulse is transmitted to a next-stage circuit sequentially under control of the clock signal, wherein o may be a natural number.

Figure 2:
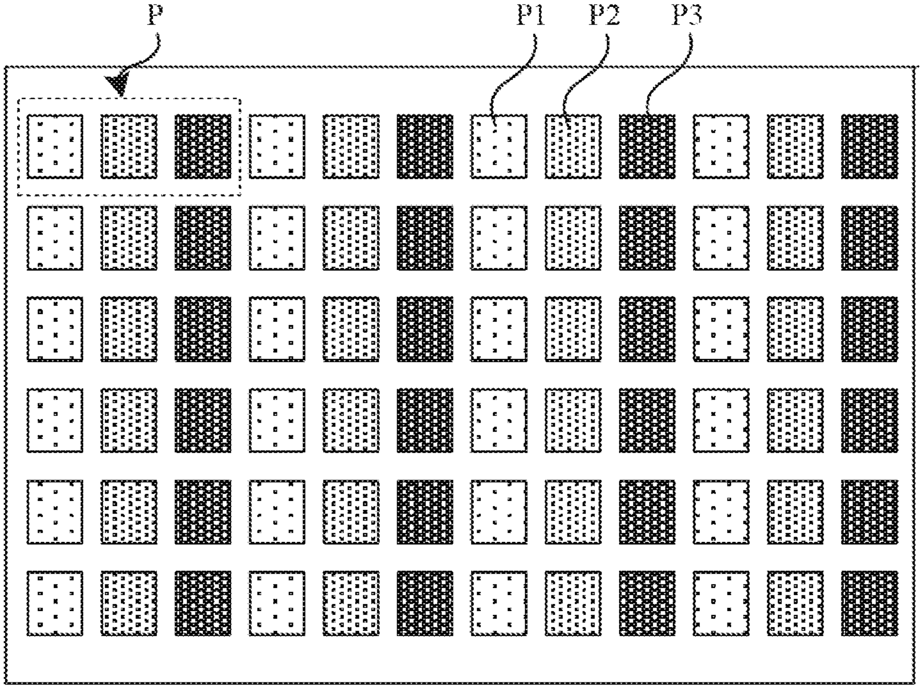
FIG. 2 is a schematic diagram of a planar structure of a display substrate.

FIG. 2 is a schematic diagram of a planar structure of a display substrate. As shown in FIG. 2, the display substrate may include a plurality of pixel units P arranged in a matrix. At least one pixel unit P may include a first sub-pixel P1 emitting light of a first color, a second sub-pixel P2 emitting light of a second color, and a third sub-pixel P3 emitting light of a third color. Each sub-pixel may include a circuit unit and a light emitting device, wherein the circuit unit may at least include a pixel drive circuit, the pixel drive circuit is connected to a scan signal line, a light emitting signal line, and a data signal line respectively, and the pixel drive circuit is configured to receive a data voltage transmitted by the data signal line and output a corresponding current to the light emitting device under control of the scan signal line and the light emitting signal line. The light emitting device in each sub-pixel is connected to a pixel drive circuit of the sub-pixel where the light emitting device is located, and the light emitting device is configured to emit light with a corresponding brightness in response to a current output by the pixel drive circuit of the sub-pixel where the light emitting device is located.

In an exemplary implementation, the first sub-pixel P1 may be a red (R) sub-pixel emitting red light, the second sub-pixel P2 may be a blue (B) sub-pixel emitting blue light, and the third sub-pixel P3 may be a green (G) sub-pixel emitting green light. In an exemplary implementation, a sub-pixel may be in a shape of a rectangle, a rhombus, a pentagon, or a hexagon. Three sub-pixels may be arranged side by side horizontally, side by side vertically, or in a manner like a Chinese character "品" etc., which is not limited here in the present disclosure.

In an exemplary implementation, the pixel unit may include four sub-pixels, and the four sub-pixels may be arranged horizontally, vertically or squarely, which is not limited here in the present disclosure.

Figure 3:
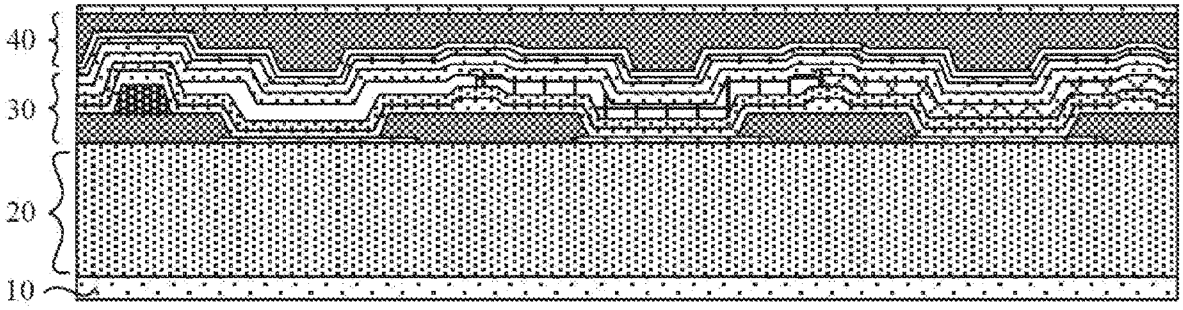
FIG. 3 is a schematic diagram of a sectional structure of a display substrate.

FIG. 3 is a schematic diagram of a sectional structure of a display substrate, which illustrates a structure of four sub-pixels. As shown in FIG. 3, in a plane perpendicular to the display substrate, the display substrate may include a drive circuit layer 20 arranged on a base substrate 10, a light emitting structure layer 30 arranged on a side of the drive circuit layer 20 away from the base substrate 10, and an encapsulation structure layer 40 arranged on a side of the light emitting structure layer 30 away from the base substrate 10. In some possible implementations, the display substrate may include other film layers, such as a touch structure layer, etc., which is not limited here in the present disclosure.

In an exemplary implementation, the base substrate 10 may be a flexible base substrate, or a rigid base substrate. The drive circuit layer 20 may include a plurality of circuit units, each of which may at least include a pixel drive circuit composed of a plurality of transistors and a storage capacitor. The light emitting structure layer 30 may include a plurality of light emitting devices, and each light emitting device may at least include an anode, a pixel definition layer, an organic light emitting layer, and a cathode. The anode is connected to the pixel drive circuit. The organic light emitting layer is connected to the anode. The cathode is connected to the organic light emitting layer. The organic light emitting layer emits light of a corresponding color under driving of the anode and the cathode. The encapsulation structure layer 40 may include a first encapsulation layer, a second encapsulation layer, and a third encapsulation layer that are stacked, the first encapsulation layer and the third encapsulation layer may be made of an inorganic material, the second encapsulation layer may be made of an organic material, and the second encapsulation layer is arranged between the first encapsulation layer and the third encapsulation layer to form an inorganic material/organic material/inorganic material laminated structure, which can ensure that external water vapor cannot enter the light emitting structure layer 30.

With gradual maturity of an OLED display technology and continuous improvement of a yield, a cost of an OLED display apparatus is continuously decreasing, which enables the OLED display apparatus to be gradually applied in more fields, e.g., a field of large and medium-sized electronic products. With an increase in size of the display substrate, the yield of the display substrate using Low Temperature Poly-Silicon (LTPS) thin film transistors decreases, resulting in a relatively high cost. Therefore, display substrates entirely using oxide transistors become to be valued.

An exemplary embodiment of the present disclosure provides a display substrate, including a plurality of circuit units, wherein at least one circuit unit includes a pixel drive circuit, the pixel drive circuit includes a storage capacitor and a plurality of oxide transistors, the storage capacitor at least includes a first capacitor plate and a second capacitor plate, an orthographic projection of the first capacitor plate on a plane of the display substrate at least partially overlaps an orthographic projection of the second capacitor plate on the plane of the display substrate, and a capacitor insulating layer is arranged between the first capacitor plate and the second capacitor plate; on a plane perpendicular to the display substrate, at least one circuit unit includes a semiconductor layer and a first source-drain metal layer arranged on a base substrate in a direction away from the base substrate, at least one capacitor insulating layer is arranged on a side of the semiconductor layer close to the base substrate, or at least one capacitor insulating layer is arranged on a side of the first source-drain metal layer away from the base substrate.

In an exemplary implementation, on the plane perpendicular to the display substrate, at least one circuit unit at least includes a shielding conductive layer, a first insulating layer, a first gate metal layer, a second insulating layer, a semiconductor layer, a third insulating layer, a second gate metal layer, a fourth insulating layer and a first source-drain metal layer arranged sequentially on the base substrate in a direction away from the base substrate, the first capacitor plate includes a first plate arranged in the shielding conductive layer, the second capacitor plate includes a second plate arranged in the first gate metal layer, an orthographic projection of the first plate on the base substrate at least partially overlaps an orthographic projection of the second plate on the base substrate, and the first plate and the second plate form a first storage capacitor.

In an exemplary implementation, the first capacitor plate further includes a third plate arranged in the second gate metal layer, an orthographic projection of the third plate on the base substrate at least partially overlaps the orthographic projection of the second plate on the base substrate, and the third plate and the second plate form a second storage capacitor.

In an exemplary implementation, the third plate is connected to the first plate through a connection electrode, and the first storage capacitor and the second storage capacitor form a storage capacitor with a parallel structure.

In another exemplary implementation, on the plane perpendicular to the display substrate, at least one circuit unit at least includes a shielding conductive layer, a first insulating layer, a semiconductor layer, a second insulating layer, a first gate metal layer, a fourth insulating layer, a first source-drain metal layer, a first planarization layer and a second source-drain metal layer arranged sequentially on the base substrate in a direction away from the base substrate, the first capacitor plate includes a fourth plate arranged in the first source-drain metal layer, the second capacitor plate includes a fifth plate arranged in the second source-drain metal layer, an orthographic projection of the fourth plate on the base substrate at least partially overlaps an orthographic projection of the fifth plate on the base substrate, and the fourth plate and the fifth plate form a third storage capacitor.

In an exemplary implementation, at least one circuit unit further includes a second planarization layer arranged on a side of the second source-drain metal layer away from the base substrate and a third source-drain metal layer arranged on a side of the second planarization layer away from the base substrate, the first capacitor plate further includes a sixth plate arranged in the third source-drain metal layer, an orthographic projection of the sixth plate on the base substrate at least partially overlaps the orthographic projection of the fifth plate on the base substrate, and the fifth plate and the sixth plate form a fourth storage capacitor.

In an exemplary implementation, the sixth plate is connected to the fourth plate through a connection electrode, and the third storage capacitor and the fourth storage capacitor form a storage capacitor with a parallel structure.

In an exemplary implementation, a material of the semiconductor layer may include indium gallium zinc oxide (IGZO). However, this is not limited in an exemplary embodiment of the present disclosure. For example, the material of the semiconductor layer may be other metal oxide materials.

The display substrate of the present disclosure is described below with some examples.

Figure 4:
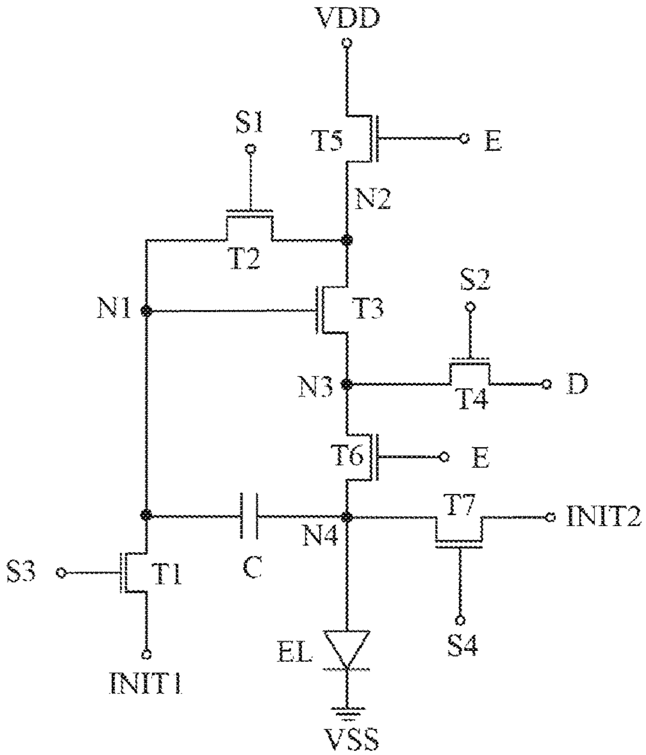
FIG. 4 is an equivalent circuit diagram of a pixel drive circuit according to an exemplary embodiment of the present disclosure.

FIG. 4 is an equivalent circuit diagram of a pixel drive circuit according to an exemplary embodiment of the present disclosure. In an exemplary implementation, the pixel drive circuit may have a structure of 3T1C, 4T1C, 5T1C, 5T2C, 6T1C, 7T1C, or 8T1C. As shown in FIG. 4, the pixel drive circuit of an exemplary embodiment of the present disclosure may include seven transistors (a first transistor T1 to a seventh transistor T7) and one storage capacitor C, and the pixel drive circuit is respectively connected to nine signal lines (a first scan signal line S1, a second scan signal line S2, a third scan signal line S3, a fourth scan signal line S4, a light emitting signal line E, a first initial signal line INIT1, a second initial signal line INIT2, a data signal line D and a first power supply line VDD).

In an exemplary implementation, the pixel drive circuit may include a first node N1, a second node N2, a third node N3 and a fourth node N4. The first node N1 is respectively connected to a second electrode of the first transistor T1, a first electrode of the second transistor T2, a gate electrode of the third transistor T3 and a first end of the storage capacitor C, the second node N2 is respectively connected to a second electrode of the second transistor T2, a first electrode of the third transistor T3 and a second electrode of the fifth transistor T5, the third node N3 is respectively connected to a second electrode of the third transistor T3, a second electrode of the fourth transistor T4 and a first electrode of the sixth transistor T6, the fourth node N4 is respectively connected to a second electrode of the sixth transistor T6, a second electrode of the seventh transistor T7 and a second end of the storage capacitor C, and the fourth node N4 is also connected to an anode of the light emitting device EL.

In an exemplary implementation, the first end of the storage capacitor C is connected to the first node N1, and the second end of the storage capacitor C is connected to the fourth node N4, i.e., the first end of the storage capacitor C is connected to the gate electrode of the third transistor T3, and the second end of the storage capacitor C is connected to the anode of the light emitting device EL.

In an exemplary implementation, a gate electrode of the first transistor T1 is connected to the third scan signal line S3, a first electrode of the first transistor T1 is connected to the first initial signal line INIT1, and a second electrode of the first transistor T1 is connected to the first node N1. When a scan signal with a turn-on level is applied to the third scan signal line S3, the first transistor T1 is turned on and transmits a first initialization voltage to the first end of the storage capacitor C to initialize the storage capacitor C.

In an exemplary implementation, a gate electrode of the second transistor T2 is connected to the first scan signal line S1, a first electrode of the second transistor T2 is connected to the first node N1, and a second electrode of the second transistor T2 is connected to the second node N2. When a scan signal with a turn-on level is applied to the first scan signal line S1, the second transistor T2 enables the gate electrode of the third transistor T3 to be connected to the first electrode of the third transistor T3.

In an exemplary implementation, the gate electrode of the third transistor T3 is connected to the first node N1, i.e., the gate electrode of the third transistor T3 is connected to the first end of the storage capacitor C, the first electrode of the third transistor T3 is connected to the second node N2, and the second electrode of the third transistor T3 is connected to the third node N3. The third transistor T3 may be referred to as a drive transistor, and the third transistor T3 determines a magnitude of a drive current flowing between the first power supply line VDD and the light emitting device according to a potential difference between the gate electrode and the first electrode of the third transistor T3.

In an exemplary implementation, a gate electrode of the fourth transistor T4 is connected to the second scan signal line S2, a first electrode of the fourth transistor T4 is connected to the data signal line D, and a second electrode of the fourth transistor T4 is connected to the third node N3. When a scan signal with a turn-on level is applied to the second scan signal line S2, the fourth transistor T4 enables a data voltage of the data signal line D to be input to the third node N3.

In an exemplary implementation, a gate electrode of the fifth transistor T5 is connected to the light emitting signal line E, a first electrode of the fifth transistor T5 is connected to the first power supply line VDD, and a second electrode of the fifth transistor T5 is connected to the second node N2. A gate electrode of the sixth transistor T6 is connected to the light emitting signal line E, a first electrode of the sixth transistor T6 is connected to the third node N3, and a second electrode of the sixth transistor T6 is connected to the fourth node N4. When a light emitting signal with a turn-on level is applied to the light emitting signal line E, the fifth transistor T5 and the sixth transistor T6 cause the light emitting device to emit light by forming a drive current path between the first power supply line VDD and the light emitting device.

In an exemplary implementation, a gate electrode of the seventh transistor T7 is connected to the fourth scan signal line S4, a first electrode of the seventh transistor T7 is connected to the second initial signal line INIT2, and a second electrode of the seventh transistor T7 is connected to the fourth node N4. When a scan signal with a turn-on level is applied to the fourth scan signal line S4, the seventh transistor T7 transmits a second initial voltage to the first electrode of the light emitting device so as to initialize a charge amount accumulated in the first electrode of the light emitting device or release a charge amount accumulated in the first electrode of the light emitting device EL.

In an exemplary implementation, the light emitting device EL may be an OLED including a first electrode (anode), an organic light emitting layer, and a second electrode (cathode), which are stacked, or may be a QLED including a first electrode (anode), a quantum dot light emitting layer, and a second electrode (cathode), which are stacked.

In an exemplary implementation, the seven transistors of the pixel drive circuit may be N-type transistors. Use of a same type of transistors in a pixel drive circuit may simplify a process flow, reduce process difficulties of a display substrate, and improve a yield of products.

In an exemplary implementation, the seven transistors of the pixel drive circuit may be oxide thin film transistors. An active layer of the oxide thin film transistor may be made of an oxide semiconductor (Oxide). The oxide thin film transistor has advantages of a low leakage current and so on. Using a display substrate equipped with an oxide thin film transistor may achieve low frequency driving, reduce power consumption, and improve display quality.

In an exemplary implementation, a second electrode of the light emitting device is connected to a second power supply line VSS, a first power supply line VDD may be configured to provide a constant first voltage signal to the pixel drive circuit, and the second power supply line VSS may be configured to provide a constant second voltage signal to the pixel drive circuit, and the first voltage signal is greater than the second voltage signal. The first initial signal line INIT1 may be configured to provide a first initial signal to the pixel drive circuit, and the second initial signal line INIT2 may be configured to provide a second initial signal to the pixel drive circuit. For example, the first initial signal may be different from the second initial signal. The first initial signal and the second initial signal may be constant voltage signals, and their magnitudes, for example, may be between a first voltage signal provided by the first power supply line VDD and a second voltage signal provided by the second power supply line VSS, but not limited to this. In some possible exemplary implementations, the first initial signal and the second initial signal may be the same, and only the first initial signal line may be provided to provide the first initial signal.

In an exemplary implementation, taking a case that the first transistor T1 to the seventh transistor T7 included in the pixel drive circuit are all N-type transistors as an example, a working process of the pixel drive circuit may include following stages.

A first stage A1 is referred to as an initialization stage. A high-level signal supplied by the third scan signal line S3 causes the first transistor T1 to be turned on, and the first initial signal supplied by the first initial signal line INIT1 is supplied to the first node N1 to initialize the first node N1, clearing an original data voltage in the storage capacitor C. In this stage, the second transistor T2, the fourth transistor T4, the fifth transistor T5, the sixth transistor T6, and the seventh transistor T7 are turned off, and the light emitting element EL does not emit light.

A second stage A2 is referred to as a data write stage or a threshold compensation stage. The first scan signal line S1, the second scan signal line S2, and the fourth scan signal line S4 provide high-level signals to turn on the second transistor T2, the fourth transistor T4, and the seventh transistor T7. In this stage, the first end of the storage capacitor C is at a high level, so the third transistor T3 is turned on. The second transistor T2 and the fourth transistor T4 are turned on so that a data voltage Vd output from the data signal line D is supplied to the first node N1 through the third node N3, the turned-on third transistor T3, the second node N2, and the turned-on second transistor T2, and the difference between the data voltage Vd output from the data signal line D and a threshold voltage Vth of the third transistor T3 is charged into the storage capacitor C. The seventh transistor T7 is turned on, so that a second initial signal provided by the second initial signal line INIT2 is provided to the anode of the light emitting element EL to initialize (reset) the anode of the light emitting element EL and clear a pre-stored voltage therein, so as to complete initialization, thereby ensuring that the light emitting element EL does not emit light. In this stage, the first transistor T1, the fifth transistor T5 and the sixth transistor T6 are turned off.

A third stage A3 is referred to as a light emitting stage. The light emitting control line E provides a high-level signal, so that the fifth transistor T5 and the sixth transistor T6 are turned on, and a first voltage signal output by the first power supply line VDD provides a drive voltage to the anode of the light emitting element EL through the turned-on fifth transistor T5, the third transistor T3, and the sixth transistor T6, to drive the light emitting element EL to emit light.

In a drive process of the pixel drive circuit, a drive current flowing through the third transistor T3 (i.e., the drive transistor) is determined by a voltage difference between the gate electrode and the first electrode of the third transistor T3. Since the voltage of the first node N1 is Vd-|Vth|, the drive current of the third transistor T3 is as follows:

$$I = K\times(Vgs - Vth)^2 = K\times[(Vdd - Vd + |Vth|) - Vth]^2 = K\times[Vdd - Vd]^2.$$

In the above, I is the drive current flowing through the third transistor T3, i.e., a drive current for driving the light emitting element EL, K is a constant, Vgs is the voltage difference between the gate electrode and the first electrode of the third transistor T3, Vth is the threshold voltage of the third transistor T3, Vd is the data voltage output by the data signal line D, and Vdd is the first voltage signal output by the first power supply line VDD.

It may be seen from the above equation that the current flowing through the light emitting element EL is independent of the threshold voltage of the third transistor T3. The pixel drive circuit according to the embodiment may better compensate the threshold voltage of the third transistor T3.

Figure 5:
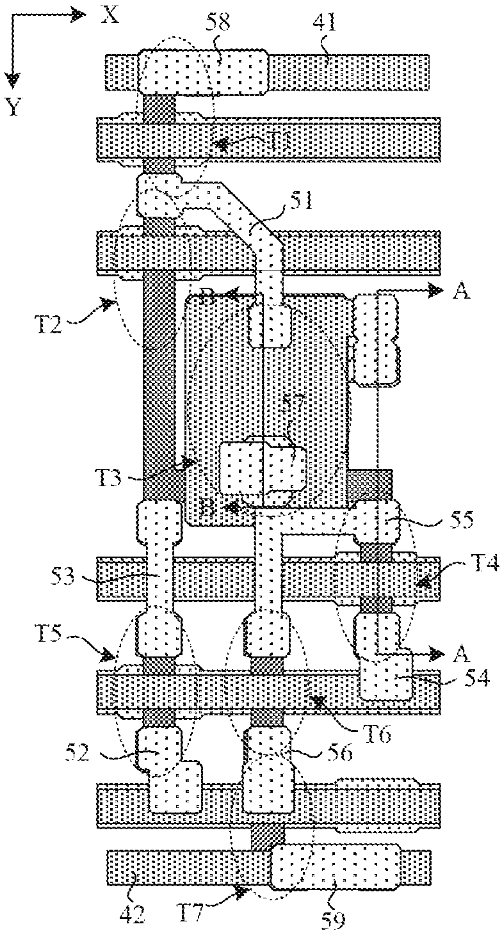
FIG. 5 is a schematic diagram of a planar structure of a display substrate according to an exemplary embodiment of the present disclosure.
Figure 6A:
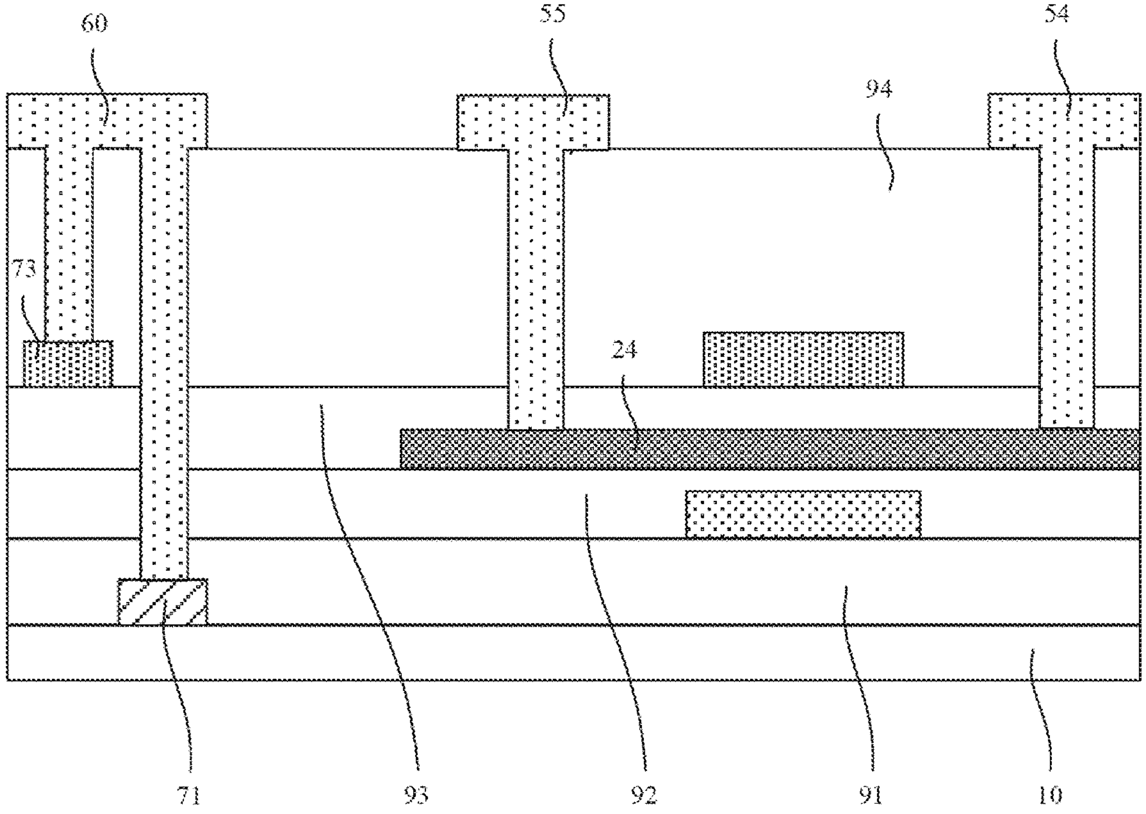
FIG. 6A is a schematic sectional view in a direction A-A in FIG. 5.
Figure 6B:
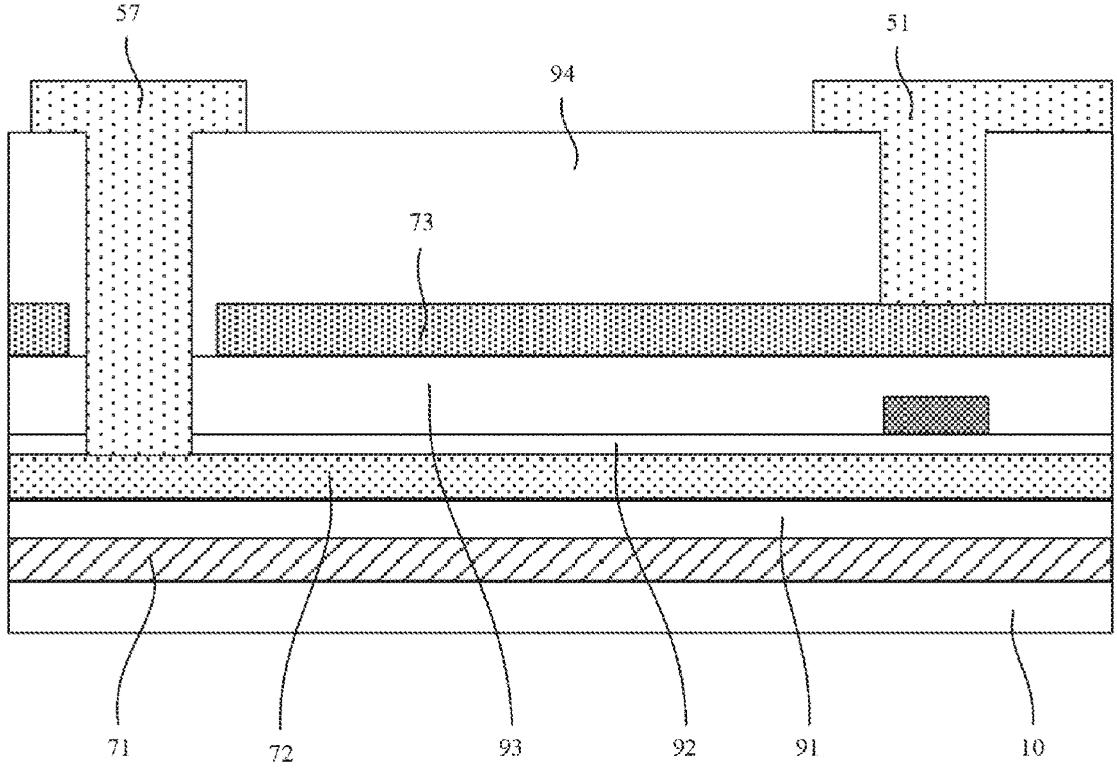
FIG. 6B is a schematic sectional view in a direction B-B in FIG. 5.
Figure 6C:
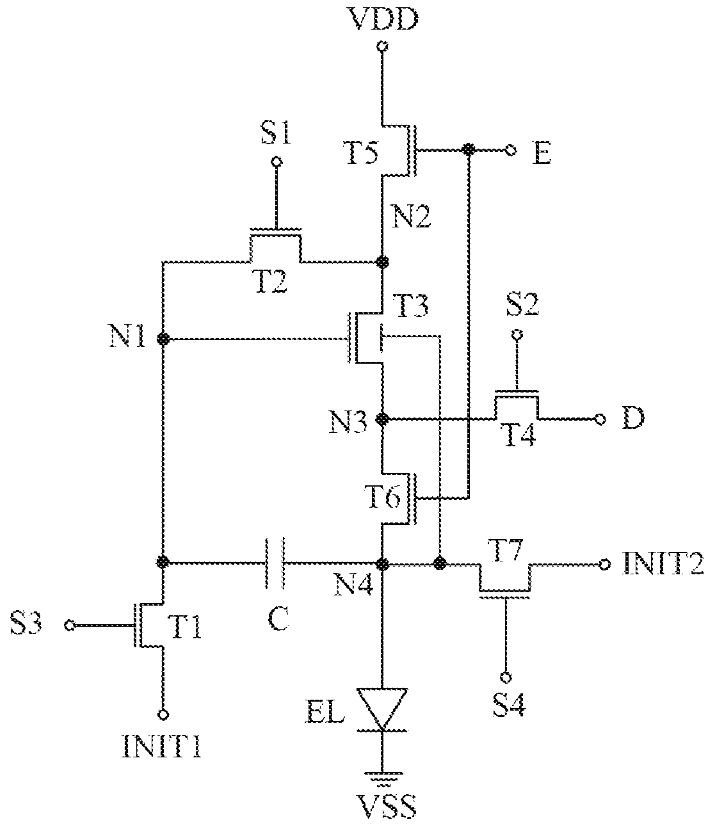
FIG. 6C is an equivalent circuit diagram of a pixel drive circuit shown in FIG. 5.

FIG. 5 is a schematic diagram of a planar structure of a display substrate according to an exemplary embodiment of the present disclosure, illustrating a structure of a pixel drive circuit in a circuit unit, FIG. 6A is a schematic sectional view in a direction A-A in FIG. 5, FIG. 6B is a schematic sectional view in a direction B-B in FIG. 5, and FIG. 6C is an equivalent circuit diagram of the pixel drive circuit shown in FIG. 5. In an exemplary implementation, in a direction perpendicular to the display substrate, the display substrate may include a drive circuit layer arranged on a base substrate, a light emitting structure layer arranged on a side of the drive circuit layer away from the base substrate, and an encapsulation structure layer arranged on a side of the light emitting structure layer away from the base substrate. In a direction parallel to the display substrate, the drive circuit layer may include circuit units forming a plurality of unit rows and a plurality of unit columns, at least one circuit unit includes a pixel drive circuit, the pixel drive circuit may include a storage capacitor, and a first transistor T1 to a seventh transistor T7, the first transistor T1 to the seventh transistor T7 being oxide transistors.

As shown in FIG. 5, FIG. 6A and FIG. 6B, in an exemplary implementation, the drive circuit layer may at least include: a shielding conductive layer arranged on a base substrate 10, a first insulating layer 91 arranged on a side of the shielding conductive layer away from the base substrate, a first conductive layer arranged on a side of the first insulating layer 91 away from the base substrate, a second insulating layer 92 arranged on a side of the first conductive layer away from the base substrate, a semiconductor layer arranged on a side of the second insulating layer 92 away from the base substrate, a third insulating layer 93 arranged on a side of the semiconductor layer away from the base substrate, a second conductive layer arranged on a side of the third insulating layer 93 away from the base substrate, a fourth insulating layer 94 arranged on a side of the second conductive layer away from the base substrate, and a third conductive layer arranged on a side of the fourth insulating layer 94 away from the base substrate.

In an exemplary implementation, the shielding conductive layer may at least include a first plate 71 of the storage capacitor, the first conductive layer may at least include a second plate 72 of the storage capacitor, the semiconductor layer may at least include active layers of the first transistor to the seventh transistor, the second conductive layer may at least include a third plate 73 of the storage capacitor, and the third conductive layer may at least include a plurality of connection electrodes.

In an exemplary implementation, an orthographic projection of the first plate 71 on the base substrate at least partially overlaps an orthographic projection of the second plate 72 on the base substrate, the first plate 71 and the second plate 72 form a first storage capacitor, and the first insulating layer 91 is a capacitor insulating layer arranged between the first plate 71 and the second plate 72. An orthographic projection of the third plate 73 on the base substrate at least partially overlaps the orthographic projection of the second plate 72 on the base substrate, the second plate 72 and the third plate 73 form a second storage capacitor, and the first storage capacitor and the second storage capacitor form a storage capacitor with a parallel structure.

In an exemplary implementation, the first transistor T1 to the seventh transistor T7 may each include a bottom gate electrode and a top gate electrode, the bottom gate electrode may be arranged in the first conductive layer, and the top gate electrode may be arranged in the second conductive layer. For example, taking the third transistor T3 as an example, the third plate 73 in the second conductive layer may serve as the top gate electrode of the third transistor T3 and is connected to the first node N1 of the pixel drive circuit, and the second plate 72 in the first conductive layer may serve as the bottom gate electrode of the third transistor T3 to shield the third transistor T3 and is connected to the fourth node N4 of the pixel drive circuit, as shown in FIG. 6C.

In an exemplary implementation, the second conductive layer may further include a first initial sub-line 41 and a second initial sub-line 42, and the plurality of connection electrodes of the third conductive layer may at least include: a first connection electrode 51, a second connection electrode 52, a third connection electrode 53, a fourth connection electrode 54, a fifth connection electrode 55, a sixth connection electrode 56, a seventh connection electrode 57, an eighth connection electrode 58, a ninth connection electrode 59, and a tenth connection electrode 60.

In an exemplary implementation, the first connection electrode 51 may serve as a first node electrode (N1 node electrode) of the pixel drive circuit, a first end of the first connection electrode 51 is connected to the third plate 73 through a via, and a second end of the first connection electrode 51 is connected to a second region of the first active layer (also a first region of the second active layer) through a via, thereby realizing that the second electrode of the first transistor T1, the first electrode of the second transistor T2 and the third plate 73 (the top gate electrode of the third transistor T3) have a same potential.

In an exemplary implementation, the second connection electrode 52 may be connected to a first region of the fifth active layer through a via, and the second connection electrode 52 is configured to be connected to the first power supply line, thus realizing that the first power supply line writes a first power supply voltage to a first electrode of the fifth transistor T5 through the second connection electrode 52.

In an exemplary implementation, the third connection electrode 53 may serve as a second node electrode (N2 node electrode) of the pixel drive circuit, a first end of the third connection electrode 53 is connected to a second region of the second active layer (also a first region of the third active layer) through a via, and a second end of the third connection electrode 53 is connected to a second region of the fifth active layer through a via, thereby realizing that a second electrode of the second transistor T2, a first electrode of the third transistor T3 and a second electrode of the fifth transistor T5 have a same potential.

In an exemplary implementation, the fourth connection electrode 54 may serve as a data input electrode of the pixel drive circuit, the fourth connection electrode 54 is connected to a first region of the fourth active layer 24 through a via, and the fourth connection electrode 54 is configured to be connected to a data signal line, thus realizing that the data signal line writes a data signal to a first electrode of the fourth transistor T4 through the fourth connection electrode 54.

In an exemplary implementation, the fifth connection electrode 55 may serve as a third node electrode (N3 node electrode) of the pixel drive circuit, on the one hand, the fifth connection electrode 55 is connected to a second region of the fourth active layer 24 (also a second region of the third active layer) through a via, and on the other hand, the fifth connection electrode 55 is connected to a first region of the sixth active layer through a via, thereby realizing that a second electrode of the third transistor T3, a second electrode of the fourth transistor T4 and a first electrode of the sixth transistor T6 have a same potential.

In an exemplary implementation, the sixth connection electrode 56 is connected to a second region of the sixth active layer (also a second region of the seventh active layer) through a via, thereby realizing that a second electrode of the sixth transistor T6 and a second electrode of the seventh transistor T7 have a same potential.

In an exemplary implementation, the seventh connection electrode 57 may serve as a fourth node electrode (N4 node electrode) of the pixel drive circuit, on the one hand, the seventh connection electrode 57 is connected to the second plate 72 through a via, and on the other hand, the seventh connection electrode 57 is connected to the sixth connection electrode 56 through an anode connection electrode (not shown), thereby realizing that the second plate 72 of the storage capacitor, the second electrode of the sixth transistor T6 and the second electrode of the seventh transistor T7 have a same potential. Since the second plate 72 simultaneously serves as the bottom gate electrode of the third transistor T3, the bottom gate electrode of the third transistor T3 has a potential of the fourth node electrode N4.

In an exemplary implementation, a first end of the tenth connection electrode 60 is connected to the first plate 71 through a via, and a second end of the tenth connection electrode 60 is connected to the third plate 73 through a via, thereby realizing that the first plate 71 and the third plate 73 have a same potential, and the first plate 71, the second plate 72 and the third plate 73 form a storage capacitor with a parallel structure.

In an exemplary implementation, the first initial sub-lines 41 may be arranged at intervals in a first direction X, and the first initial sub-lines 41 adjacent to each other in the first direction X are connected to each other through the eighth connection electrode 58 to form a first initial signal line extending in the first direction X. The eighth connection electrode 58 is also connected to a first region of the first active layer through a via, thereby realizing that the first initial signal line writes a first initial voltage to a first electrode of the first transistor T1. The second initial sub-lines 42 may be arranged at intervals in the first direction X, and the second initial sub-lines 42 adjacent to each other in the first direction X are connected to each other through the ninth connection electrode 59 to form a second initial signal line extending in the first direction X. The ninth connection electrode 59 is also connected to a first region of the seventh active layer through a via, thereby realizing that the second initial signal line writes a second initial voltage to a first electrode of the seventh transistor T7.

Exemplary description is made below through a preparation process of the display substrate of the exemplary embodiment. "Patterning processes" mentioned in the present disclosure include photoresist coating, mask exposure, development, etching, photoresist stripping, etc., for metal materials, inorganic materials or transparent conductive materials, and include organic material coating, mask exposure, development, etc., for organic materials. Deposition may be any one or more of sputtering, evaporation, and chemical vapor deposition; coating may be any one or more of spray coating, spin coating, and ink-jet printing; and etching may be any one or more of dry etching and wet etching, which is not limited in present disclosure. "Thin film" refers to a layer of thin film formed from a certain material on a base substrate using deposition, coating or other processes. If the "thin film" does not need to be processed through a patterning process in the entire manufacturing process, the "thin film" may also be called a "layer". If the "thin film" needs to be processed through the patterning process in the entire manufacturing process, the "thin film" is called a "thin film" before the patterning process is performed and is called a "layer" after the patterning process is performed. At least one "pattern" is contained in the "layer" which has been processed through the patterning process. "A and B are arranged on a same layer" in the present disclosure means that A and B are formed simultaneously through a same running of patterning process, and the "thickness" of the film layer is the size of the film layer in a direction perpendicular to the display substrate. In an exemplary implementation of the present disclosure, "an orthographic projection of B is within a range of an orthographic projection of A" or "an orthographic projection of A includes an orthographic projection of B" refers to that a boundary of the orthographic projection of B falls within a range of a boundary of the orthographic projection of A, or the boundary of the orthographic projection of A overlaps the boundary of the orthographic projection of B.

In an exemplary implementation, the preparation process of the display substrate may include following operations.

Figure 7:
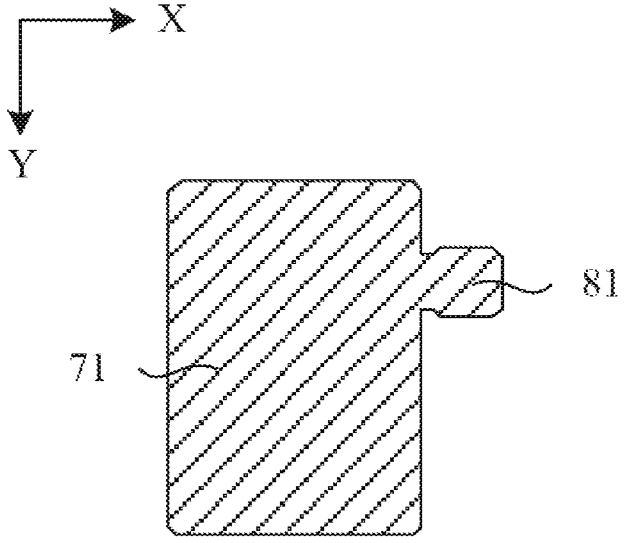
FIG. 7 is a schematic diagram of a display substrate after a pattern of a shielding conductive layer is formed according to the present disclosure.

(11) A pattern of a shielding conductive layer is formed. In an exemplary implementation, forming the pattern of the shielding conductive layer may include: depositing a shielding thin film on a base substrate, and patterning the shielding thin film by a patterning process to form the pattern of the shielding conductive layer on the base substrate, as shown in FIG. 7.

In an exemplary implementation, the pattern of the shielding conductive layer may at least include a first plate 71, the first plate 71 may be in a shape of a rectangle, corners of the rectangle may be chamfered, and the first plate 71 may serve as one plate of a storage capacitor.

In an exemplary implementation, a first connection block 81 is further connected to a side of the first plate 71 in the first direction X, and the first connection block 81 is configured to be connected to a tenth connection electrode subsequently formed, to realize mutual connection between the first plate 71 and a third plate subsequently formed.

In an exemplary implementation, a material of the shielding conductive layer may be metal molybdenum (Mo), and a thickness of the shielding conductive layer may be about 80 nm to 120 nm. For example, the thickness of the shielding conductive layer may be about 100 nm.

Figure 8A:
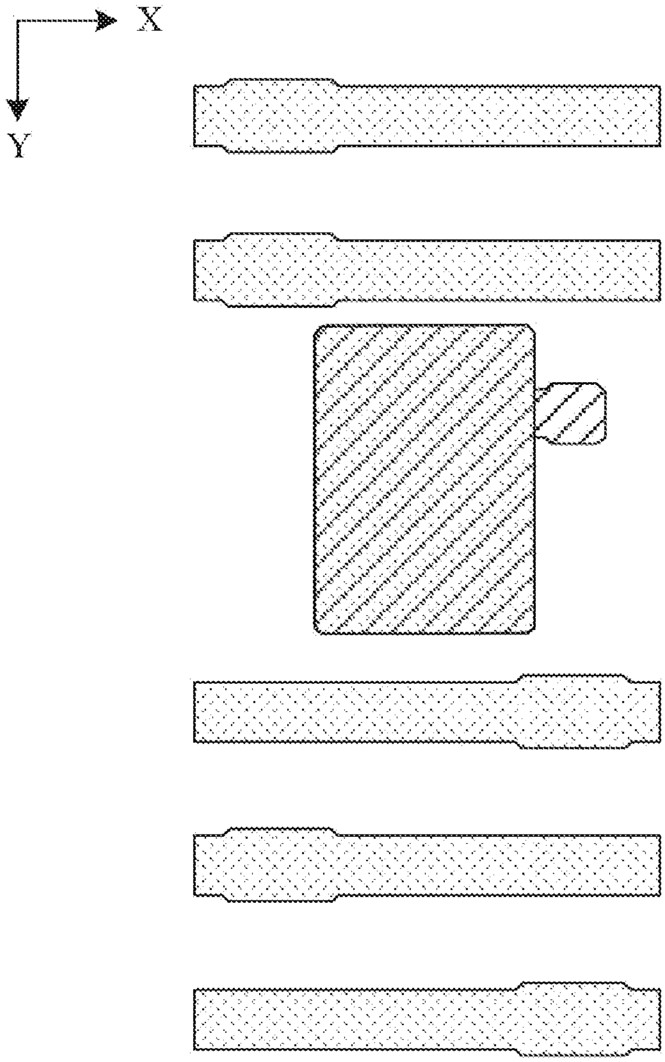
FIG. 8A and FIG. 8B are schematic diagrams of a display substrate after a pattern of a first conductive layer is formed according to the present disclosure.
Figure 8B:
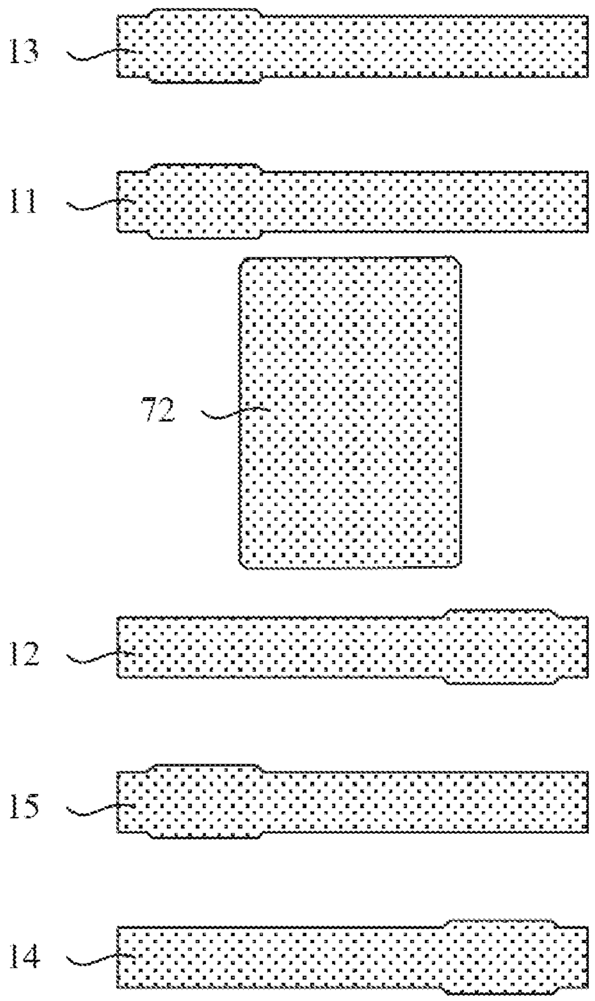

(12) A pattern of a first conductive layer is formed. In an exemplary implementation, forming the pattern of the first conductive layer may include: depositing sequentially a first insulating thin film and a first conductive thin film on the base substrate on which the aforementioned pattern is formed, and patterning the first conductive thin film by a patterning process to form a first insulating layer that covers the pattern of the shielding conductive layer and the pattern of the first conductive layer arranged on the first insulating layer, as shown in FIG. 8A and FIG. 8B, FIG. 8B being a planar schematic diagram of the first conductive layer in FIG. 8A. In an exemplary implementation, the first conductive layer may be referred to as a first gate metal (GATE1) layer.

In an exemplary implementation, the pattern of the first conductive layer may at least include: a first shielding line 11, a second shielding line 12, a third shielding line 13, a fourth shielding line 14, a fifth shielding line 15, and a second plate 72 of the storage capacitor.

In an exemplary implementation, the first shielding line 11, the second shielding line 12, the third shielding line 13, the fourth shielding line 14, and the fifth shielding line 15 may be in a shape of a straight line extending in a first direction X. The first shielding line 11 may be located on a side of the second plate 72 in an opposite direction of a second direction Y, and the first shielding line 11 is configured to shield a second transistor T2 and serves as a bottom gate electrode of the second transistor T2. The second shielding line 12 may be located on a side of the second plate 72 in the second direction Y, and the second shielding line 12 is configured to shield a fourth transistor T4 and serves as a bottom gate electrode of the fourth transistor T4. The third shielding line 13 may be located on a side of the first shielding line 11 away from the second plate 72, and the third shielding line 13 is configured to shield a first transistor T1 and serves as a bottom gate electrode of the first transistor T1. The fourth shielding line 14 may be located on a side of the second shielding line 12 away from the second plate 72, and the fourth shielding line 14 is configured to shield a seventh transistor T7 and serves as a bottom gate electrode of the seventh transistor T7. The fifth shielding line 15 may be located between the second shielding line 12 and the fourth shielding line 14, and the fifth shielding line 15 is configured to shield a fifth transistor T5 and a sixth transistor T6 and serves as a bottom gate electrode of the fifth transistor T5 and the sixth transistor T6.

In the present disclosure, "A extends in a B direction" means that A may include a main portion and a secondary portion connected to the main portion, the main portion is a line, a line segment, or a strip-shaped body, the main portion extends in the B direction, and a length of the main portion extending in the B direction is greater than a length of the secondary portion extending in another direction. In following description, "A extends in a B direction" means "a main body portion of A extends in a B direction".

In an exemplary implementation, the second plate 72 may be located between the first shielding line 11 and the second shielding line 12, a profile of the second plate 72 may be in a shape of a rectangle, corners of the rectangle may be chamfered, an orthographic projection of the second plate 72 on the base substrate at least partially overlaps an orthographic projection of the first plate 71 on the base substrate, and the second plate 72 may serve as another plate of the storage capacitor.

In an exemplary implementation, the second plate 72 is also configured to shield a third transistor subsequently formed and serves as a bottom gate electrode of the third transistor T3.

In an exemplary implementation, the first insulating layer is a capacitor insulating layer arranged between the first plate and the second plate, a material of the first insulating layer may be SiNx, and a thickness of the first insulating layer may be about 100 nm to 170 nm. For example, the thickness of the first insulating layer may be about 130 nm.

In an exemplary implementation, a material of the first conductive layer may be Mo, and a thickness of the first conductive layer may be about 200 nm to 300 nm. For example, the thickness of the first conductive layer may be about 250 nm.

Figure 9A:
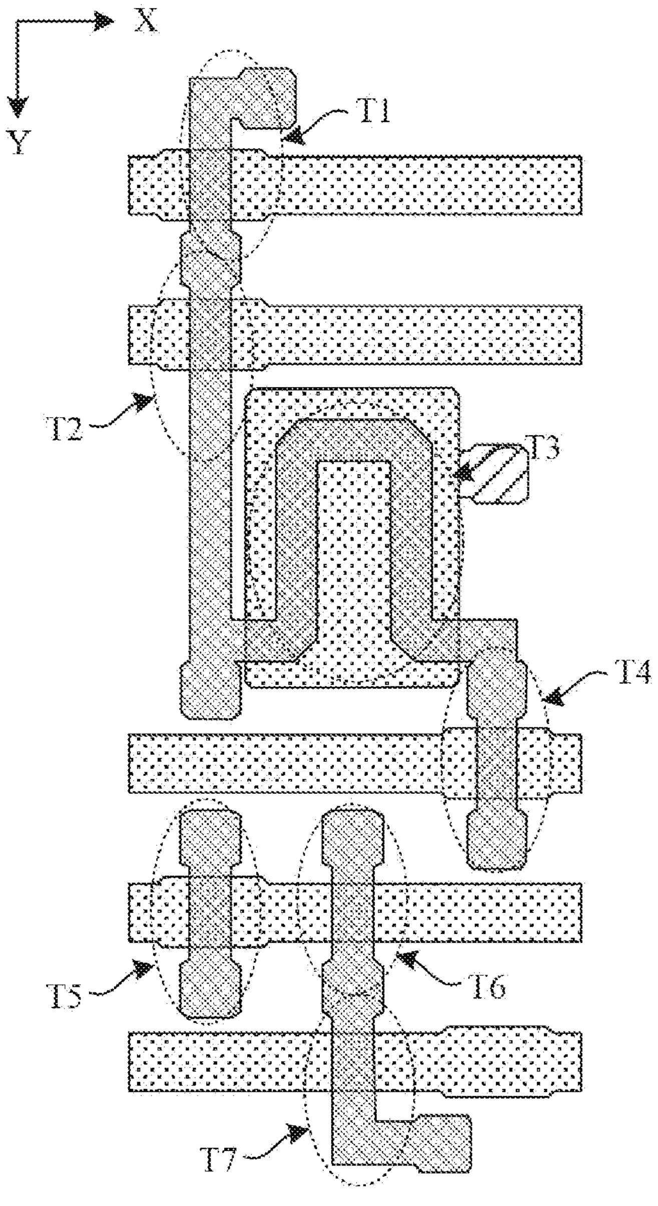
FIG. 9A and FIG. 9B are schematic diagrams of a display substrate after a pattern of a semiconductor layer is formed according to the present disclosure.
Figure 9B:
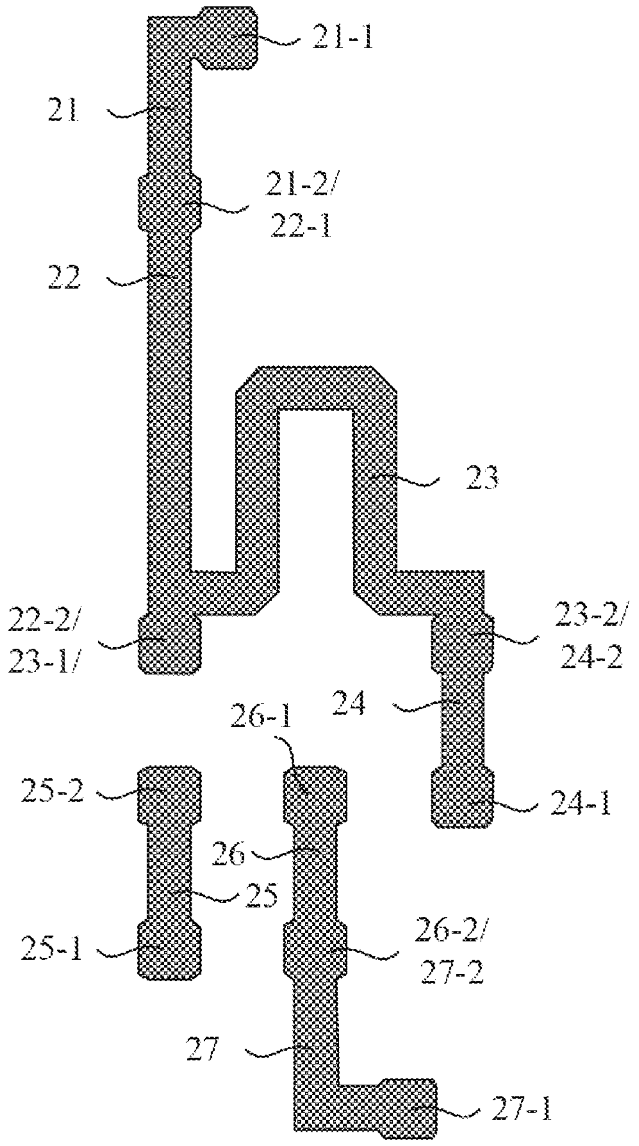

(13) A pattern of a semiconductor layer is formed. In an exemplary implementation, forming the pattern of the semiconductor layer may include: depositing sequentially a second insulating thin film and a semiconductor thin film on the base substrate, and patterning the semiconductor thin film by a patterning process to form a second insulating layer that covers the first conductive layer and the pattern of the semiconductor layer arranged on the second insulating layer, as shown in FIG. 9A and FIG. 9B, FIG. 9B being a planar schematic diagram of the semiconductor layer in FIG. 9A.

In an exemplary implementation, the pattern of the semiconductor layer may at least include a first active layer 21 of the first transistor T1 to a seventh active layer 27 of the seventh transistor T7, and the first active layer 21, the second active layer 22, the third active layer 23 and the fourth active layer 24 are connected to each other to form an integrated structure.

In an exemplary implementation, in the first direction X, the first active layer 21, the second active layer 22 and the fifth active layer 25 may be located on a same side of the third active layer 23, and the second active layer 22 and the fourth active layer 24 may be located on different sides of the third active layer 23. In the second direction Y, the first active layer 21 and the second active layer 22 may be located on a side of the third active layer 23 in an opposite direction of the second direction Y, and the fourth active layer 24, the fifth active layer 25, the sixth active layer 26 and the seventh active layer 27 may be located on a side of the third active layer 23 in the second direction Y.

In an exemplary implementation, the third active layer 23 may be in a shape of "n", and the first active layer 21, the second active layer 22, and the fourth active layer 24 to the seventh active layer 27 may be in a shape of "I" or "L".

In an exemplary implementation, an orthographic projection of the third active layer 23 on the base substrate may be within a range of the orthographic projection of the second plate 72 on the base substrate, so that a channel region of the third transistor T3 may be effectively shielded by the second plate 72.

In an exemplary implementation, the active layer of each transistor may include a first region, a second region, and a channel region located between the first region and the second region. In an exemplary implementation, a second region 21-2 of the first active layer may serve as a first region 22-1 of the second active layer (i.e., the second region 21-2 of the first active layer is directly connected to the first region 22-1 of the second active layer), a second region 22-2 of the second active layer may serve as a first region 23-1 of the third active layer (i.e., the second region 22-2 of the second active layer is directly connected to the first region 23-1 of the third active layer), a second region 23-2 of the third active layer may serve as a second region 24-2 of the fourth active layer (i.e., the second region 23-2 of the third active layer is directly connected to the second region 24-2 of the fourth active layer), a second region 26-2 of the sixth active layer may serve as a second region 27-2 of the seventh active layer (i.e., the second region 26-2 of the sixth active layer is directly connected to the second region 27-2 of the seventh active layer), and a first region 21-1 of the first active layer, a first region 24-1 of the fourth active layer, a first region 25-1 of the fifth active layer, a second region 25-2 of the fifth active layer, a first region 26-1 of the sixth active layer and a first region 27-1 of the seventh active layer may be provided separately.

In an exemplary implementation, the semiconductor layer may be made of an oxide, and the first transistor T1 to the seventh transistor T7 are all oxide transistors. In an exemplary implementation, the semiconductor layer may be made of indium gallium zinc oxide (IGZO) with a relatively high electron mobility.

In an exemplary implementation, a thickness of the semiconductor layer may be about 20 nm to 40 nm. For example, the thickness of the semiconductor layer may be about 30 nm.

In an exemplary implementation, the second insulating layer may be made of any one or more of silicon oxide (SiOx), silicon nitride (SiNx), and silicon oxynitride (SiON), and may be a single layer, a multi-layer, or a composite layer. For example, the second insulating layer may be made of SiN/SiO. A thickness of the second insulating layer may be about 350 nm to 450 nm. For example, a thickness of SiN in the second insulating layer may be about 100 nm, a thickness of SiO in the second insulating layer may be about 300 nm, and a total thickness of the second insulating layer may be about 400 nm.

Figure 10A:
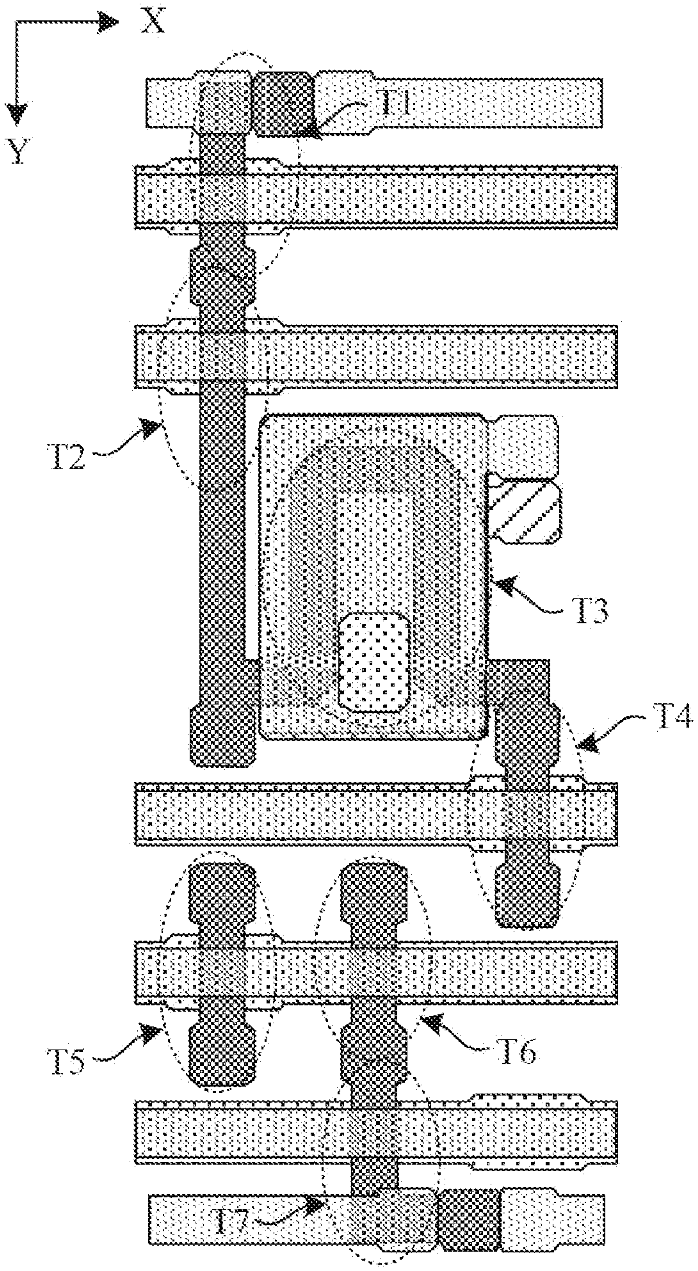
FIG. 10A and FIG. 10B are schematic diagrams of a display substrate after a pattern of a second conductive layer is formed according to the present disclosure.
Figure 10B:
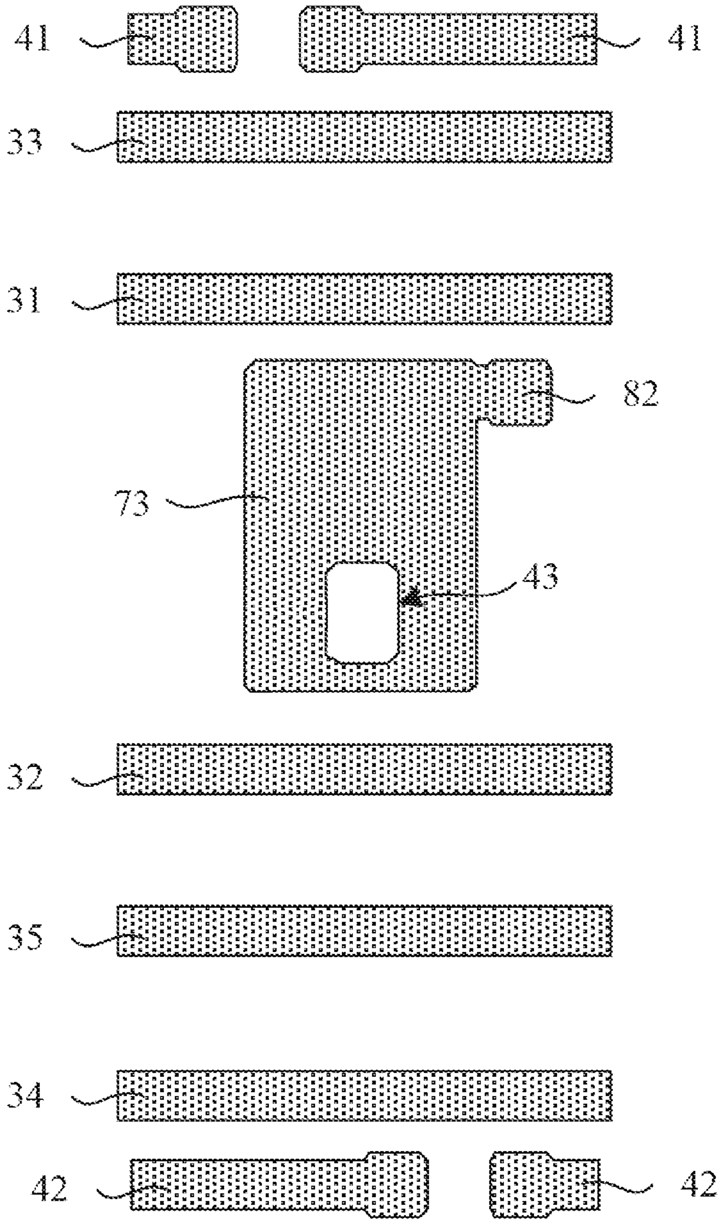

(14) A pattern of a second conductive layer is formed. In an exemplary implementation, forming the pattern of the second conductive layer may include: sequentially depositing a third insulating thin film and a second conductive thin film on the base substrate on which the aforementioned patterns are formed, and patterning the second conductive thin film by a patterning process to form a third insulating layer that covers the semiconductor layer and the pattern of the second conductive layer arranged on the third insulating layer, as shown in FIG. 10A and FIG. 10B, FIG. 10B being a planar schematic diagram of the second conductive layer in FIG. 10A. In an exemplary implementation, the second conductive layer may be referred to as a second gate metal (GATE2) layer.

In an exemplary implementation, the pattern of the second conductive layer may at least include: a first scan signal line 31, a second scan signal line 32, a third scan signal line 33, a fourth scan signal line 34, a light emitting control line 35, a first initial sub-line 41, a second initial sub-line 42, and a third plate 73.

In an exemplary implementation, a profile of the third plate 73 may be in a shape of a rectangle, corners of the rectangle may be chamfered, an orthographic projection of the third plate 73 on the base substrate at least partially overlaps an orthographic projection of the third active layer on the base substrate, and the orthographic projection of the third plate 73 on the base substrate at least partially overlaps the orthographic projection of the second plate 72 on the base substrate. On the one hand, the third plate 73 may serve as the top gate electrode of the third transistor T3, and on the other hand, the third plate 73 may serve as another plate of the storage capacitor, and the first plate 71, the second plate 72 and the third plate 73 form a storage capacitor of the pixel drive circuit with a parallel structure.

In an exemplary implementation, the third plate 73 is provided with an opening 43 which may be in a shape of a rectangle and may be located in a middle portion of the third plate 73, so that the third plate 73 forms an annular structure. The opening 43 exposes the third insulating layer, and the orthographic projection of the second plate 72 on the base substrate includes an orthographic projection of the opening 43 on the base substrate. In an exemplary implementation, the opening 43 is configured to accommodate a first via subsequently formed, the first via is located within the opening 43 and exposes the second plate 72, so that a second electrode of the first transistor T1 subsequently formed is connected to the second plate 72.

In the exemplary implementation, a second connection block 82 is further connected to a side of the third plate 73 in the first direction X, and the second connection block 82 is configured to be connected to a tenth connection electrode subsequently formed, so as to realize mutual connection between the first plate 71 and the third plate 73.

In the exemplary implementation, the first scan signal line 31, the second scan signal line 32, the third scan signal line 33, the fourth scan signal line 34 and the light emitting control line 35 may be in a shape of a straight line extending in the first direction X.

In an exemplary implementation, the first scan signal line 31 may be located on a side of the third plate 73 in an opposite direction of the second direction Y, and a region where the first scan signal line 31 overlaps the second active layer serves as the top gate electrode of the second transistor T2.

In an exemplary implementation, an orthographic projection of the first scan signal line 31 on the base substrate may be within a range of an orthographic projection of the first shielding line 11 on the base substrate, so that a channel region of the second transistor T2 may be effectively shielded by the first shielding line 11.

In an exemplary implementation, the second scan signal line 32 may be located on a side of the third plate 73 in the second direction Y, and a region where the second scan signal line 32 overlaps the fourth active layer serves as the top gate electrode of the fourth transistor T4.

In an exemplary implementation, an orthographic projection of the second scan signal line 32 on the base substrate may be within a range of an orthographic projection of the second shielding line 12 on the base substrate, so that a channel region of the fourth transistor T4 may be effectively shielded by the second shielding line 12.

In an exemplary implementation, the third scan signal line 33 may be located on a side of the first scan signal line 31 away from the third plate 73, and a region where the third scan signal line 33 overlaps the first active layer serves as the top gate electrode of the first transistor T1.

In an exemplary implementation, an orthographic projection of the third scan signal line 33 on the base substrate may be within a range of an orthographic projection of the third shielding line 13 on the base substrate, so that a channel region of the first transistor T1 may be effectively shielded by the third shielding line 13.

In an exemplary implementation, the fourth scan signal line 34 may be located on a side of the second scan signal line 32 away from the third plate 73, and a region where the fourth scan signal line 34 overlaps the seventh active layer serves as the top gate electrode of the seventh transistor T7.

In an exemplary implementation, an orthographic projection of the fourth scan signal line 34 on the base substrate may be within a range of an orthographic projection of the fourth shielding line 14 on the base substrate, so that a channel region of the seventh transistor T7 may be effectively shielded by the fourth shielding line 14.

In an exemplary implementation, the light emitting control line 35 may be located between the second scan signal line 32 and the fourth scan signal line 34, a region where the light emitting control line 35 overlaps the fifth active layer serves as the top gate electrode of the fifth transistor T5, and a region where the light emitting control line 35 overlaps the sixth active layer serves as the top gate electrode of the sixth transistor T6.

In an exemplary implementation, an orthographic projection of the light emitting control line 35 on the base substrate may be within a range of an orthographic projection of the fifth shielding line 15 on the base substrate, so that channel regions of the fifth transistor T5 and the sixth transistor T6 may be effectively shielded by the fifth shielding line 15.

In an exemplary implementation, the first initial sub-line 41 may be in a shape of a line in which a main portion extends in the first direction X. In the first direction X, the first initial sub-line 41 may be arranged between the first regions of the first active layers of adjacent circuit units in the first direction X. In the second direction Y, the first initial sub-line 41 may be located on a side of the third scan signal line 33 away from the third plate 73. The first initial sub-line 41 is configured to form, by utilizing an eighth connection electrode subsequently formed, a first initial signal line transmitting a first initial signal and extending in the first direction X.

In an exemplary implementation, the second initial sub-line 42 may be in a shape of a line in which a main portion extends in the first direction X. In the first direction X, the second initial sub-line 42 may be arranged between the first regions of the seventh active layers of adjacent circuit units in the first direction X. In the second direction Y, the second initial sub-line 42 may be located on a side of the fourth scan signal line 34 away from the third plate 73. The second initial sub-line 42 is configured to form, by utilizing a ninth connection electrode subsequently formed, a second initial signal line transmitting a second initial signal and extending in the first direction X.

In an exemplary implementation, the third insulating layer is a capacitor insulating layer arranged between the second plate and the third plate, a material of the third insulating layer may be SiO, and a thickness of the third insulating layer may be about 100 nm to 170 nm. For example, the thickness of the third insulating layer may be about 140 nm.

In an exemplary implementation, a layer material of the second conductive layer may be Mo, and a thickness of the second conductive layer may be about 200 nm to 300 nm. For example, the thickness of the second conductive layer may be about 250 nm.

Figure 11:
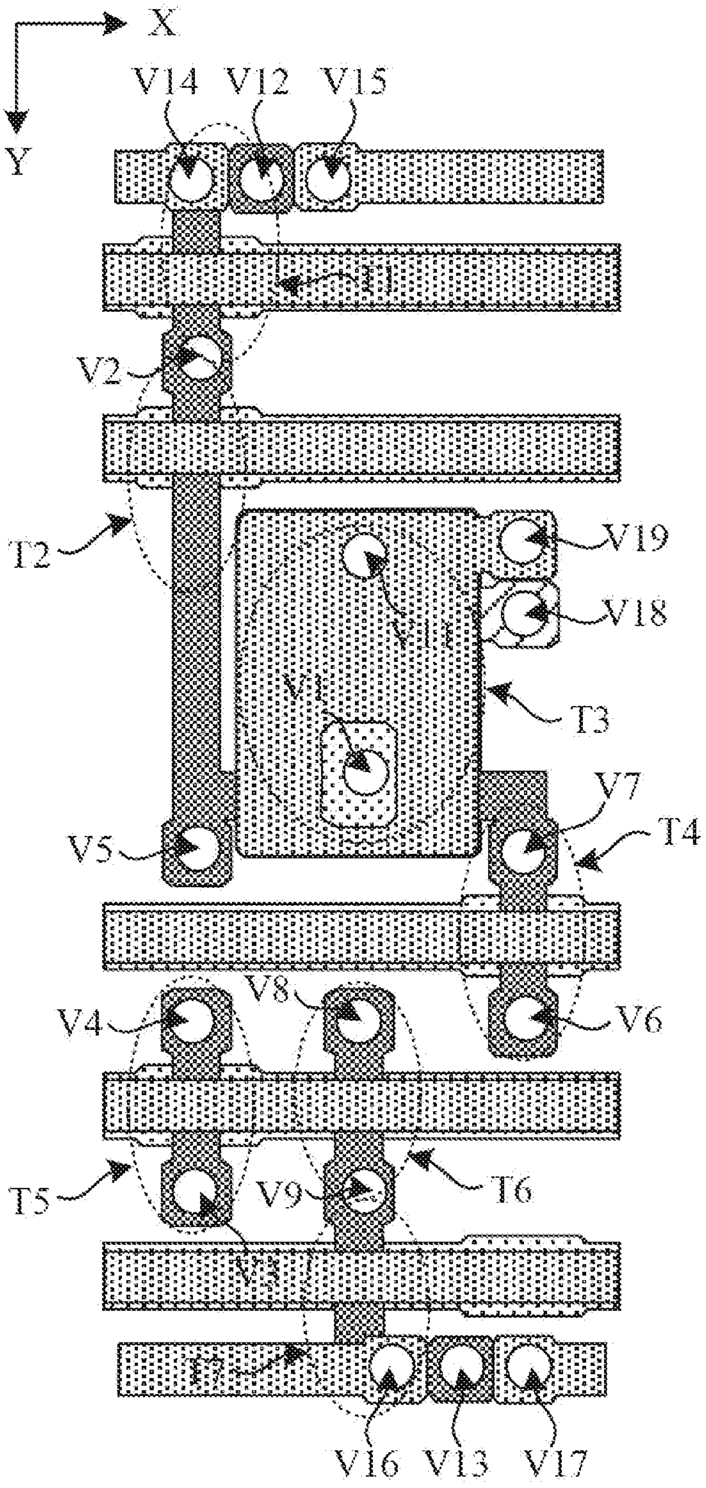
FIG. 11 is a schematic diagram of a display substrate after a pattern of a fourth insulating layer is formed according to the present disclosure.

(15) A pattern of a fourth insulating layer is formed. In an exemplary implementation, forming the pattern of the fourth insulating layer may include: depositing a fourth insulating thin film on the base substrate on which the aforementioned patterns are formed, and patterning the fourth insulating thin film by a patterning process to form a fourth insulating layer that covers the second conductive layer, the fourth insulating layer being provided with a plurality of vias, as shown in FIG. 11.

In an exemplary implementation, the plurality of vias at least include: a first via V1, a second via V2, a third via V3, a fourth via V4, a fifth via V5, a sixth via V6, a seventh via V7, an eighth via V8, a ninth via V9, an eleventh via V11, a twelfth via V12, a thirteenth via V13, a thirteenth via V13, a fourteenth via V14, a fifteenth via V15, a sixteenth via V16, a seventeenth via V17, an eighteenth via V18 and a nineteenth via V19.

In an exemplary implementation, an orthographic projection of the first via V1 on the base substrate is within a range of the orthographic projection of the opening 43 on the base substrate, the fourth insulating layer, the third insulating layer and the second insulating layer within the first via V1 are etched away to expose a surface of the second plate 72, and the first via V1 is configured such that a first connection electrode subsequently formed is connected to the second plate 72 through this via.

In an exemplary implementation, an orthographic projection of the second via V2 on the base substrate is within a range of an orthographic projection of the second region of the first active layer (also the first region of the second active layer) on the base substrate, the fourth insulating layer and the third insulating layer within the second via V2 are etched away to expose a surface of the second region of the first active layer, and the second via V2 is configured such that the first connection electrode subsequently formed is connected to the second region of the first active layer (also the first region of the second active layer) through this via.

In an exemplary implementation, an orthographic projection of the third via V3 on the base substrate is within a range of an orthographic projection of the first region of the fifth active layer on the base substrate, the fourth insulating layer and the third insulating layer within the third via V3 are etched away to expose a surface of the first region of the fifth active layer, and the third via V3 is configured such that a second connection electrode subsequently formed is connected to the first region of the fifth active layer through this via.

In an exemplary implementation, an orthographic projection of the fourth via V4 on the base substrate is within a range of an orthographic projection of the second region of the fifth active layer on the base substrate, the fourth insulating layer and the third insulating layer within the fourth via V4 are etched away to expose a surface of the second region of the fifth active layer, and the fourth via V4 is configured such that a third connection electrode subsequently formed is connected to the second region of the fifth active layer through this via.

In an exemplary implementation, an orthographic projection of the fifth via V5 on the base substrate is within a range of an orthographic projection of the second region of the second active layer (also the first region of the third active layer) on the base substrate, the fourth insulating layer and the third insulating layer within the fifth via V5 are etched away to expose a surface of the second region of the second active layer, and the fifth via V5 is configured such that the third connection electrode subsequently formed is connected to the second region of the second active layer (also the first region of the third active layer) through this via.

In an exemplary implementation, an orthographic projection of the sixth via V6 on the base substrate is within a range of an orthographic projection of the first region of the fourth active layer on the base substrate, the fourth insulating layer and the third insulating layer within the sixth via V6 are etched away to expose a surface of the first region of the fourth active layer, and the sixth via V6 is configured such that a fourth connection electrode subsequently formed is connected to the first region of the fourth active layer through this via.

In an exemplary implementation, an orthographic projection of the seventh via V7 on the base substrate is within a range of an orthographic projection of the second region of the fourth active layer (also the second region of the third active layer) on the base substrate, the fourth insulating layer and the third insulating layer within the seventh via V7 are etched away to expose a surface of the second region of the fourth active layer, and the seventh via V7 is configured such that a fifth connection electrode subsequently formed is connected to the second region of the fourth active layer (also the second region of the third active layer) through this via.

In an exemplary implementation, an orthographic projection of the eighth via V8 on the base substrate is within a range of an orthographic projection of the first region of the sixth active layer on the base substrate, the fourth insulating layer and the third insulating layer within the eighth via V8 are etched away to expose a surface of the first region of the sixth active layer, and the eighth via V8 is configured such that the fifth connection electrode subsequently formed is connected to the first region of the sixth active layer through this via.

In an exemplary implementation, an orthographic projection of the ninth via V9 on the base substrate is within a range of an orthographic projection of the second region of the sixth active layer (also the second region of the seventh active layer) on the base substrate, the fourth insulating layer and the third insulating layer within the ninth via V9 are etched away to expose a surface of the second region of the sixth active layer, and the ninth via V9 is configured such that a sixth connection electrode subsequently formed is connected to the second region of the sixth active layer (also the second region of the seventh active layer) through this via.

In an exemplary implementation, an orthographic projection of the eleventh via V11 on the base substrate is within a range of the orthographic projection of the third plate 73 on the base substrate, the fourth insulating layer in the eleventh via V11 is etched away to expose a surface of the first plate 71, and the eleventh via V11 is configured such that the first connection electrode subsequently formed is connected to the third plate 73 through this via.

In an exemplary implementation, an orthographic projection of the twelfth via V12 on the base substrate is within a range of an orthographic projection of the first region of the first active layer on the base substrate, the fourth insulating layer and the third insulating layer within the twelfth via V12 are etched away to expose a surface of the first region of the first active layer, and the twelfth via V12 is configured such that an eighth connection electrode subsequently formed is connected to the first region of the first active layer through this via.

In an exemplary implementation, an orthographic projection of the thirteenth via V13 on the base substrate is within a range of an orthographic projection of the first region of the seventh active layer on the base substrate, the fourth insulating layer and the third insulating layer within the thirteenth via V13 are etched away to expose a surface of the first region of the seventh active layer, and the thirteenth via V13 is configured such that a ninth connection electrode subsequently formed is connected to the first region of the seventh active layer through this via.

In an exemplary implementation, orthographic projections of the fourteenth via V14 and the fifteenth via V15 on the base substrate are within a range of an orthographic projection of the first initial sub-line 41 on the base substrate, the fourth insulating layer within the fourteenth via V14 and the fifteenth via V15 is etched away to expose a surface of the first initial sub-line 41, and the fourteenth via V14 and the fifteenth via V15 are configured such that the eighth connection electrode subsequently formed connects adjacent first initial sub-lines 41 to each other through the vias.

In an exemplary implementation, orthographic projections of the sixteenth via V16 and the seventeenth via V17 on the base substrate are within a range of an orthographic projection of the second initial sub-line 42 on the base substrate, the fourth insulating layer within the sixteenth via V16 and the seventeenth via V17 is etched away to expose a surface of the second initial sub-line 42, and the sixteenth via V16 and the seventeenth via V17 are configured such that the ninth connection electrode subsequently formed connects adjacent second initial sub-lines 42 to each other through the vias.

In an exemplary implementation, an orthographic projection of the eighteenth via V18 on the base substrate is within a range of an orthographic projection of the first connection block 81 of the first plate 71 on the base substrate, the fourth insulating layer, the third insulating layer, the second insulating layer and the first insulating layer within the eighteenth via V18 are etched away to expose a surface of the first connection block 81, and the eighteenth via V18 is configured such that the tenth connection electrode subsequently formed is connected to the first plate 71 through this via.

In an exemplary implementation, an orthographic projection of the nineteenth via V19 on the base substrate is within a range of an orthographic projection of the second connection block 82 of the third plate 73 on the base substrate, the fourth insulating layer within the nineteenth via V19 is etched away to expose a surface of the second connection block 82, and the nineteenth via V19 is configured such that the tenth connection electrode subsequently formed is connected to the third plate 73 through this via.

In an exemplary implementation, a material of the fourth insulating layer may be SiO, and a thickness of the fourth insulating layer may be about 500 nm to 600 nm. For example, the thickness of the fourth insulating layer may be about 550 nm.

Figure 12A:
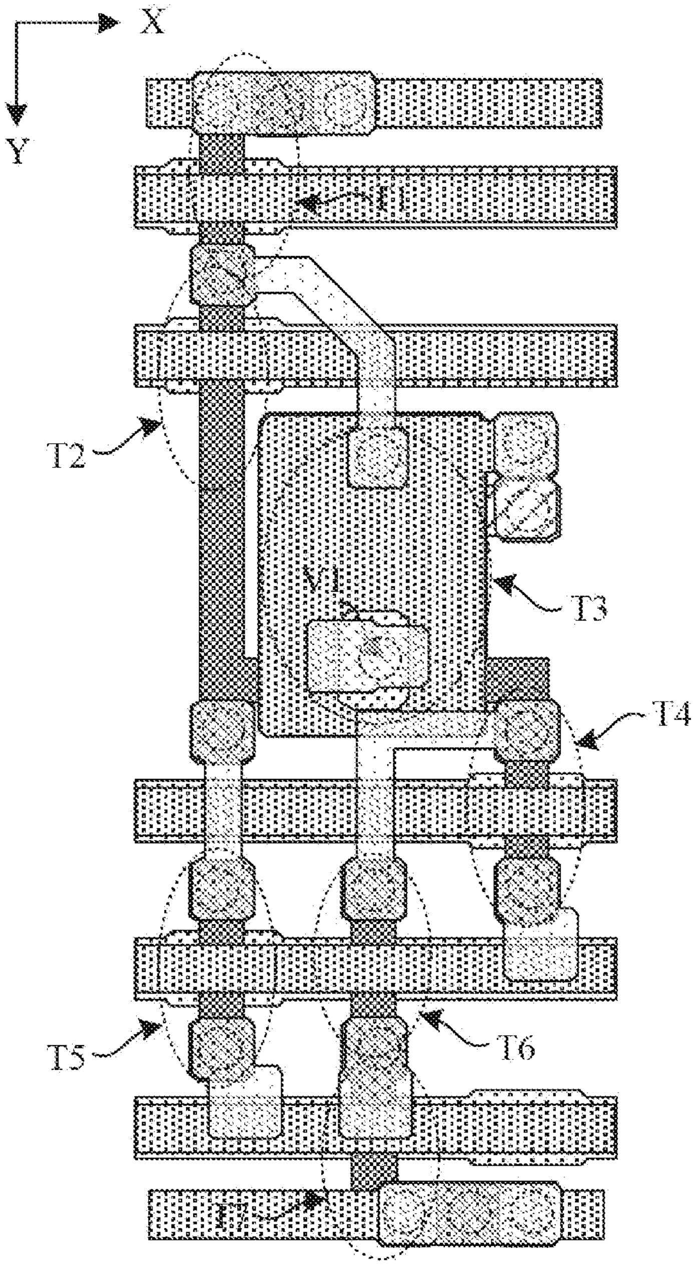
FIG. 12A and FIG. 12B are schematic diagrams of a display substrate after a pattern of a third conductive layer is formed according to the present disclosure.
Figure 12B:
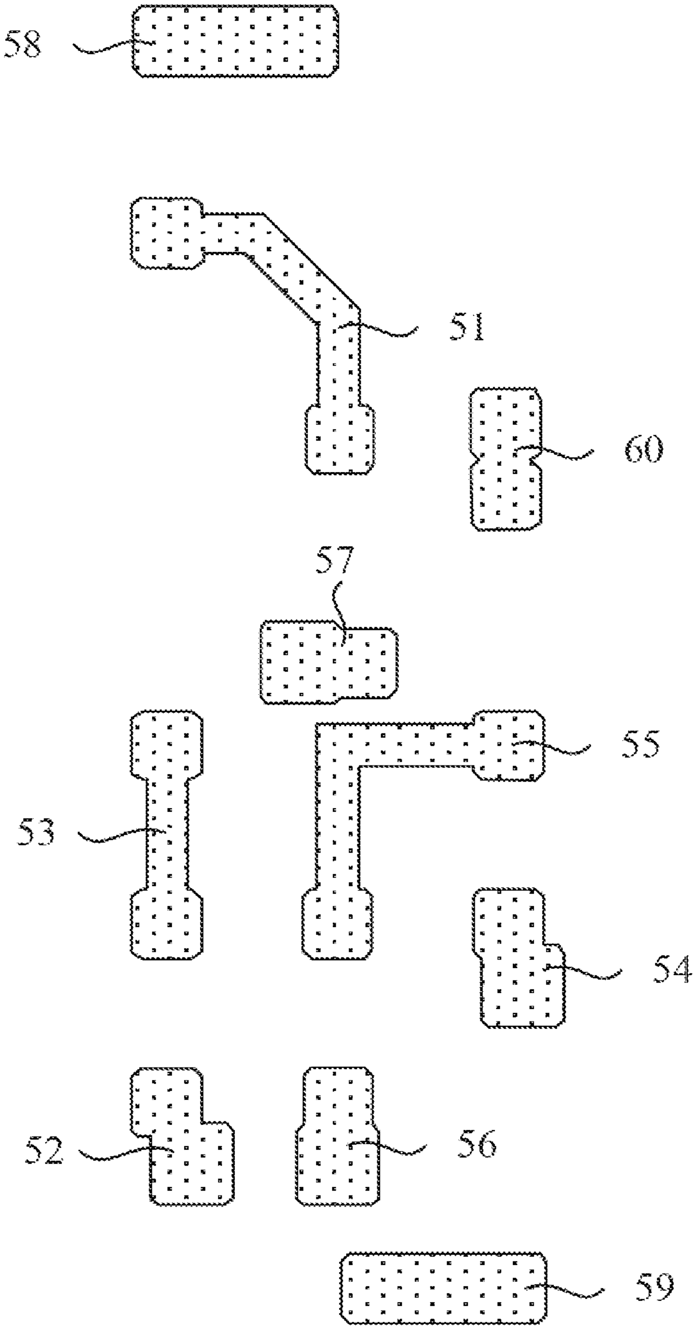

(16) A pattern of a third conductive layer is formed. In an exemplary implementation, forming the third conductive layer may include: depositing a third conductive thin film on the base substrate on which the aforementioned patterns are formed, and patterning the third conductive thin film by a patterning process to form the third conductive layer arranged on the fourth insulating layer, as shown in FIG. 12A and FIG. 12B, FIG. 12B being a planar schematic diagram of the third conductive layer in FIG. 12A. In an exemplary implementation, the third conductive layer may be referred to as a first source-drain metal (SD1) layer.

In an exemplary implementation, the third conductive layer may at least include: a first connection electrode 51, a second connection electrode 52, a third connection electrode 53, a fourth connection electrode 54, a fifth connection electrode 55, a sixth connection electrode 56, a seventh connection electrode 57, an eighth connection electrode 58, a ninth connection electrode 59 and a tenth connection electrode 60.

In an exemplary implementation, the first connection electrode 51 may be in a shape of a broken line in which a main portion extends in the second direction Y, a first end of the first connection electrode 51 is connected to the third plate 73 through the eleventh via V11, and a second end of the first connection electrode 51 is connected to the second region of the first active layer (also the first region of the second active layer) through the second via V2, so that the second electrode of the first transistor T1, the first electrode of the second transistor T2 and the third plate 73 (also the top gate electrode of the third transistor T3) have a same potential. In an exemplary implementation, the first connection electrode 51 may serve as a first node N1 of the pixel drive circuit.

In an exemplary implementation, the second connection electrode 52 may be in a shape of a polygon, and the second connection electrode 52 is connected to the first region of the fifth active layer through the third via V3. In an exemplary implementation, the second connection electrode 52 is configured to be connected to a first power supply line subsequently formed.

In an exemplary implementation, the third connection electrode 53 may be in a shape of a strip in which a main portion extends in the second direction Y, a first end of the third connection electrode 53 is connected to the second region of the fifth active layer through the fourth via V4, and a second end of the third connection electrode 53 is connected to the second region of the second active layer through the fifth via V5. In an exemplary implementation, the third connection electrode 53 may serve as a second node N2 of the pixel drive circuit.

In an exemplary implementation, the fourth connection electrode 54 may be in a shape of a strip in which a main portion extends in the second direction Y, and the fourth connection electrode 54 is connected to the first region of the fourth active layer through the sixth via V6. In an exemplary implementation, the fourth connection electrode 54 may serve as the first electrode (referred to as a data input electrode) of the fourth transistor T4, and the fourth connection electrode 54 is configured to be connected to a data signal line subsequently formed.

In an exemplary implementation, the fifth connection electrode 55 may be in a shape of a broken line in which a main portion extends in the second direction Y, a first end of the fifth connection electrode 55 is connected to the second region of the fourth active layer (also the second region of the third active layer) through the seventh via V7, and a second end of the fifth connection electrode 55 is connected to the first region of the sixth active layer through the eighth via V8. In an exemplary implementation, the fifth connection electrode 55 may serve as a third node N3 of the pixel drive circuit.

In an exemplary implementation, the sixth connection electrode 56 may be in a shape of a polygon, and the sixth connection electrode 56 is connected to the second region of the sixth active layer (also the second region of the seventh active layer) through the ninth via V9. In an exemplary implementation, the sixth connection electrode 56 is configured to be connected to an anode connection electrode subsequently formed.

In an exemplary implementation, the seventh connection electrode 57 may be in a shape of a polygon, and the seventh connection electrode 57 is connected to the second plate 72 through the first via V1. In an exemplary implementation, the seventh connection electrode 57 may serve as a fourth node N4 of the pixel drive circuit, and is configured to be connected to the sixth connection electrode 56 through the anode connection electrode subsequently formed.

In an exemplary implementation, the eighth connection electrode 58 may be in a shape of a strip in which a main portion extends in the first direction X, a middle portion of the eighth connection electrode 58 is connected to the first region of the first active layer through the twelfth via V12, and both ends of the eighth connection electrode 58 are connected to the first initial sub-lines 41 located on both sides of the first region of the first active layer through the fourteenth via V14 and the fifteenth via V15, respectively, which, on the one hand, realizes connection between adjacent first initial sub-lines 41 to form the first initial signal line, and on the other hand, realizes connection between the first initial signal line and the first electrode of the first transistor T1 so that a first initial voltage transmitted by the first initial signal line is written to the first electrode of the first transistor T1.

In an exemplary implementation, the ninth connection electrode 59 may be in a shape of a strip in which a main portion extends in the first direction X, a middle portion of the ninth connection electrode 59 is connected to the first region of the seventh active layer through the thirteenth via V13, and both ends of the ninth connection electrode 59 are connected to the second initial sub-lines 42 located on both sides of the first region of the seventh active layer through the sixteenth via V16 and the seventeenth via V17, respectively, which, on the one hand, realizes connection between adjacent second initial sub-lines 42 to form the second initial signal line, and on the other hand, realizes connection between the second initial signal line and the first electrode of the seventh transistor T7 so that a second initial voltage transmitted by the second initial signal line is written to the first electrode of the seventh transistor T7.

In an exemplary implementation, the tenth connection electrode 60 may be in a shape of a strip in which a main portion extends in the second direction Y, a first end of the tenth connection electrode 60 is connected to the first connection block 81 of the first plate 71 through the eighteenth via V18, and a second end of the tenth connection electrode 60 is connected to the second connection block 82 of the third plate 73 through the nineteenth via V19, realizing mutual connection between the first plate 71 and the third plate 73 so that the first plate 71 and the third plate 73 have a same potential.

In an exemplary implementation, the first plate 71 and the third plate 73 are connected to each other through the tenth connection electrode 60, the third plate 73 is connected to the first connection electrode 51 through a via, and the first connection electrode 51 serves as the first node N1 of the pixel drive circuit, thus, the first plate 71 and the third plate 73 have a potential of the first node N1 of the pixel drive circuit. The second plate 72 is connected to the seventh connection electrode 57 through a via and the seventh connection electrode 57 serves as the fourth node N4 of the pixel drive circuit, thus, the second plate 72 has a potential of the fourth node N4 of the pixel drive circuit. In this way, the first plate 71, the second plate 72 and the third plate 73 form a storage capacitor with a parallel structure, the first plate 71 having the potential of the first node N1 and the second plate 72 having the potential of the fourth node N4 form a first storage capacitor, the third plate 73 having the potential of the first node N1 and the second plate 72 having the potential of the fourth node N4 form a second storage capacitor, and the first storage capacitor and the second storage capacitor are in a parallel structure.

In an exemplary implementation, the third conductive layer may adopt a multi-layer composite structure, such as Ti (titanium)/Al (aluminum)/Ti (titanium), etc., and a thickness of the third conductive layer may be about 600 nm to 700 nm. For example, a thickness of two Ti layers in the third conductive layer may be respectively about 50 nm, a thickness of the Al layer in the third conductive layer may be about 550 nm, and a total thickness of the third conductive layer may be about 650 nm.

Figure 13:
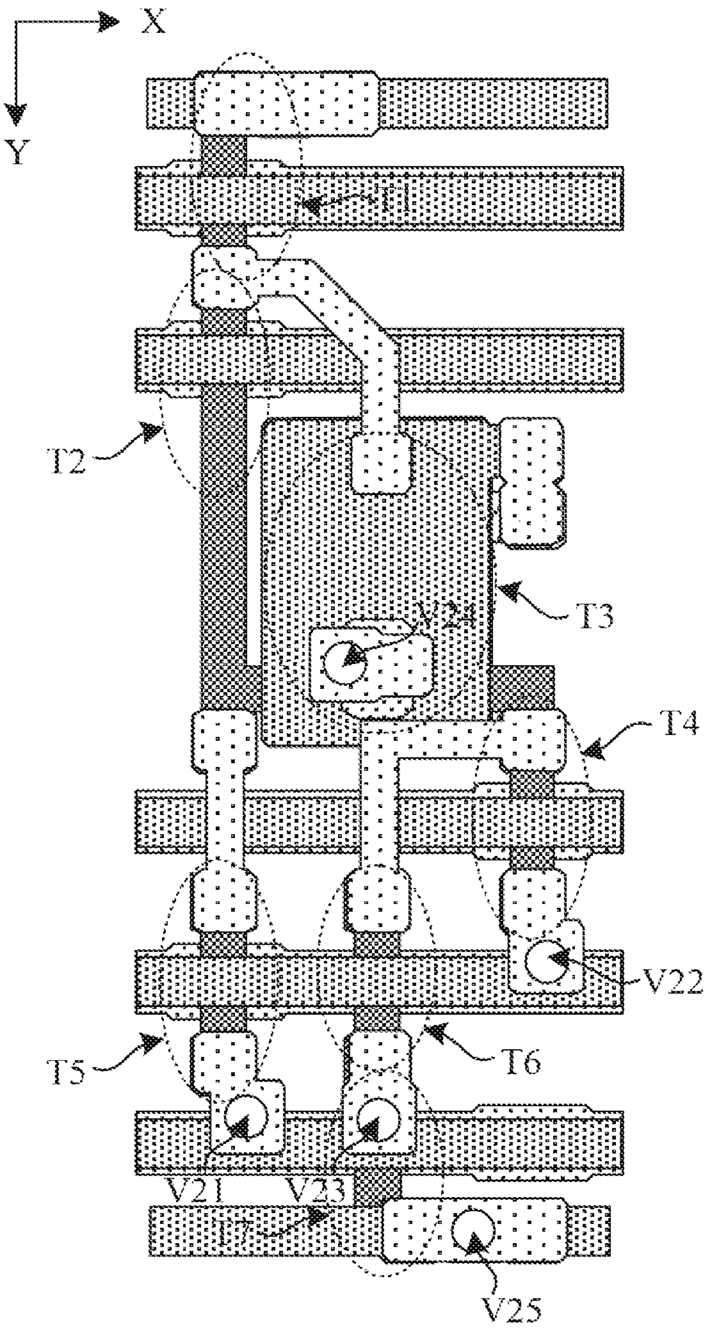
FIG. 13 is a schematic diagram of a display substrate after a pattern of a first planarization layer is formed according to the present disclosure.

(17) A pattern of a first planarization layer is formed. In an exemplary implementation, forming the pattern of the first planarization layer may include: first depositing a fifth insulating thin film on the base substrate on which the aforementioned patterns are formed, then coating a first planarization thin film, and patterning the first planarization thin film and the fifth insulating thin film by a patterning process to form a fifth insulating layer that covers the pattern of the third conductive layer and the first planarization layer arranged on the fifth insulating layer, the first planarization layer being provided with a plurality of vias, as shown in FIG. 13.

In an exemplary implementation, the plurality of vias on the fifth insulating layer and the first planarization layer may at least include a twenty-first via V21, a twenty-second via V22, a twenty-third via V23, a twenty-fourth via V24, and a twenty-fifth via V25.

In an exemplary implementation, an orthographic projection of the twenty-first via V21 on the base substrate is within a range of an orthographic projection of the second connection electrode 52 on the base substrate, the first planarization layer and the fifth insulating layer within the twenty-first via V21 are etched away to expose a surface of the second connection electrode 52, and the twenty-first via V21 is configured such that a first power supply line subsequently formed is connected to the second connection electrode 52 through this via.

In an exemplary implementation, an orthographic projection of the twenty-second via V22 on the base substrate is within a range of an orthographic projection of the fourth connection electrode 54 on the base substrate, the first planarization layer and the fifth insulating layer within the twenty-second via V22 are etched away to expose a surface of the fourth connection electrode 54, and the twenty-second via V22 is configured such that a data signal line subsequently formed is connected to the fourth connection electrode 54 through this via.

In an exemplary implementation, an orthographic projection of the twenty-third via V23 on the base substrate is within a range of an orthographic projection of the sixth connection electrode 56 on the base substrate, the first planarization layer and the fifth insulating layer within the twenty-third via V23 are etched away to expose a surface of the sixth connection electrode 56, and the twenty-third via V23 is configured such that an anode connection electrode formed subsequently is connected to the sixth connection electrode 56 through this via.

In an exemplary implementation, an orthographic projection of the twenty-fourth via 24 on the base substrate is within a range of an orthographic projection of the seventh connection electrode 57 on the base substrate, the first planarization layer and the fifth insulating layer within the twenty-fourth via V24 are etched away to expose a surface of the seventh connection electrode 57, and the twenty-fourth via V24 is configured such that the anode connection electrode subsequently formed is connected to the seventh connection electrode 57 through this via.

In an exemplary implementation, an orthographic projection of the twenty-fifth via 25 on the base substrate is within a range of an orthographic projection of the ninth connection electrode 59 on the base substrate, the first planarization layer and the fifth insulating layer within the twenty-fifth via V25 are etched away to expose a surface of the ninth connection electrode 59, and the twenty-fifth via V25 is configured such that an initial connection line subsequently formed is connected to the ninth connection electrode 59 through this via.

In an exemplary implementation, the fifth insulating layer may be referred to as a passivation (PVX) layer, and the fifth insulating layer may be made of any one or more of a silicon oxide (SiOx), a silicon nitride (SiNx), and a silicon oxynitride (SiON), and may be a single layer, a multi-layer, or a composite layer. For example, the fifth insulating layer may be made of SiO/SiNx, and a thickness of the fifth insulating layer may be about 200 nm to 400 nm. For example, a thickness of SiO in the fifth insulating layer may be about 200 nm, a thickness of SiNx in the fifth insulating layer may be about 100 nm, and a total thickness of the fifth insulating layer may be about 300 nm.

In an exemplary implementation, the first planarization layer may be made of an organic material, such as resin, polyimide or the like, and a thickness of the first planarization layer may be about 1000 nm to 2000 nm. For example, the thickness of the first planarization layer may be about 1500 nm.

Figure 14A:
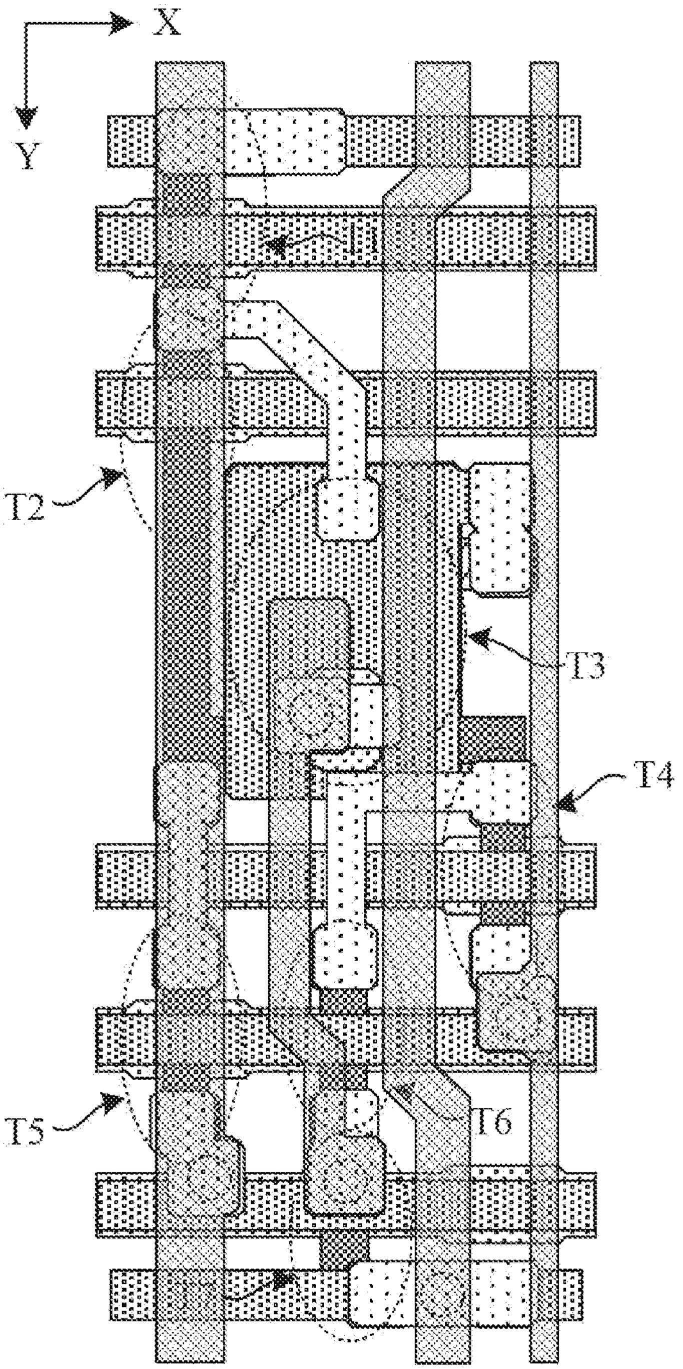
FIG. 14A and FIG. 14B are schematic diagrams of a display substrate after a pattern of a fourth conductive layer is formed according to the present disclosure.
Figure 14B:
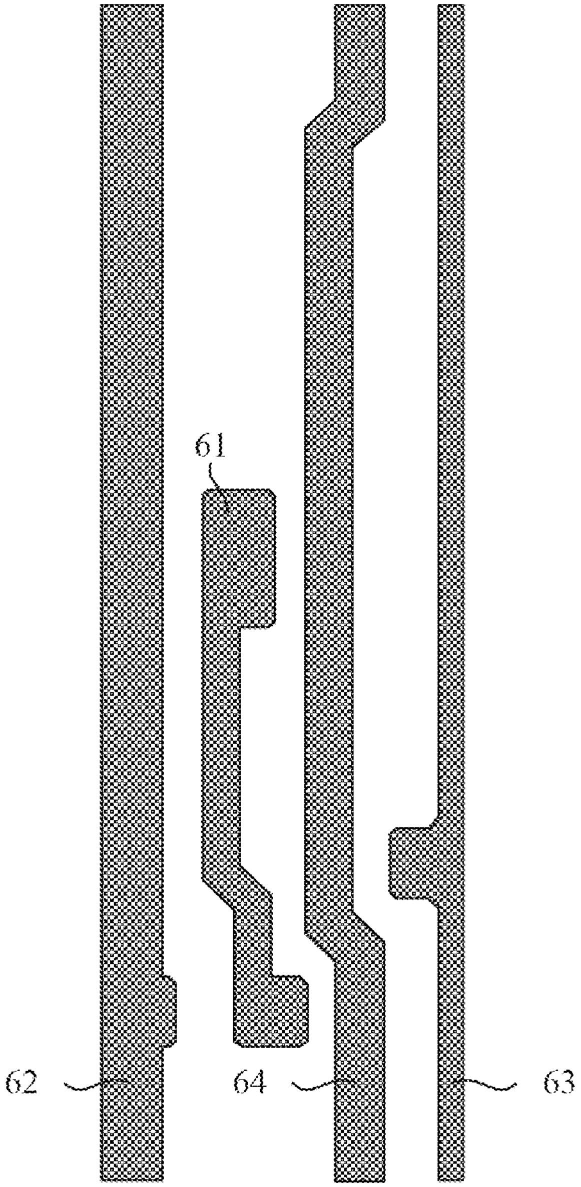

(18) A pattern of a fourth conductive layer is formed. In an exemplary implementation, forming the pattern of the fourth conductive layer may include: depositing a fourth conductive thin film on the base substrate on which the aforementioned patterns are formed, and patterning the fourth conductive thin film by a patterning process to form the fourth conductive layer arranged on the first planarization layer, as shown in FIG. 14A and FIG. 14B, FIG. 14B being a planar schematic diagram of the fourth conductive layer in FIG. 14A. In an exemplary implementation, the fourth conductive layer may be referred to as a second source-drain metal (SD2) layer.

In an exemplary implementation, the fourth conductive layer may at least include: an anode connection electrode 61, a first power supply line 62, a data signal line 63 and an initial connection line 64.

In an exemplary implementation, the anode connection electrode 61 may be in a shape of a broken line in which a main portion extends in the second direction Y, a first end of the anode connection electrode 61 is connected to the sixth connection electrode 56 through the twenty-third via V23, and a second end of the anode connection electrode 61 is connected to the seventh connection electrode 57 through the twenty-fourth via. The sixth connection electrode 56 is connected to the second region of the sixth active layer (also the second region of the seventh active layer) through a via, and the seventh connection electrode 57 is connected to the second plate 72 through a via, thereby realizing that the second plate 72, the second electrode of the sixth transistor T6 and the second electrode of the seventh transistor T7 have a same potential, i.e., the potential of the fourth node N4 in the pixel drive circuit, and the anode connection electrode 61 may be referred to as a fourth node connection line. In an exemplary implementation, the anode connection electrode 61 is configured to be connected to an anode subsequently formed, thereby enabling the pixel drive circuit to output a drive current to the light emitting device.

In an exemplary implementation, an orthographic projection of the anode connection electrode 61 on the base substrate may at least partially overlap an orthographic projection of the second scan signal line 32 on the base substrate, and the orthographic projection of the anode connection electrode 61 on the base substrate may at least partially overlap the orthographic projection of the light emitting control line 35 on the base substrate.

In an exemplary implementation, the first power supply line 62 may be in a shape of a straight line or a broken line in which a main portion extends in the second direction Y, and the first power supply line 62 is connected to the second connection electrode 52 through the twenty-first via V21. The second connection electrode 52 is connected to the first region of the fifth active layer through a via, thereby realizing that the first power supply line 62 can write a first power supply signal to the first electrode of the fifth transistor T5.

In an exemplary implementation, an orthographic projection of the first power supply line 62 on the base substrate may respectively at least partially overlap orthographic projections of the first connection electrode 51 and the third connection electrode 53 on the base substrate, so that the first power supply line 62 can be used as a shielding electrode, which can effectively shield the influence of data voltage jump on key nodes in the pixel drive circuit, thereby avoiding the influence of data voltage jump on the potential of the key nodes in the pixel drive circuit, and improving the display effect.

In an exemplary implementation, the data signal line 63 may be in a shape of a straight line in which a main portion extends in the second direction Y, and the data signal line 63 is connected to the fourth connection electrode 54 through the twenty-second via V22. The fourth connection electrode 54 is connected to the first region of the fourth active layer through a via, thereby realizing connection between the data signal line 63 and the first electrode of the fourth transistor T4, enabling the data signal line 63 to write a data signal to the first electrode of the fourth transistor T4.

In an exemplary implementation, the initial connection line 64 may be in a shape of a straight line or a broken line in which a main portion extends in the second direction Y, and the initial connection line 64 is connected to the ninth connection electrode 59 through the twenty-fifth via V25. The second initial sub-line 42 and the ninth connection electrode 59 form a second initial signal line for transmitting a second initial signal, and the initial connection line 64 is connected to the ninth connection electrode 59, so that the second initial signal line extending in the first direction X and the initial connection line 64 extending in the second direction Y form initial connection lines of a network communication structure in a display region, which can reduce, to the greatest extent, the resistance of the initial signal line, reduce a voltage drop of the initial voltage, and effectively improve uniformity of the initial voltage in the display substrate, thus effectively improving the display uniformity and improving display attribute and display quality.

In an exemplary implementation, the initial connection line 64, the ninth connection electrode 59 and the second initial sub-line 42 are respectively arranged in different conductive layers, the initial connection line 64 is connected to the ninth connection electrode 59 through a via, and the ninth connection electrode 59 is connected to the second initial sub-line 42 through a via.

In an exemplary implementation, the fourth conductive layer may adopt a multi-layer composite structure, such as Ti/Al/Ti, etc., and a thickness of the fourth conductive layer may be about 600 nm to 700 nm. For example, a thickness of two Ti layers in the fourth conductive layer may be respectively about 50 nm and 30 nm, a thickness of the Al layer in the fourth conductive layer may be about 550 nm, and a total thickness of the fourth conductive layer may be about 630 nm.

Figure 14C:
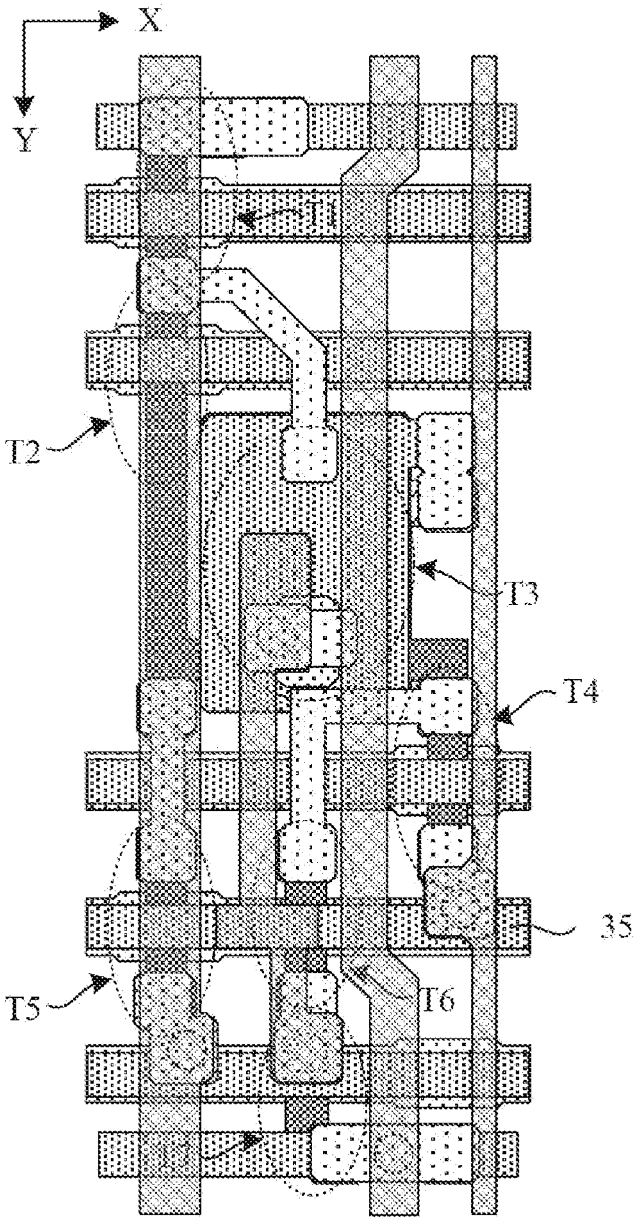
FIG. 14C and FIG. 14D are schematic diagrams of a display substrate after a pattern of another fourth conductive layer is formed according to the present disclosure.
Figure 14D:
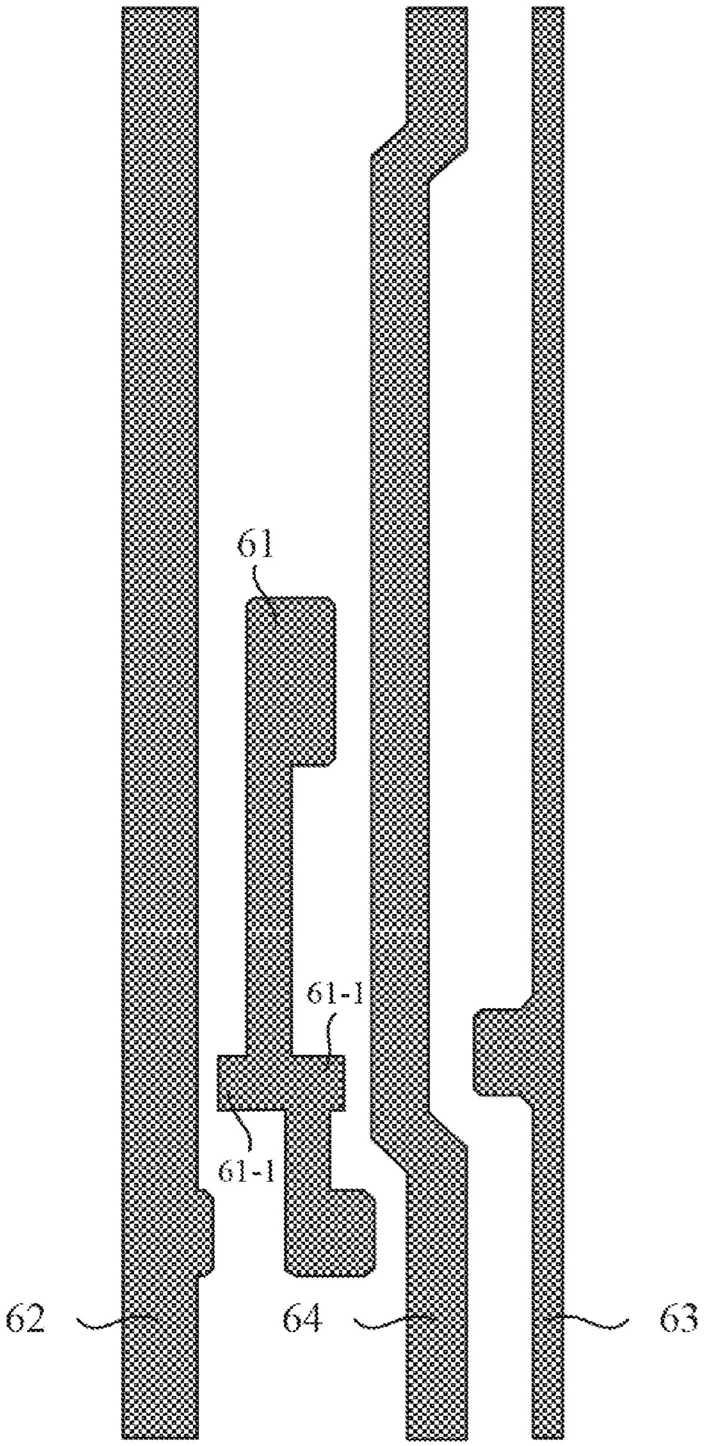

FIG. 14C is a schematic diagram of a display substrate after a pattern of another fourth conductive layer is formed according to the present disclosure, and FIG. 14D is a planar schematic diagram of the fourth conductive layer in FIG. 14C. In an exemplary implementation, structures of the anode connection electrode 61, the first power supply line 62, the data signal line 63 and the initial connection line 64 in the fourth conductive layer in the present embodiment are substantially the same as the structures shown in FIG. 14A and FIG. 14B, except that a first bump 61-1 is provided on the anode connection electrode 61.

In an exemplary implementation, the first bump 61-1 may be in a shape of a polygon, and may be arranged on a side of the anode connection electrode 61 in the first direction X and/or in an opposite direction of the first direction X and connected to the anode connection electrode 61.

In an exemplary implementation, an orthographic projection of the first bump 61-1 on the base substrate may at least partially overlap an orthographic projection of the light emitting control line 35 on the base substrate, the first bump 61-1 is configured to increase a first coupling capacitance between the anode connection electrode 61 and the light emitting control line 35, and when the light emitting control line 35 outputs a high-level turn-on signal, the high-level turn-on signal may pull up the potential of the fourth node N4 in the pixel drive circuit through the first coupling capacitance, facilitating an on state display.

Figure 14E:
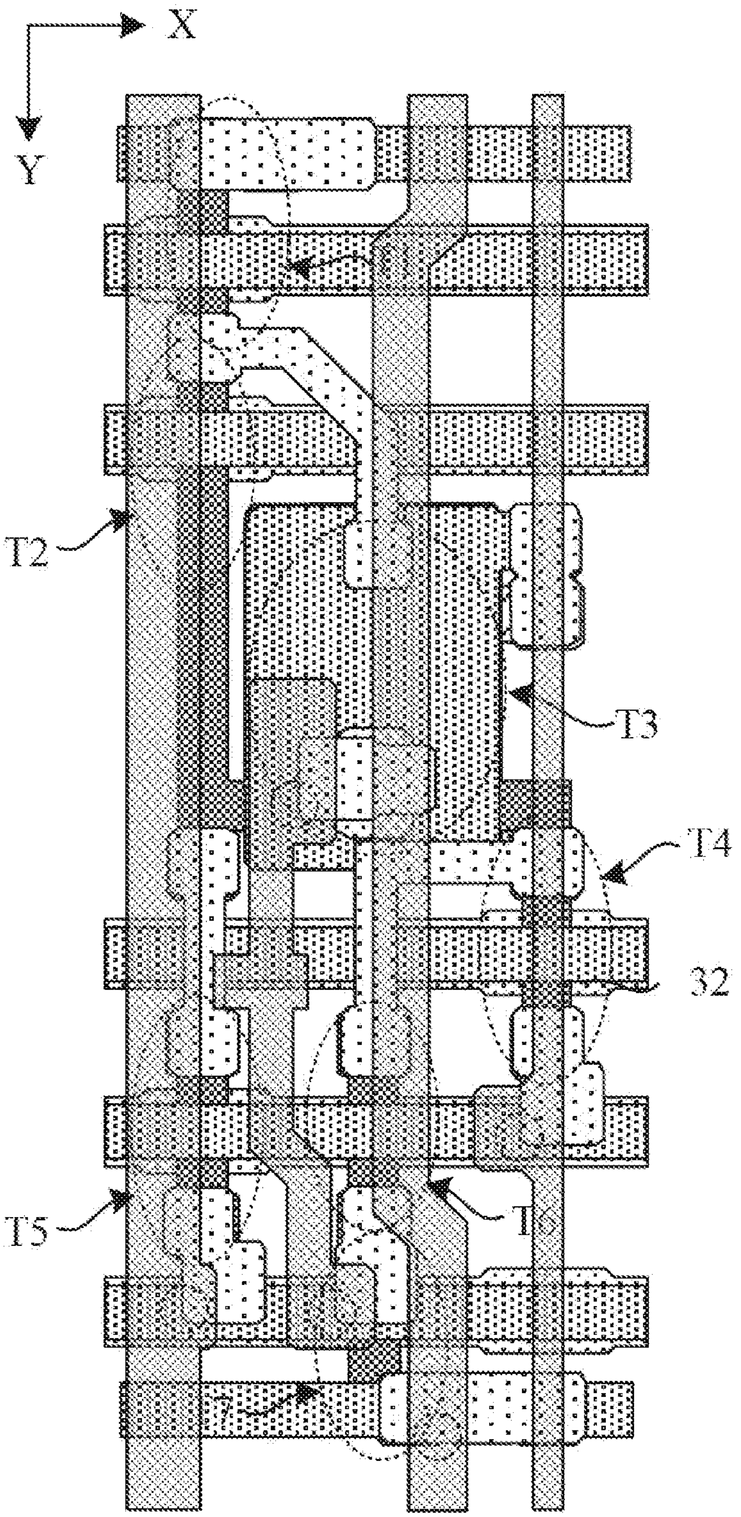
FIG. 14E and FIG. 14F are schematic diagrams of a display substrate after a pattern of a further fourth conductive layer is formed according to the present disclosure.
Figure 14F:
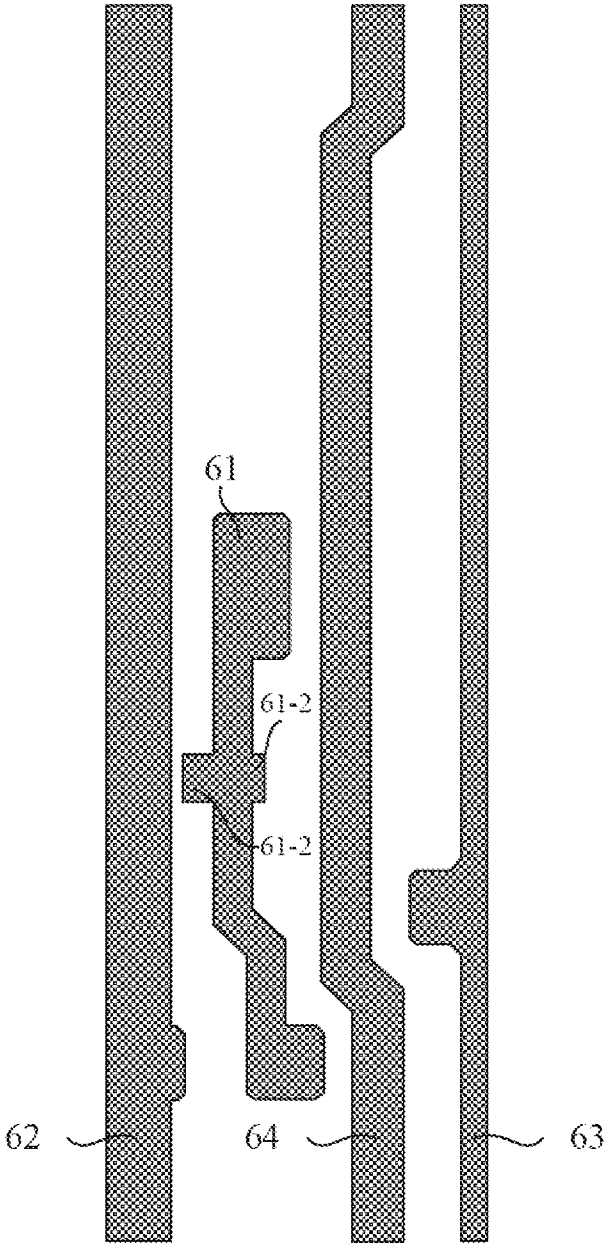

FIG. 14E is a schematic diagram of a display substrate after a pattern of a further fourth conductive layer is formed according to the present disclosure, and FIG. 14F is a planar schematic diagram of the fourth conductive layer in FIG. 14E. In an exemplary implementation, structures of the anode connection electrode 61, the first power supply line 62, the data signal line 63 and the initial connection line 64 in the fourth conductive layer of the present embodiment are substantially the same as the structures shown in FIG. 14A and FIG. 14B, except that a second bump 61-2 is provided on the anode connection electrode 61.

In an exemplary implementation, the second bump 61-2 may be in a shape of a polygon, and may be arranged on a side of the anode connection electrode 61 in the first direction X and/or in an opposite direction of the first direction X and connected to the anode connection electrode 61.

In an exemplary implementation, an orthographic projection of the second bump 61-2 on the base substrate may at least partially overlap an orthographic projection of the second scan signal line 32 on the base substrate, the second bump 61-2 is configured to increase a second coupling capacitance between the anode connection electrode 61 and the second scan signal line 32, and when the second scan signal line 32 outputs a low-level turn-off signal, the low-level turn-off signal can pull down the potential of the fourth node N4 in the pixel drive circuit through the second coupling capacitance, facilitating an off state display.

In an exemplary implementation, the solutions of FIG. 14C and FIG. 14E may be combined, i.e., the anode connection electrode 61 is provided with a first bump 61-1 and a second bump 61-2, an orthographic projection of the first bump 61-1 on the base substrate may at least partially overlap an orthographic projection of the light emitting control line 35 on the base substrate, and an orthographic projection of the second bump 61-2 on the base substrate may at least partially overlap an orthographic projection of the second scan signal line 32 on the base substrate.

In an exemplary implementation, there may be a first overlapping area between orthographic projections of the anode connection electrode 61 and the first bump 61-1 on the base substrate and the orthographic projection of the light emitting control line 35 on the base substrate, there may be a second overlapping area between orthographic projections of the anode connection electrode 61 and the second bump 61-2 on the base substrate and the orthographic projection of the second scan signal line 32 on the base substrate, and the first overlapping area and the second overlapping area may be substantially equal, which may adjust the influence of the first coupling capacitance and the second coupling capacitance to some extent.

Figure 14G:
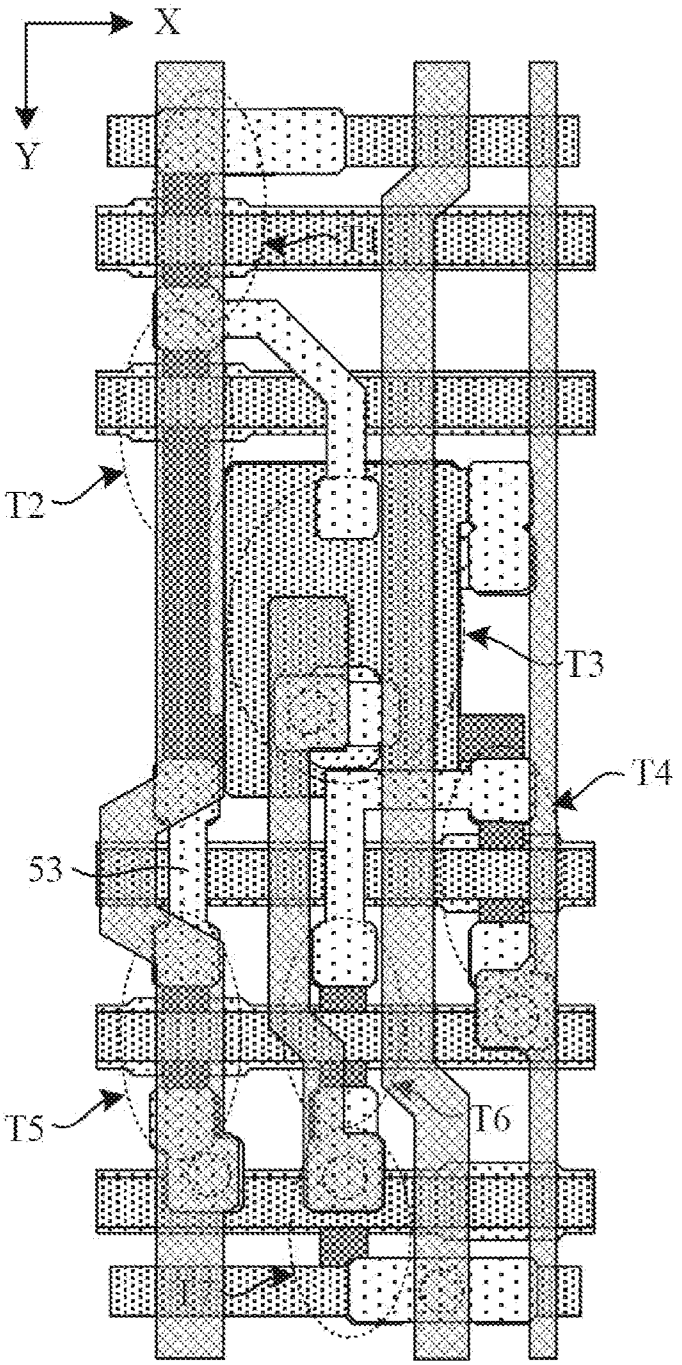
FIG. 14G and FIG. 14H are schematic diagrams of a display substrate after a pattern of a still further fourth conductive layer is formed according to the present disclosure.
Figure 14H:
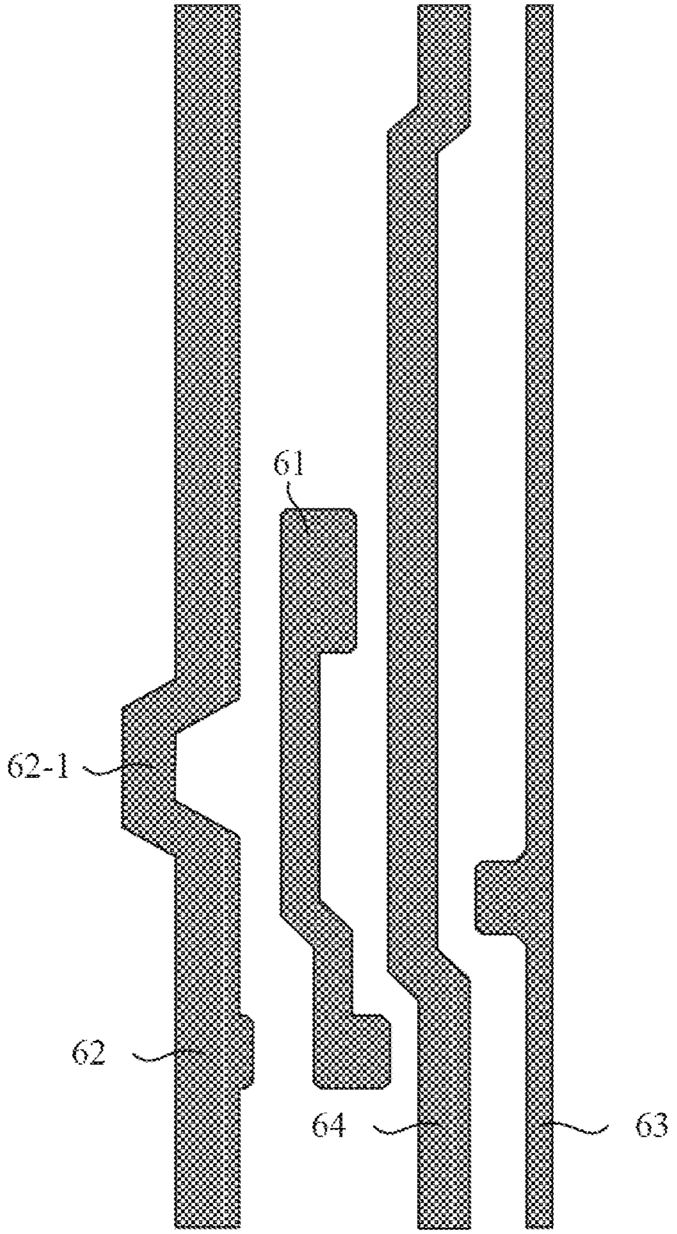

FIG. 14G is a schematic diagram of a display substrate after a pattern of a still further fourth conductive layer is formed according to the present disclosure, and FIG. 14H is a planar schematic diagram of the fourth conductive layer in FIG. 14G. In an exemplary implementation, structures of the anode connection electrode 61, the data signal line 63 and the initial connection line 64 in the fourth conductive layer of this embodiment are substantially the same as the structures shown in FIG. 14A and FIG. 14B, except that the first power supply line 62 is provided with an avoidance structure 62-1.

In an exemplary implementation, the avoidance structure 62-1 may be located in a region where the third connection electrode 53 is located. The avoidance structure 62-1 may be in a shape of "C" such that the first power supply line 62 bends in a direction away from the anode connection electrode 61.

In an exemplary implementation, the third connection electrode 53 serves as the second node N2 of the pixel drive circuit, and overlapping between the first power supply line 62 and the third connection electrode 53 will result in a parasitic capacitance of the second node N2, so the avoidance structure 62-1 may reduce the overlapping area between the first power supply line 62 and the third connection electrode 53 and reduce the parasitic capacitance of the second node N2 in the pixel drive circuit.

In an exemplary implementation, since the avoidance structure 62-1 cause the first power supply line 62 to bend in a direction away from the anode connection electrode 61, a relatively large space may be left between the first power supply line 62 and the anode connection electrode 61, facilitating the arrangement of the first bump 61-1 and/or the second bump 61-2, and facilitating the design of coupling capacitance of the fourth node N4 in the pixel drive circuit.

In an exemplary implementation, the solutions of FIG. 14A, FIG. 14C, FIG. 14E and FIG. 14G may be arbitrarily combined according to actual situation, which is not limited here in the present disclosure.

Subsequently, a second planarization thin film is coated on the base substrate on which the aforementioned patterns are formed, and the second planarization thin film is patterned by a patterning process to form a second planarization layer that covers the pattern of the fourth conductive layer. The second planarization layer is provided with an anode via, an orthographic projection of the anode via on the base substrate is within the orthographic projection of the anode connection electrode 61 on the base substrate, and the anode via is configured such that the anode subsequently formed is connected to the anode connection electrode 61 through this via.

In an exemplary implementation, the second planarization layer may be made of an organic material, such as resin, polyimide or the like, and a thickness of the second planarization layer may be about 1000 nm to 2000 nm. For example, the thickness of the second planarization layer may be about 1500 nm.

At this point, a drive circuit layer has been prepared on the base substrate. In a plane parallel to the display substrate, the drive circuit layer may include a plurality of circuit units, each circuit unit may include a pixel drive circuit, and a first scan signal line, a second scan signal line, a third scan signal line, a fourth scan signal line, a light emitting control line, a first initial signal line, a second initial signal line, a first power supply line and a data signal line which are connected to the pixel drive circuit. In a plane perpendicular to the display substrate, the drive circuit layer may include a shielding conductive layer, a first insulating layer, a first conductive layer, a second insulating layer, a semiconductor layer, a third insulating layer, a second conductive layer, a fourth insulating layer, a third conductive layer, a fifth insulating layer, a first planarization layer, a fourth conductive layer and a second planarization layer which are arranged sequentially on the base substrate. The shielding conductive layer may at least include a first plate of a storage capacitor, the first conductive layer may at least include a second plate of the storage capacitor and a plurality of shielding lines, the semiconductor layer may at least include active layers of a first transistor to a seventh transistor, the second conductive layer may at least include a third plate of the storage capacitor, a plurality of scan signal lines, a light emitting control line, a first initial sub-line and a second initial sub-line, the third conductive layer may at least include a plurality of connection electrodes, and the fourth conductive layer may at least include an anode connection electrode, a first power supply line and a data signal line.

In an exemplary implementation, the base substrate may be a flexible base substrate, or may be a rigid base substrate. The rigid base substrate may include, but not limited to, one or more of glass and quartz. The flexible underlay substrate may be made of, but not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary implementation, the flexible base substrate may include a first flexible material layer, a first inorganic material layer, a semiconductor layer, a second flexible material layer and a second inorganic material layer which are stacked. Materials of the first and second flexible material layers may be polyimide (PI), polyethylene terephthalate (PET) or surface treated polymer soft films, etc., and materials of the first and second inorganic material layers may be silicon nitride (SiNx), silicon oxide (SiOx) or the like, for improving the water and oxygen resistance of the base substrate. The first and second inorganic material layers may also be referred to as barrier layers. A material of the semiconductor layer may be amorphous silicon (a-si).

In an exemplary implementation, after the drive circuit layer has been prepared, a light emitting structure layer may be prepared on the drive circuit layer, and an encapsulation structure layer may be prepared on the light emitting structure layer, which will not be described further here.

As can be seen from the above-described structure and preparation process of the display substrate, the first plate, the second plate and the third plate of the storage capacitor of an exemplary embodiment of the present disclosure are respectively located in the shielding conductive layer, the first conductive layer and the second conductive layer, the first plate and the second plate form a first storage capacitor, the second plate and the third plate form a second storage capacitor, and the first storage capacitor and the second storage capacitor form a storage capacitor with a parallel structure. The capacitor insulating layer between the first plate and the second plate in the present disclosure is made of a silicon nitride, which may ensure the capacitor performance. In the present disclosure, bottom gate electrodes of the plurality of transistors are arranged in the first conductive layer, and top gate electrodes of the plurality of transistors are arranged in the second conductive layer, which may effectively ensure the shielding of the oxide transistors and improve the electrical performance of the transistors. The preparation process in the present disclosure may be compatible well with an existing preparation process, which is simple in process implementation, is easy to implement, and has a high production efficiency, a low production cost and a high yield.

It is found by studies that a hydrogen (H) content of a silicon nitride is relatively high, and intrusion of hydrogen element into the semiconductor layer will lead to a negative bias of the characteristics of an oxide thin film transistor and deterioration of a negative bias temperature stress (NBTS) reliability, which leads to a relatively large difficulty in debugging of a process of the display substrate. In the present disclosure, the first insulating layer (capacitor insulating layer) made of silicon nitride is arranged on a side of the semiconductor layer close to the base substrate, i.e., the capacitor insulating layer between the first plate and the second plate is not located between the semiconductor layer and the third conductive layer, and a second insulating layer is also arranged between the semiconductor layer and the first insulating layer, thus, permeation of hydrogen element in the first insulating layer may be blocked, thereby avoiding the influence of hydrogen element on the characteristics of the oxide thin film transistor and improving stability of the characteristics of the oxide thin film transistor.

Figure 15:
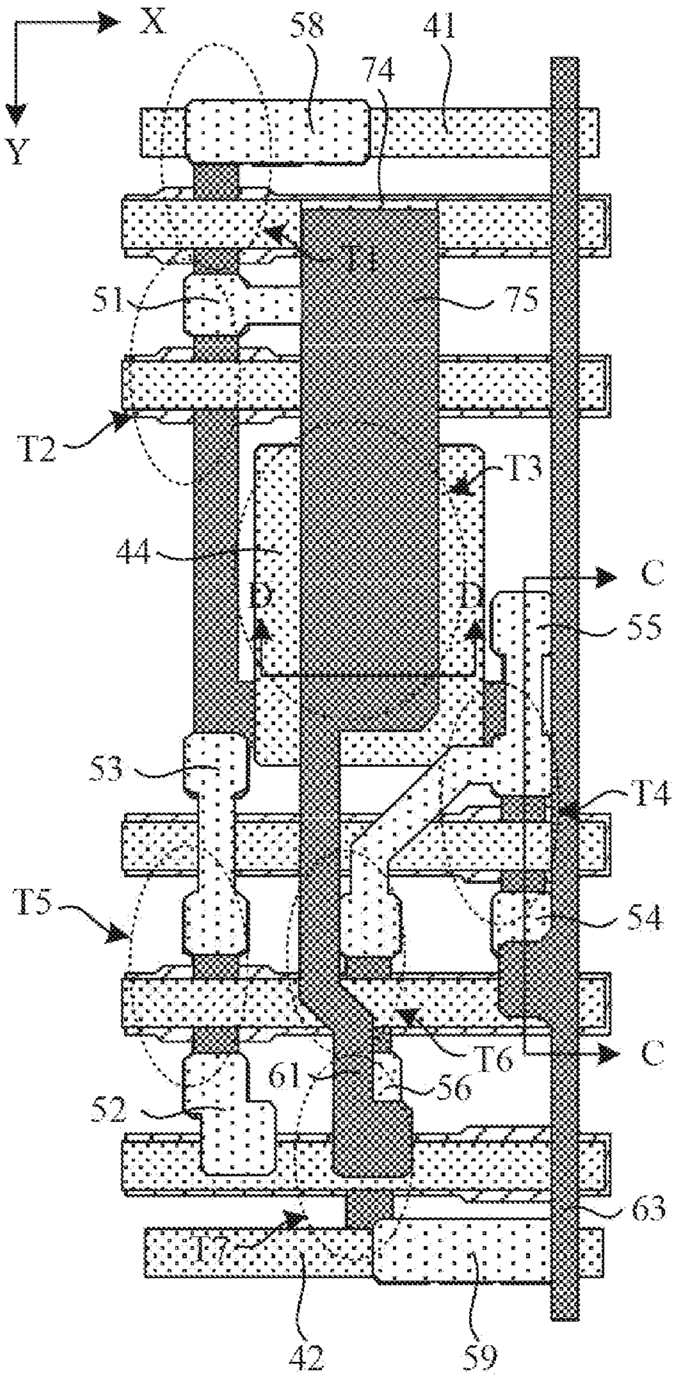
FIG. 15 is a schematic diagram of a planar structure of another display substrate according to an exemplary embodiment of the present disclosure.
Figure 16A:
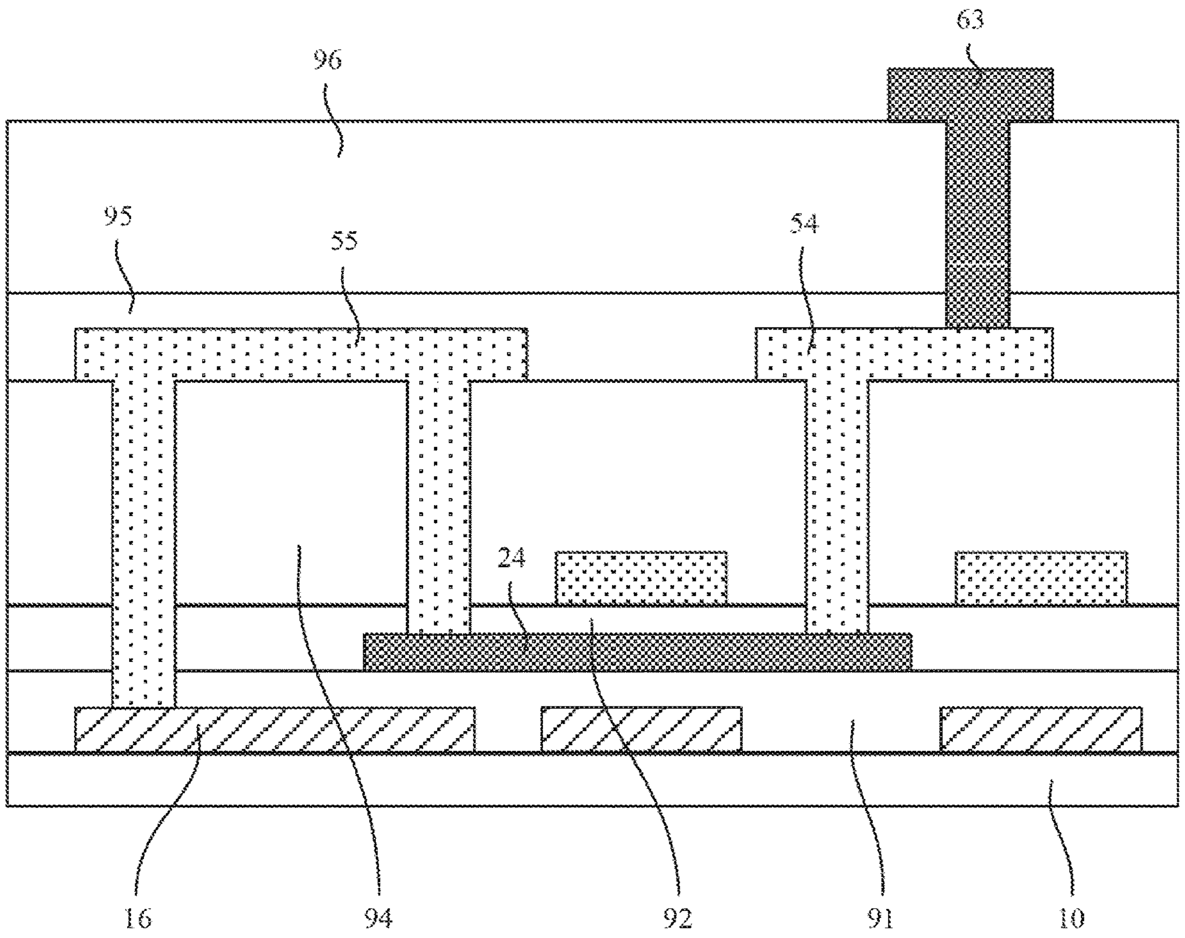
FIG. 16A is a schematic sectional view in a direction C-C in FIG. 15.
Figure 16B:
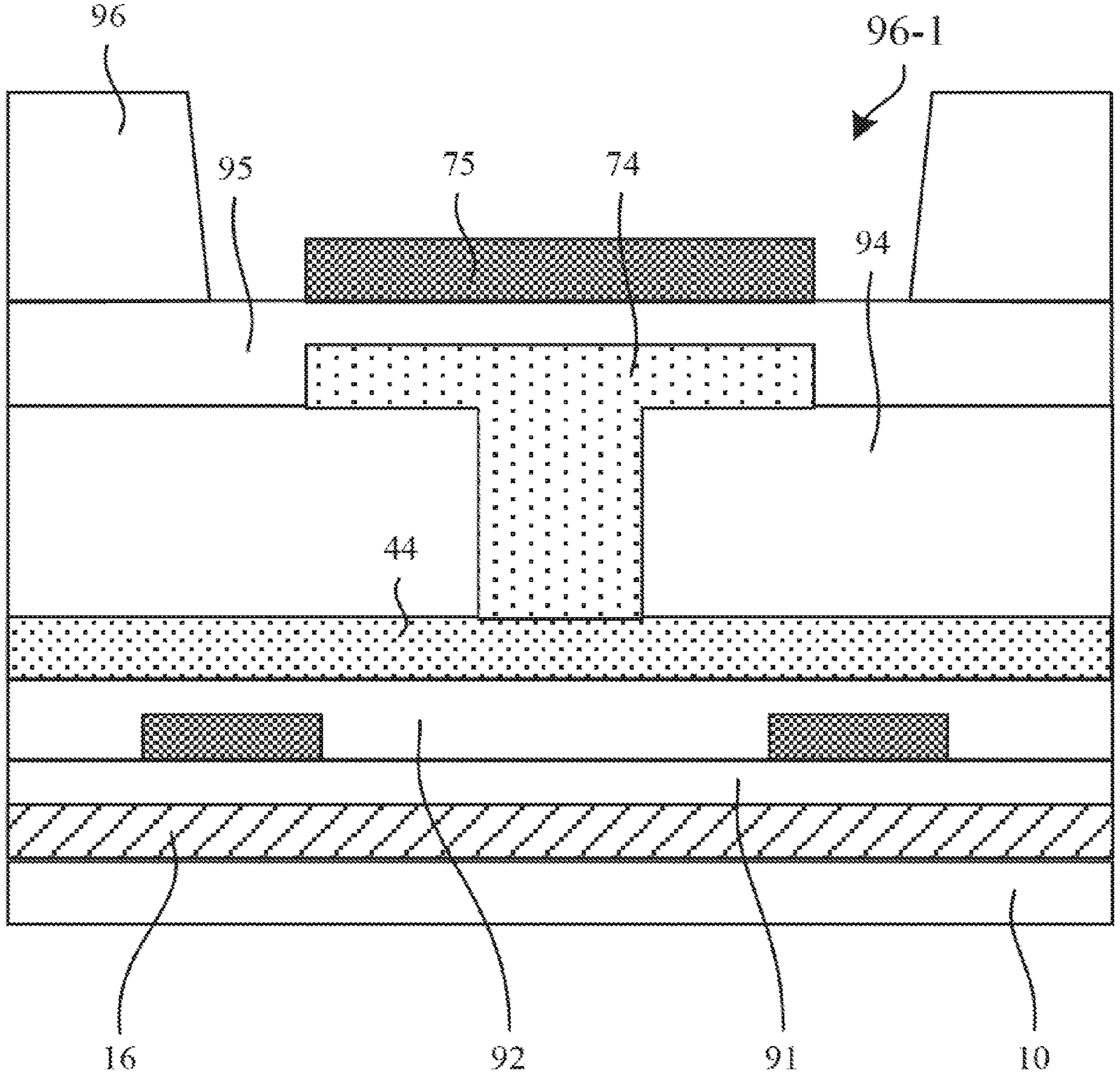
FIG. 16B is a schematic sectional view in a direction D-D in FIG. 15.
Figure 16C:
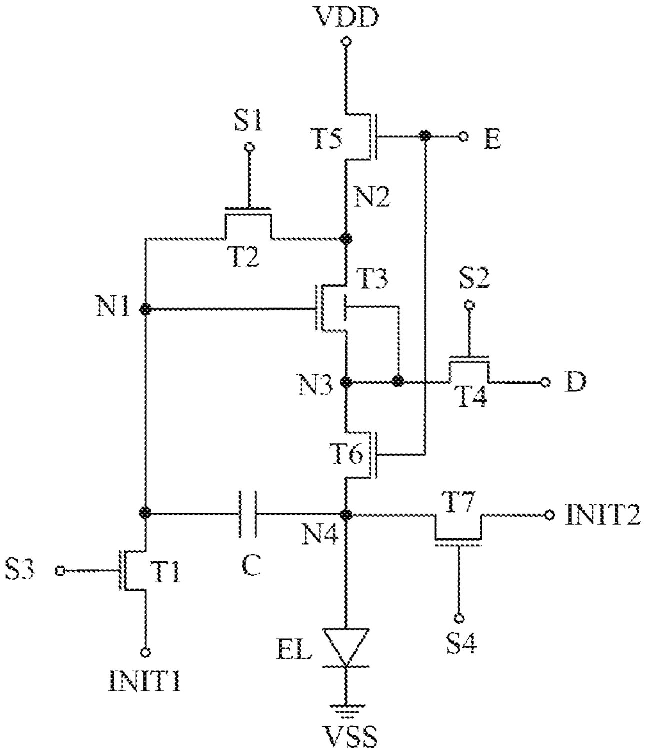
FIG. 16C is an equivalent circuit diagram of a pixel drive circuit shown in FIG. 15.

FIG. 15 is a schematic diagram of a planar structure of another display substrate according to an exemplary embodiment of the present disclosure, illustrating a structure of a pixel drive circuit in a circuit unit, FIG. 16A is a schematic sectional view in a direction C-C in FIG. 15, FIG. 16B is a schematic sectional view in a direction D-D in FIG. 15, and FIG. 16C is an equivalent circuit diagram of a pixel drive circuit shown in FIG. 15. In an exemplary implementation, in a direction perpendicular to the display substrate, the display substrate may include a drive circuit layer arranged on a base substrate, a light emitting structure layer arranged on a side of the drive circuit layer away from the base substrate, and an encapsulation structure layer arranged on a side of the light emitting structure layer away from the base substrate. In a direction parallel to the display substrate, the drive circuit layer may include circuit units forming a plurality of unit rows and a plurality of unit columns, at least one circuit unit includes a pixel drive circuit, the pixel drive circuit may include a storage capacitor, a first transistor T1 to a seventh transistor T7, and the first transistor T1 to the seventh transistor T7 are oxide transistors.

As shown in FIG. 15, FIG. 16A and FIG. 16B, in an exemplary implementation, the drive circuit layer may at least include: a shielding conductive layer arranged on a base substrate 10, a first insulating layer 91 arranged on a side of the shielding conductive layer away from the base substrate, a semiconductor layer arranged on a side of the first insulating layer 91 away from the base substrate, a second insulating layer 92 arranged on a side of the semiconductor layer away from the base substrate, a first conductive layer arranged on a side of the second insulating layer 92 away from the base substrate, a fourth insulating layer 94 arranged on a side of the first conductive layer away from the base substrate, a third conductive layer arranged on a side of the fourth insulating layer 94 away from the base substrate, a fifth insulating layer 95 and a first planarization layer 96 arranged on a side of the third conductive layer away from the base substrate, and a fourth conductive layer arranged on a side of the first planarization layer 96 away from the base substrate.

In an exemplary implementation, the shielding conductive layer may at least include a shielding electrode 16 and a plurality of shielding lines, the semiconductor layer may at least include active layers of the first transistor T1 to the seventh transistor T7, the first conductive layer may at least include a plurality of scan signal lines and a third gate electrode 44, the third conductive layer may at least include a fourth plate 74 of a storage capacitor and a plurality of connection electrodes, the fourth conductive layer may at least include an anode connection electrode 61, a data signal line 63 and a fifth plate 75 of the storage capacitor, an orthographic projection of the fourth plate 74 on the base substrate at least partially overlaps an orthographic projection of the fifth plate 75 on the base substrate, and the fourth plate 74 and the fifth plate 75 form the storage capacitor.

In an exemplary implementation, the first planarization layer 96 is provided with a planarization groove 96-1, and the first planarization layer within the planarization groove 96-1 is removed to expose the fifth insulating layer 95. The fifth plate 75 may be arranged on the fifth insulating layer 95 in the planarization groove 96-1, and an orthographic projection of the planarization groove 96-1 on the base substrate includes orthographic projections of the fourth plate 74 and the fifth plate 75 on the base substrate. Thus, only the fifth insulating layer is arranged between the fourth plate 74 and the fifth plate 75, and the fifth insulating layer 95 serves as a capacitor insulating layer between the fourth plate 74 and the fifth plate 75.

In an exemplary implementation, the first transistor T1 to the seventh transistor T7 may each include a bottom gate electrode and a top gate electrode, the bottom gate electrode may be arranged in the shielding conductive layer, and the top gate electrode may be arranged in the first conductive layer. For example, taking the third transistor T3 as an example, the third gate electrode 44 in the first conductive layer may serve as the top gate electrode of the third transistor T3, and is connected to the first node N1 of the pixel drive circuit, and the shielding electrode 16 in the shielding conductive layer may serve as the bottom gate electrode of the third transistor T3 to shield the third transistor T3, and is connected to the third node N3 of the pixel drive circuit, as shown in FIG. 16C.

In an exemplary implementation, the first conductive layer may further include a first initial sub-line 41 and a second initial sub-line 42, and the plurality of connection electrodes of the third conductive layer may at least include: a first connection electrode 51, a second connection electrode 52, a third connection electrode 53, a fourth connection electrode 54, a fifth connection electrode 55, a sixth connection electrode 56, an eighth connection electrode 58 and a ninth connection electrode 59. Connection structures of the second connection electrode 52, the third connection electrode 53, the fourth connection electrode 54, the sixth connection electrode 56, the eighth connection electrode 58 and the ninth connection electrode 59 in this embodiment are substantially the same as those in an aforementioned embodiment.

In an exemplary implementation, the first connection electrode 51 may serve as a first node electrode (N1 node electrode) of the pixel drive circuit, a first end of the first connection electrode 51 is connected to the fourth plate 74, and a second end of the first connection electrode 51 is connected to a second region of the first active layer (also a first region of the second active layer) through a via. The fourth plate 74 is connected to the third gate electrode 44 through a via, thereby realizing that a second electrode of the first transistor T1, a first electrode of the second transistor T2, the third gate electrode 44 (the top gate electrode of the third transistor T3) and the fourth plate 74 of the storage capacitor have a same potential.

In an exemplary implementation, the fifth connection electrode 55 may serve as a third node electrode (N3 node electrode) of the pixel drive circuit. A first end of the fifth connection electrode 55 is connected to a first region of the sixth active layer through a via, a second end of the fifth connection electrode 55 is connected to the shielding electrode 16 through a via, and a middle portion of the fifth connection electrode 55 is connected to a second region of the fourth active layer (also a second region of the third active layer) through a via, thereby realizing that a second electrode of the third transistor T3, a second electrode of the fourth transistor T4, a first electrode of the sixth transistor T6 and the shielding electrode 16 (the bottom gate electrode of the third transistor T3) have a same potential.

In an exemplary implementation, the anode connection electrode 61 may serve as a fourth node electrode (N4 node electrode) of the pixel drive circuit, a first end of the anode connection electrode 61 is connected to the sixth connection electrode 56 through a via, and a second end of the anode connection electrode 61 is connected to the fifth plate 75, thereby realizing that a second electrode of the sixth transistor T6, a second electrode of the seventh transistor T7 and the fifth plate 75 of the storage capacitor have a same potential.

In an exemplary implementation, a preparation process of the display substrate of this exemplary embodiment may include following operations.

Figure 17:
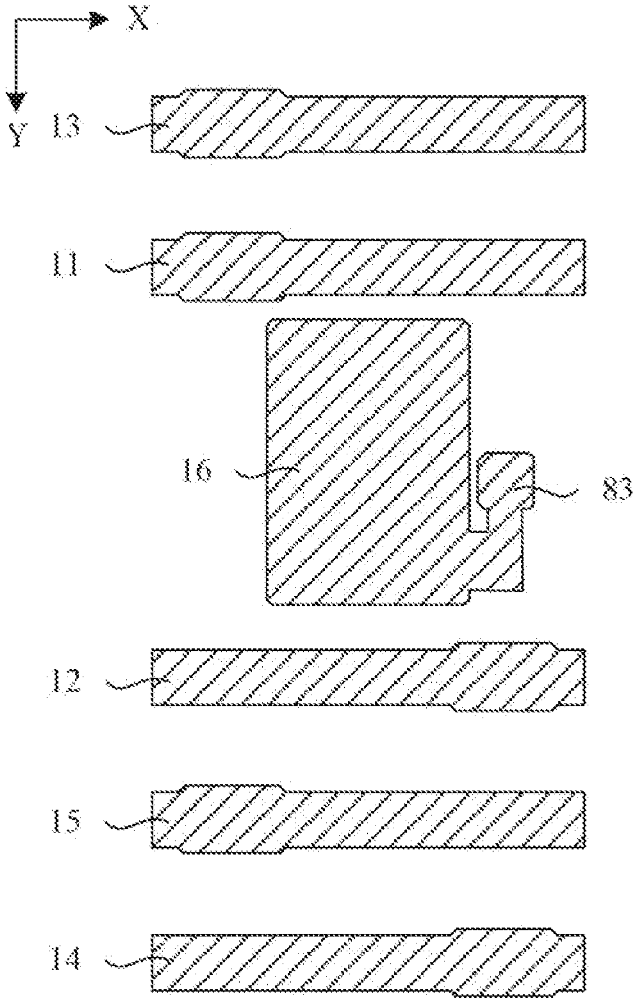
FIG. 17 is a schematic diagram of another display substrate after a pattern of a shielding conductive layer is formed according to the present disclosure.

(21) A pattern of a shielding conductive layer is formed. In an exemplary implementation, forming the pattern of the shielding conductive layer may include: depositing a shielding thin film on a base substrate, and patterning the shielding thin film by a patterning process to form the pattern of the shielding conductive layer on the base substrate, as shown in FIG. 17.

In an exemplary implementation, the pattern of the shielding conductive layer may at least include: a first shielding line 11, a second shielding line 12, a third shielding line 13, a fourth shielding line 14, a fifth shielding line 15 and a shielding electrode 16, and structures of the first shielding line 11 to the fifth shielding line 15 are substantially the same as those in an aforementioned embodiment.

In an exemplary implementation, the shielding electrode 16 may be in a shape of a rectangle, and the shielding electrode 16 is configured to shield the third transistor T3 while serving as the bottom gate electrode of the third transistor T3.

In the exemplary implementation, a third connection block 83 is also connected to a side of the shielding electrode 16 in the first direction X, and the third connection block 83 is configured to be connected to the fifth connection electrode subsequently formed.

In an exemplary implementation, a material and a thickness of the shielding conductive layer may be substantially the same as those in an aforementioned embodiment.

Figure 18:
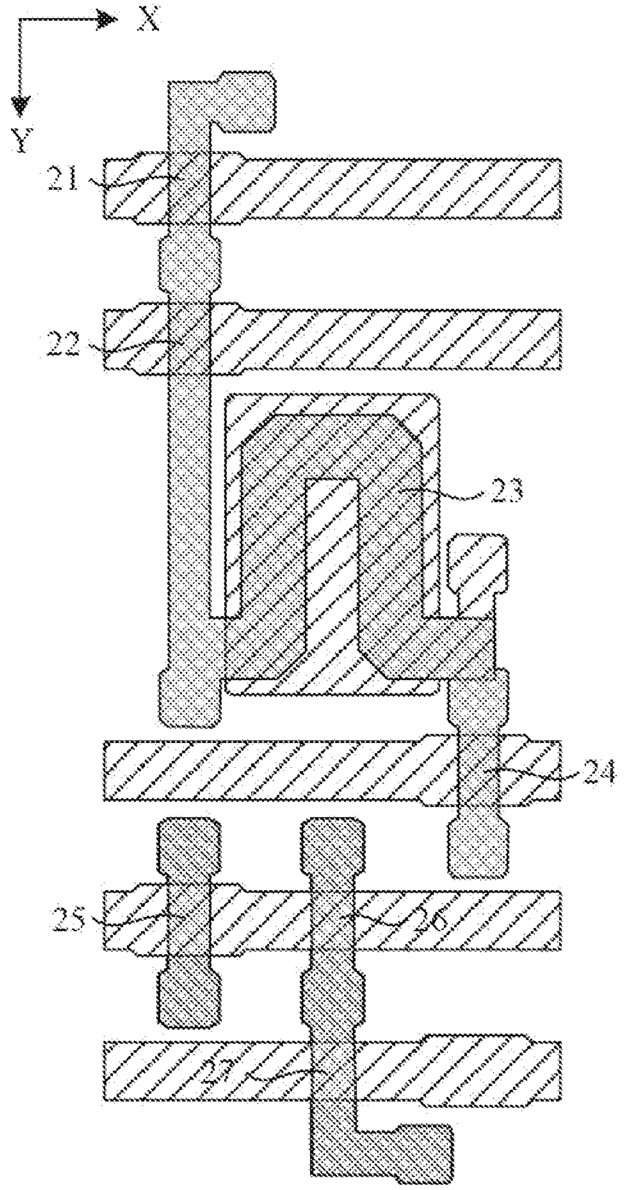
FIG. 18 is a schematic diagram of another display substrate after a pattern of a semiconductor layer is formed according to the present disclosure.

(22) A pattern of a semiconductor layer is formed. In an exemplary implementation, forming the pattern of the semiconductor layer may include: depositing sequentially a first insulating thin film and a semiconductor thin film on the base substrate, and patterning the semiconductor thin film by a patterning process to form a first insulating layer that covers the shielding conductive layer and the pattern of the semiconductor layer arranged on the first insulating layer, as shown in FIG. 18.

In an exemplary implementation, the pattern of the semiconductor layer may at least include a first active layer 21, a second active layer 22, a third active layer 23, a fourth active layer 24, a fifth active layer 25, a sixth active layer 26 and a seventh active layer 27, structures of the first active layer 21 to the seventh active layer 27 may be substantially the same as those in an aforementioned embodiment, and an orthographic projection of the third active layer 23 on the base substrate at least partially overlaps an orthographic projection of the shielding electrode 16 on the base substrate.

In an exemplary implementation, a conductor layer may be made of indium gallium zinc oxide (IGZO) having a relatively high electron mobility, and the first insulating layer may be made of any one or more of silicon oxide (SiOx), silicon nitride (SiNx), and silicon oxynitride (SiON), and may be a single layer, a multi-layer, or a composite layer. Thicknesses of the semiconductor layer and the first insulating layer may be substantially the same as those in an aforementioned embodiment.

Figure 19:
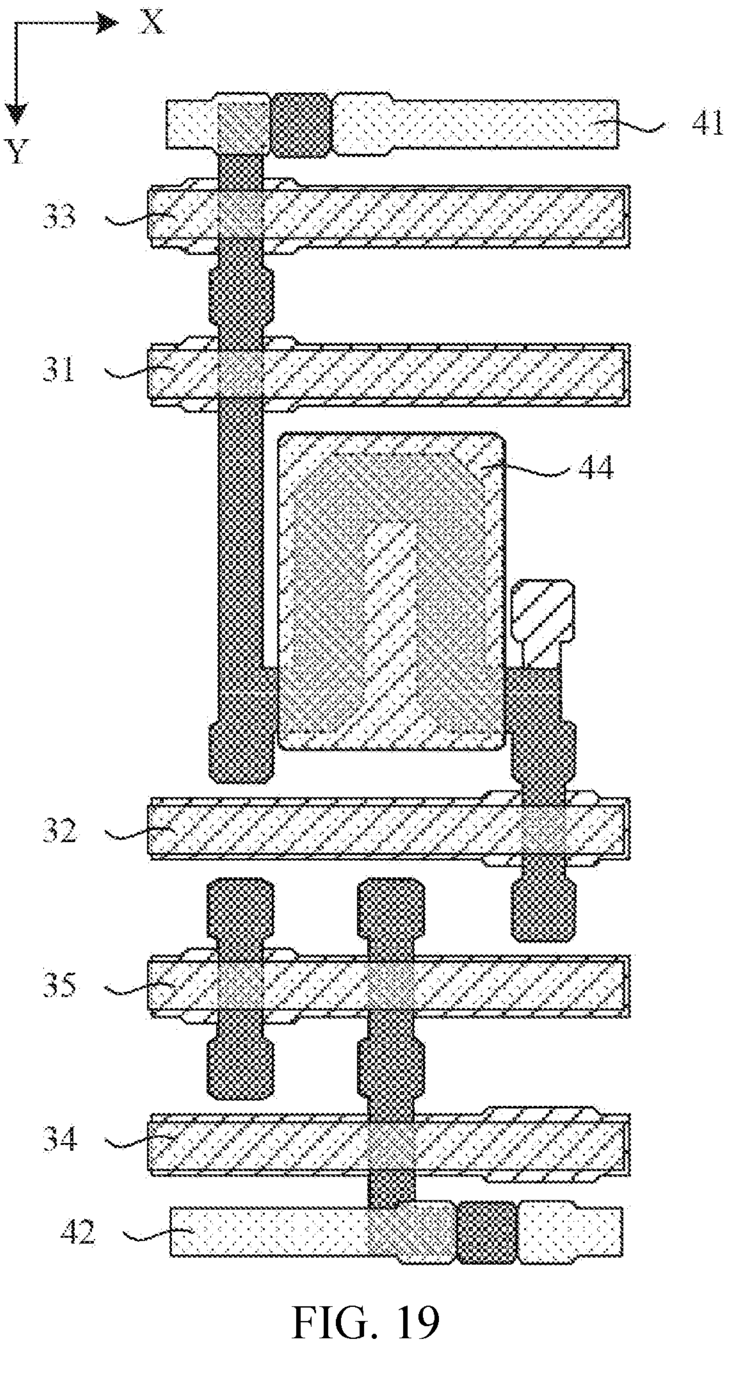
FIG. 19 is a schematic diagram of another display substrate after a pattern of a first conductive layer is formed according to the present disclosure.

(23) A pattern of a first conductive layer is formed. In an exemplary implementation, forming the pattern of the first conductive layer may include: sequentially depositing a second insulating thin film and a first conductive thin film on the base substrate on which the aforementioned patterns are formed, patterning the first conductive thin film by a patterning process to form a second insulating layer that covers the pattern of the semiconductor layer and the pattern of the first conductive layer arranged on the second insulating layer, as shown in FIG. 19.

In an exemplary implementation, the pattern of the first conductive layer at least includes: a first scan signal line 31, a second scan signal line 32, a third scan signal line 33, a fourth scan signal line 34, a light emitting control line 35, a first initial sub-line 41, a second initial sub-line 42 and a third gate electrode 44. Structures of the first scan signal line 31 to the fourth scan signal line 34, the light emitting control line 35, the first initial sub-line 41 and the second initial sub-line 42 may be substantially the same as those in an aforementioned embodiment.

In an exemplary implementation, a profile of the third gate electrode 44 may be in a shape of a rectangle, corners of the rectangle may be chamfered, an orthographic projection of the third gate electrode 44 on the base substrate at least partially overlaps the orthographic projection of the third active layer 23 on the base substrate, and the third gate electrode 44 is configured as the top gate electrode of the third transistor T3.

In an exemplary implementation, materials and thicknesses of the second insulating layer and the first conductive layer may be substantially the same as those in an aforementioned embodiment.

Figure 20:
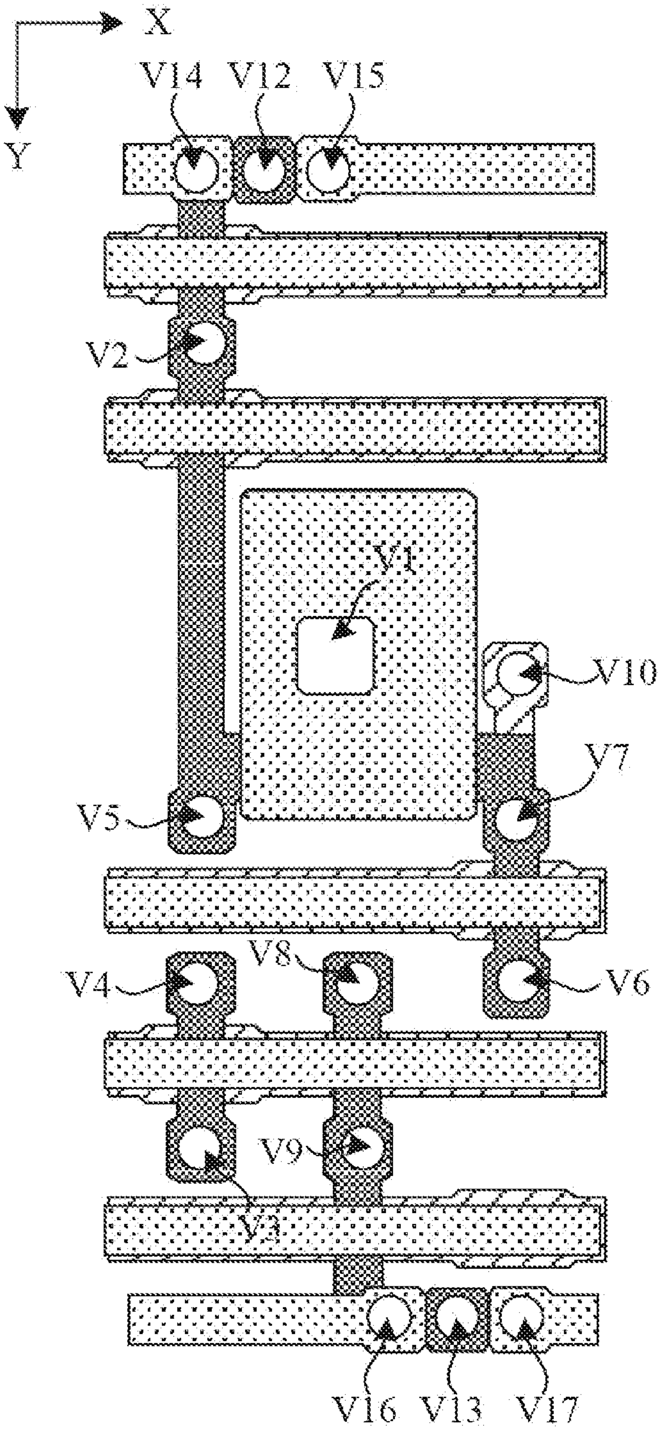
FIG. 20 is a schematic diagram of another display substrate after a pattern of a fourth insulating layer is formed according to the present disclosure.

(24) A pattern of a fourth insulating layer is formed. In an exemplary implementation, forming the pattern of the fourth insulating layer may include: depositing a fourth insulating thin film on the base substrate on which the aforementioned patterns are formed, and patterning the fourth insulating thin film by a patterning process to form the fourth insulating layer that covers the first conductive layer, the fourth insulating layer being provided with a plurality of vias, as shown in FIG. 20.

In an exemplary implementation, the plurality of vias at least include: a first via V1, a second via V2, a third via V3, a fourth via V4, a fifth via V5, a sixth via V6, a seventh via V7, an eighth via V8, a ninth via V9, a tenth via V10, a twelfth via V12, a thirteenth via V13, a fourteenth via V14, a fifteenth via V15, a sixteenth via V16 and a seventeenth via V17. Structures of the second via V2 to the ninth via V9 and the twelfth via V12 to the seventeenth via V17 may be substantially the same as those in an aforementioned embodiment.

In an exemplary implementation, an orthographic projection of the first via V1 on the base substrate is within a range of an orthographic projection of the third gate electrode 44 on the base substrate, the fourth insulating layer within the first via V1 is etched away to expose a surface of the third gate electrode 44, and the first via V1 is configured such that a fourth plate subsequently formed is connected to the third gate electrode 44 through this via.

In an exemplary implementation, an orthographic projection of the tenth via V10 on the base substrate is within a range of an orthographic projection of the third connection block 83 of the shielding electrode 16 on the base substrate, the fourth insulating layer, the second insulating layer and the first insulating layer within the tenth via V10 are etched away to expose a surface of the third connection block 83, and the tenth via V10 is configured such that a fifth connection electrode 55 subsequently formed is connected to the shielding electrode 16 through this via.

In an exemplary implementation, a material and a thickness of the fourth insulating layer may be substantially the same as those in an aforementioned embodiment.

Figure 21:
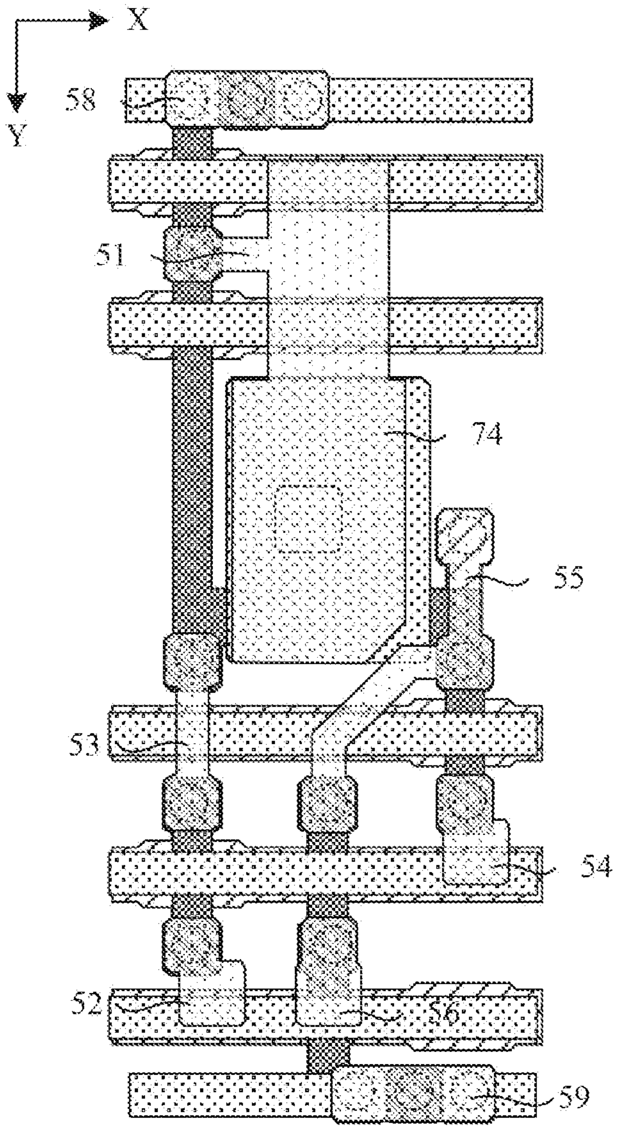
FIG. 21 is a schematic diagram of another display substrate after a pattern of a third conductive layer is formed according to the present disclosure.

(25) A pattern of a third conductive layer is formed. In an exemplary implementation, forming the third conductive layer may include: depositing a third conductive thin film on the base substrate on which the aforementioned patterns are formed, and patterning the third conductive thin film by a patterning process to form the third conductive layer arranged on the fourth insulating layer, as shown in FIG. 21.

In an exemplary implementation, the third conductive layer at least includes: a first connection electrode 51, a second connection electrode 52, a third connection electrode 53, a fourth connection electrode 54, a fifth connection electrode 55, a sixth connection electrode 56, an eighth connection electrode 58, a ninth connection electrode 59, and a fourth plate 74 of the storage capacitor. Structures of the second connection electrode 52 to the sixth connection electrode 56 and the eighth connection electrode 58 to the ninth connection electrode 59 may be substantially the same as those in an aforementioned embodiment.

In an exemplary implementation, the fourth plate 74 may be in a shape of a rectangle, an orthographic projection of the fourth plate 74 on the base substrate at least partially overlaps the orthographic projection of the third gate electrode 44 on the base substrate, the fourth plate 74 is connected to the third gate electrode 44 through the first via V1, and the fourth plate 74 may serve as a plate of the storage capacitor.

In an exemplary implementation, a ratio of an area of the orthographic projection of the fourth plate 74 on the base substrate to an area of the orthographic projection of the third gate electrode 44 on the base substrate may be greater than 50%. For example, the ratio of the area of the orthographic projection of the fourth plate 74 on the base substrate to the area of the orthographic projection of the third gate electrode 44 on the base substrate may be about 60%, or about 70%, or about 80%, or about 90%.

In an exemplary implementation, the fourth plate 74 may at least include: an overlapping region in which the orthographic projection of the fourth plate 74 on the base substrate overlaps the orthographic projection of the third gate electrode 44 on the base substrate, and a non-overlapping region in which the orthographic projection of the fourth plate 74 on the base substrate does not overlap the orthographic projection of the third gate electrode 44 on the base substrate. A width of the overlapping region may be greater than a width of the non-overlapping region, and the width may be a dimension of the fourth plate 74 in the first direction X.

In an exemplary implementation, the first connection electrode 51 may serve as a first node electrode (N1 node electrode) of the pixel drive circuit. The first connection electrode 51 may be in a shape of a strip extending in the first direction X, a first end of the first connection electrode 51 is directly connected to the fourth plate 74, and a second end of the first connection electrode 51 is connected to a second region of the first active layer (also a first region of the second active layer) through the second via V2. The fourth plate 74 is connected to the third gate electrode 44 through a via, thereby realizing that a second electrode of the first transistor T1, a first electrode of the second transistor T2, the third gate electrode 44 (the top gate electrode of the third transistor T3) and the fourth plate 74 of the storage capacitor have a same potential.

In an exemplary implementation, the first connection electrode 51 and the fourth plate 74 of the storage capacitor may be connected to each other to form an integrated structure.

In an exemplary implementation, the fifth connection electrode 55 may serve as a third node electrode (N3 node electrode) of the pixel drive circuit. The fifth connection electrode 55 may be in a shape of a broken line in which a main portion extends in the second direction Y, a first end of the fifth connection electrode 55 is connected to a first region of the sixth active layer through the eighth via V8, a second end of the fifth connection electrode 55 is connected to the third connection block 83 of the shielding electrode 16 through the tenth via V10, and a middle portion of the fifth connection electrode 55 between the first end and the second end is connected to a second region of the fourth active layer (also a second region of the third active layer) through the seventh via V7, thereby realizing that a second electrode of the third transistor T3, a second electrode of the fourth transistor T4, a first electrode of the sixth transistor T6 and the shielding electrode 16 (the bottom gate electrode of the third transistor T3) have a same potential.

In an exemplary implementation, the shielding electrode 16, as the bottom gate electrode of the third transistor T3, has a potential of the third node N3 of the pixel drive circuit, the third gate electrode 44, as the top gate electrode of the third transistor T3, has a potential of the first node N1 of the pixel drive circuit, and the orthographic projection of the third gate electrode 44 on the base substrate at least partially overlaps the orthographic projection of the shielding electrode 16 on the base substrate. In a light emitting stage when the sixth transistor T6 is turned on, since the potential of the third node N3 and the potential of the fourth node N4 are the same, the shielding electrode 16 of the shielding conductive layer and the third gate electrode 44 of the first conductive layer may form an auxiliary storage capacitor of the pixel drive circuit.

In the exemplary implementation, a material and a thickness of the third conductive layer may be substantially the same as those in an aforementioned embodiment.

Figure 22:
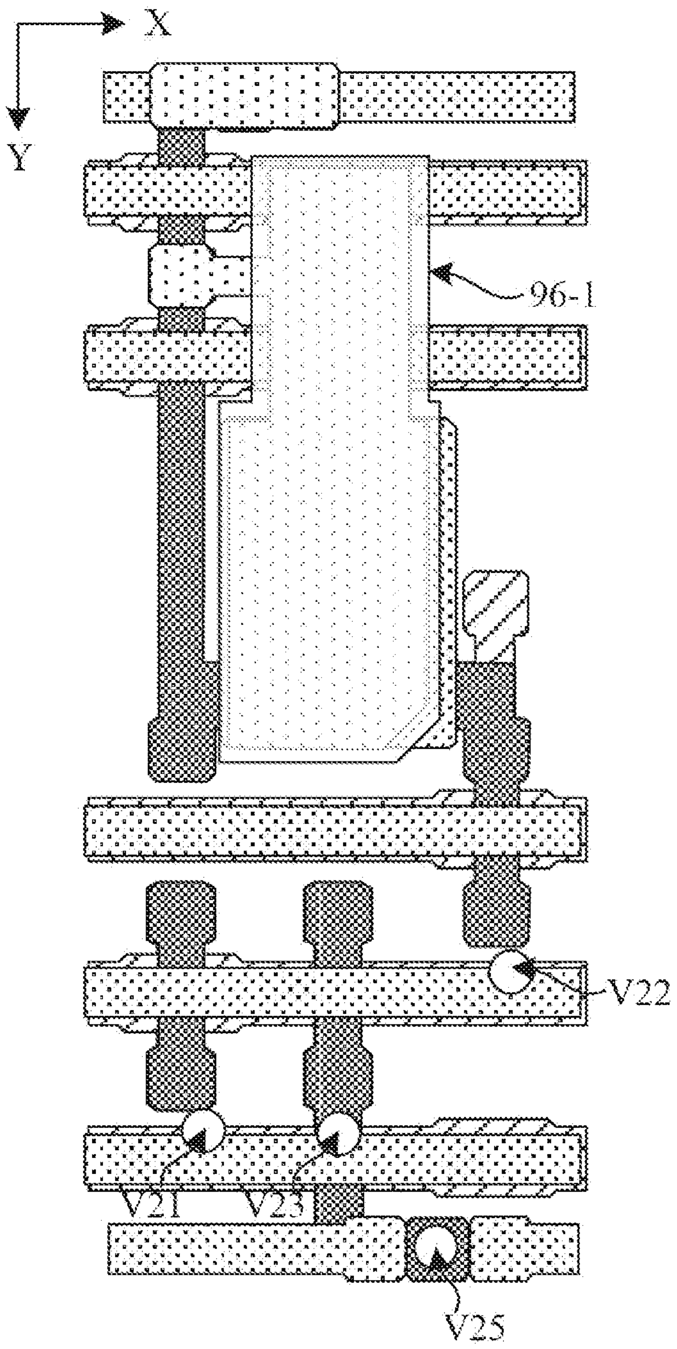
FIG. 22 is a schematic diagram of another display substrate after a pattern of a first planarization layer is formed according to the present disclosure.

(26) A pattern of a first planarization layer is formed. In an exemplary implementation, forming the pattern of the first planarization layer may include: first depositing a fifth insulating thin film on the base substrate on which the aforementioned patterns are formed, then coating a first planarization thin film, and patterning the first planarization thin film and the fifth insulating thin film by a patterning process to form a fifth insulating layer that covers the pattern of the third conductive layer and the first planarization layer arranged on the fifth insulating layer, the first planarization layer being provided with a planarization groove and a plurality of vias, as shown in FIG. 22.

In an exemplary implementation, the plurality of vias at least include: a twenty-first via V21, a twenty-second via V22, a twenty-third via V23 and a twenty-fifth via V25, and structures of the above vias may be substantially the same as those in an aforementioned embodiment.

In an exemplary implementation, a planarization groove 96-1 may be provided in a region where the fourth plate 74 is located, the first planarization layer within the planarization groove 96-1 is removed to expose the fifth insulating layer that covers the fourth plate 74, and an orthographic projection of the planarization groove 96-1 on the base substrate includes the orthographic projection of the fourth plate 74 on the base substrate. The planarization groove 96-1 is configured to accommodate a fifth plate subsequently formed so that only the fifth insulating layer is arranged between the fourth plate 74 and the fifth plate so as to increase the capacity of the storage capacitor.

In an exemplary implementation, the fifth insulating layer is a capacitor insulating layer arranged between the fourth plate and the fifth plate, which may be referred to as a passivation (PVX) layer, a material of the fifth insulating layer may be SiNx, and a thickness of the fifth insulating layer may be about 200 nm to 300 nm. For example, the thickness of the fifth insulating layer may be about 250 nm.

In an exemplary implementation, a material and a thickness of the first planarization layer may be substantially the same as those in an aforementioned embodiment.

Figure 23:
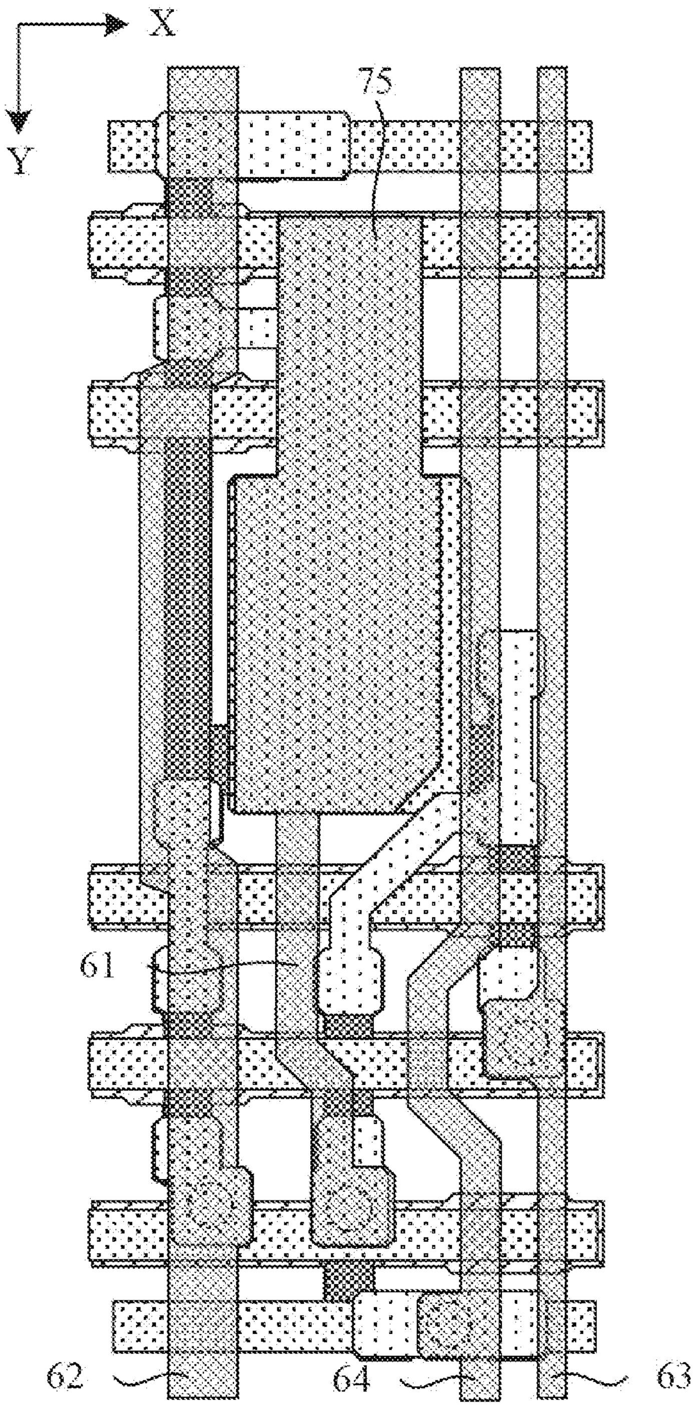
FIG. 23 is a schematic diagram of another display substrate after a pattern of a fourth conductive layer is formed according to the present disclosure.

(27) A pattern of a fourth conductive layer is formed. In an exemplary implementation, forming the fourth conductive layer may include: depositing a fourth conductive thin film on the base substrate on which the aforementioned patterns are formed, and patterning the fourth conductive thin film by a patterning process to form the fourth conductive layer arranged on the first planarization layer, as shown in FIG. 23.

In an exemplary implementation, the fourth conductive layer at least includes: an anode connection electrode 61, a first power supply line 62, a data signal line 63, an initial connection line 64, and a fifth plate 75 of the storage capacitor.

In an exemplary implementation, the anode connection electrode 61 may be in a shape of a broken line in which a main portion extends in the second direction Y, a first end of the anode connection electrode 61 is connected to the sixth connection electrode 56 through the twenty-third via V23, and a second end of the anode connection electrode 61 is connected to the fifth plate 75.

In an exemplary implementation, the anode connection electrode 61 may be provided with a first bump, or may be provided with a second bump, or may be provided with a first bump and a second bump, which is not limited here in the present disclosure.

In an exemplary implementation, the fifth plate 75 may be in a shape of a rectangle, and is arranged in the planarization groove 96-1, an orthographic projection of the fifth plate 75 on the base substrate at least partially overlaps the orthographic projection of the fourth plate 74 on the base substrate, the fifth plate 75 may serve as another plate of the storage capacitor, and the fourth plate 74 and the fifth plate 75 form the storage capacitor of the pixel drive circuit.

In an exemplary implementation, the orthographic projection of the fifth plate 75 on the base substrate at least partially overlaps the orthographic projection of the third gate electrode 44 on the base substrate. A ratio of an area of the orthographic projection of the fifth plate 75 on the base substrate to an area of the orthographic projection of the third gate electrode 44 on the base substrate may be greater than 50%. For example, the ratio of the area of the orthographic projection of the fifth plate 75 on the base substrate to the area of the orthographic projection of the third gate electrode 44 on the base substrate may be about 60%, or about 70%, or about 80%, or about 90%.

In an exemplary implementation, the fifth plate 75 may at least include: an overlapping region in which an orthographic projection of the fifth plate 75 on the base substrate overlaps the orthographic projection of the third gate electrode 44 on the base substrate, and a non-overlapping region in which the orthographic projection of the fifth plate 75 on the base substrate does not overlap the orthographic projection of the third gate electrode 44 on the base substrate. A width of the overlapping region may be greater than a width of the non-overlapping region, and the width may be a dimension of the fifth plate 75 in the first direction X.

In an exemplary implementation, the anode connection electrode 61 and the fifth plate 75 may be connected to each other to form an integrated structure. The sixth connection electrode 56 is connected to a second region of the sixth active layer (also a second region of the seventh active layer) through a via, thus realizing that the fifth plate 75, a second electrode of the sixth transistor T6 and a second electrode of the seventh transistor T7 have a same potential, i.e., the potential of the fourth node N4 of the pixel drive circuit.

In an exemplary implementation, structures of the first power supply line 62, the data signal line 63 and the initial connection line 64 may be substantially the same as those in an aforementioned embodiment, or an avoidance structure may be provided on the first power supply line 62 and/or the initial connection line 64, the avoidance structure causing the first power supply line 62 and/or the initial connection line 64 to bend in a direction away from the fifth plate 75, leaving a corresponding space for arranging the fifth plate 75.

In an exemplary implementation, a material and a thickness of the fourth conductive layer may be substantially the same as those in an aforementioned embodiment.

Subsequently, a second planarization thin film is coated on the base substrate on which the aforementioned patterns are formed, and the second planarization thin film is patterned by a patterning process to form a second planarization layer that covers the pattern of the fourth conductive layer. The second planarization layer is provided with an anode via, an orthographic projection of the anode via on the base substrate is within a range of an orthographic projection of the anode connection electrode on the base substrate, and the anode via is configured such that the anode subsequently formed is connected to the anode connection electrode through this via. In an exemplary implementation, a material and a thickness of the second planarization layer may be substantially the same as those in an aforementioned embodiment.

At this point, the drive circuit layer has been prepared on the base substrate. In a plane parallel to the display substrate, the drive circuit layer may include a plurality of circuit units, each circuit unit may include a pixel drive circuit, and a first scan signal line, a second scan signal line, a third scan signal line, a fourth scan signal line, a light emitting control line, a first initial signal line, a second initial signal line, a first power supply line and a data signal line which are connected to the pixel drive circuit. In a plane perpendicular to the display substrate, the drive circuit layer may include a shielding conductive layer, a first insulating layer, a semiconductor layer, a second insulating layer, a first conductive layer, a fourth insulating layer, a third conductive layer, a fifth insulating layer, a first planarization layer, a fourth conductive layer and a second planarization layer which are arranged sequentially on the base substrate. The shielding conductive layer may at least include a shielding electrode and a plurality of shielding lines, the semiconductor layer may at least include active layers of the first transistor to the seventh transistor, the first conductive layer may at least include a plurality of scan signal lines and a third gate electrode, the third conductive layer may at least include a fourth plate of the storage capacitor and a plurality of connection electrodes, the fourth conductive layer may at least include a fifth plate of the storage capacitor, an anode connection electrode, a first power supply line and a data signal line, an orthographic projection of the fourth plate on the base substrate at least partially overlaps an orthographic projection of the fifth plate on the base substrate, and the fourth plate and the fifth plate form a storage capacitor.

The fourth plate and the fifth plate of the storage capacitor of an exemplary embodiment of the present disclosure are arranged in the third conductive layer and the fourth conductive layer, respectively, and the capacitor insulating layer between the fourth plate and the fifth plate is made of silicon nitride, which may ensure the capacitor performance. In the present disclosure, the fifth insulating layer (the capacitor insulating layer) made of silicon nitride is arranged on a side of the third conductive layer away from the base substrate, i.e., the capacitor insulating layer between the fourth plate and the fifth plate is not located between the semiconductor layer and the third conductive layer, thus, permeation of hydrogen element in the fifth insulating layer may be avoided, thereby avoiding the influence of hydrogen element on the characteristics of the oxide thin film transistors and improving stability of the characteristics of the oxide thin film transistors. In the present disclosure, the bottom gate electrodes of the plurality of transistors are arranged in the shielding conductive layer, and the top gate electrodes of the plurality of transistors are arranged in the first conductive layer, which may effectively ensure shielding of the oxide transistors and improve the electrical performance of the transistors. In the present disclosure, the third insulating layer and the second conductive layer are canceled, which not only reduces one running of patterning process, but also can avoid permeation of hydrogen (H) element in the third insulating layer made of SiNx, thereby avoiding the influence of hydrogen element on the characteristics of the oxide thin film transistors and improving the stability of characteristics of the oxide thin film transistors. The preparation process in the present disclosure may be compatible well with an existing preparation process, which is simple in process implementation, is easy to implement, and has a high production efficiency, a low production cost and a high yield.

FIG. 24 is a schematic diagram of a planar structure of a further display substrate according to an exemplary embodiment of the present disclosure, illustrating a structure of a pixel drive circuit in a circuit unit, FIG. 25A is a schematic sectional view in a direction E-E in FIG. 24, FIG. 25B is a schematic sectional view in a direction F-F in FIG. 24, and FIG. 25C is an equivalent circuit diagram of the pixel drive circuit shown in FIG. 24. In an exemplary implementation, in a direction perpendicular to the display substrate, the display substrate may include a drive circuit layer arranged on a base substrate, a light emitting structure layer arranged on a side of the drive circuit layer away from the base substrate, and an encapsulation structure layer arranged on a side of the light emitting structure layer away from the base substrate. In a direction parallel to the display substrate, the drive circuit layer may include circuit units forming a plurality of unit rows and a plurality of unit columns, at least one circuit unit includes a pixel drive circuit, the pixel drive circuit may include a storage capacitor, and a first transistor T1 to a seventh transistor T7, the first transistor T1 to the seventh transistor T7 being oxide transistors.

As shown in FIG. 24, FIG. 25A and FIG. 25B, in an exemplary implementation, the drive circuit layer may at least include: a shielding conductive layer arranged on a base substrate 10, a first insulating layer 91 arranged on a side of the shielding conductive layer away from the base substrate, a semiconductor layer arranged on a side of the first insulating layer 91 away from the base substrate, a second insulating layer 92 arranged on a side of the semiconductor layer away from the base substrate, a first conductive layer arranged on a side of the second insulating layer 92 away from the base substrate, a third insulating layer 93 arranged on a side of the first conductive layer away from the base substrate, a second conductive layer arranged on a side of the third insulating layer 93 away from the base substrate, a fourth insulating layer 94 arranged on a side of the second conductive layer away from the base substrate, and a third conductive layer arranged on a side of the fourth insulating layer 94 away from the base substrate.

In an exemplary implementation, the shielding conductive layer may at least include a shielding electrode 16 and a plurality of shielding lines, the semiconductor layer may at least include active layers of a first transistor to a seventh transistor, the first conductive layer may at least include a seventh plate 77 of the storage capacitor and a plurality of scan signal lines, the second conductive layer may at least include an eighth plate 78 of the storage capacitor, and the third conductive layer may at least include a plurality of connection electrodes.

In an exemplary implementation, the seventh plate 77 of the storage capacitor may be arranged in the first conductive layer, an eighth plate 78 of the storage capacitor may be arranged in the second conductive layer, an orthographic projection of the seventh plate 77 on the base substrate at least partially overlaps an orthographic projection of the eighth plate 78 on the base substrate, and the third insulating layer 93 is a capacitor insulating layer arranged between the seventh plate 77 and the eighth plate 78.

In an exemplary implementation, the first transistor T1 to the seventh transistor T7 may each include a bottom gate electrode and a top gate electrode, the bottom gate electrode may be arranged in the shielding conductive layer, and the top gate electrode may be arranged in the first conductive layer. For example, taking the third transistor T3 as an example, the seventh plate 77 in the first conductive layer may serve as the top gate electrode of the third transistor T3, i.e., the top gate electrode of the third transistor T3 and the seventh plate 77 are connected to each other to form an integrated structure. The shielding electrode 16 in the shielding conductive layer may serve as the bottom gate electrode of the third transistor T3 to shield the third transistor T3, and is connected to the third node N3 of the pixel drive circuit, as shown in FIG. 25C.

In an exemplary implementation, the third conductive layer may at least include: a first connection electrode 51, a second connection electrode 52, a third connection electrode 53, a fourth connection electrode 54, a fifth connection electrode 55, a sixth connection electrode 56 and a seventh connection electrode 57.

In an exemplary implementation, the first connection electrode 51 may serve as a first node electrode (N1 node electrode) of the pixel drive circuit, a first end of the first connection electrode 51 is connected to the seventh plate 77 through a via, and a second end of the first connection electrode 51 is connected to a second region of the first active layer (also a first region of the second active layer) through a via, thereby realizing that the seventh plate 77 of the storage capacitor, a second electrode of the first transistor T1 and a first electrode of the second transistor T2 have a same potential.

In an exemplary implementation, the second connection electrode 52 may be connected to a first region of the fifth active layer through a via, and since the second connection electrode 52 is connected to the first power supply line, it is realized that the first power supply line writes a first power supply voltage to a first electrode of the fifth transistor T5 through the second connection electrode 52.

In an exemplary implementation, the third connection electrode 53 may serve as a second node electrode (N2 node electrode) of the pixel drive circuit, a first end of the third connection electrode 53 is connected to a second region of the second active layer (also a first region of the third active layer) through a via, and a second end of the third connection electrode 53 is connected to a second region of the fifth active layer through a via, thereby realizing that a second electrode of the second transistor T2, a first electrode of the third transistor T3 and a second electrode of the fifth transistor T5 have a same potential.

In an exemplary implementation, the fourth connection electrode 54 may serve as a data input electrode of the pixel drive circuit, the fourth connection electrode 54 is connected to a first region of the fourth active layer 24 through a via, and since the fourth connection electrode 54 is connected to a data signal line, it is realized that the data signal line writes a data signal to the first electrode of the fourth transistor T4 through the fourth connection electrode 54.

In an exemplary implementation, the fifth connection electrode 55 may serve as a third node electrode (N3 node electrode) of the pixel drive circuit, on the one hand, the fifth connection electrode 55 is connected to a second region of the fourth active layer (also a second region of the third active layer) through a via, and on the other hand, the fifth connection electrode 55 is connected to a first region of the sixth active layer through a via, thereby realizing that a second electrode of the third transistor T3, a second electrode of the fourth transistor T4 and a first electrode of the sixth transistor T6 have a same potential.

In an exemplary implementation, the fifth connection electrode 55 is also connected to the shielding electrode 16 through a via, thereby realizing connection between a second electrode of the third transistor T3 and the bottom gate electrode of the third transistor T3.

In an exemplary implementation, the sixth connection electrode 56 is connected to a second region of the sixth active layer (also a second region of the seventh active layer) through a via, thereby realizing that a second electrode of the sixth transistor T6 and a second electrode of the seventh transistor T7 have a same potential.

In an exemplary implementation, the seventh connection electrode 57 may serve as a fourth node electrode (N4 node electrode) of the pixel drive circuit, on the one hand, the fifth connection electrode 55 is connected to the eighth plate 78 through a via, and on the other hand, the fifth connection electrode 55 is connected to the sixth connection electrode 56 through an anode connection electrode, thereby realizing that the eighth plate 78 of the storage capacitor, a second electrode of the sixth transistor T6 and a second electrode of the seventh transistor T7 have a same potential.

In an exemplary implementation, the second conductive layer may further include a first initial sub-line 41 and a second initial sub-line 42, and the third conductive layer may further include an eighth connection electrode 58 and a ninth connection electrode 59, and the above structures may be substantially the same as those in an aforementioned embodiment.

In an exemplary implementation, a preparation process of the display substrate of the exemplary embodiment may include following operations.

(31) A pattern of a shielding conductive layer is formed. In an exemplary implementation, forming the pattern of the shielding conductive layer may include: depositing a shielding thin film on a base substrate, and patterning the shielding thin film by a patterning process to form the pattern of the shielding conductive layer on the base substrate, as shown in FIG. 26.

In an exemplary implementation, the pattern of the shielding conductive layer may at least include: a first shielding line 11, a second shielding line 12, a third shielding line 13, a fourth shielding line 14, a fifth shielding line 15 and a shielding electrode 16, and structures of the first shielding line 11 to the fifth shielding line 15 are substantially the same as those in an aforementioned embodiment.

In an exemplary implementation, the shielding electrode 16 may be in a shape of "n" and may be located between the first shielding line 11 and the second shielding line 12, and the shielding electrode 16 is configured to shield the third transistor T3 to reduce the influence of light on the electrical characteristics of the third transistor T3, and is also configured as the bottom gate electrode of the third transistor T3.

In an exemplary implementation, a third connection block 83 is also connected to a side of the shielding electrode 16 in the first direction X, and the third connection block 83 is configured to be connected to a fifth connection electrode subsequently formed.

In an exemplary implementation, a material and a thickness of the shielding conductive layer may be substantially the same as those in an aforementioned embodiment.

(32) A pattern of a semiconductor layer is formed. In an exemplary implementation, forming the pattern of the semiconductor layer may include: depositing sequentially a first insulating thin film and a semiconductor thin film on the base substrate, and patterning the semiconductor thin film by a patterning process to form a first insulating layer that covers the shielding conductive layer and the pattern of the semiconductor layer arranged on the first insulating layer, as shown in FIG. 27.

In an exemplary implementation, the pattern of the semiconductor layer may at least include a first active layer 21, a second active layer 22, a third active layer 23, a fourth active layer 24, a fifth active layer 25, a sixth active layer 26 and a seventh active layer 27, structures of the first active layer 21 to the seventh active layer 27 may be substantially the same as those in an aforementioned embodiment, and an orthographic projection of the third active layer 23 on the base substrate at least partially overlaps an orthographic projection of the shielding electrode 16 on the base substrate.

In an exemplary implementation, the conductor layer may be made of indium gallium zinc oxide (IGZO) having a relatively high electron mobility, and the first insulating layer may be made of any one or more of silicon oxide (SiOx), silicon nitride (SiNx), and silicon oxynitride (SiON), and may be a single layer, a multi-layer, or a composite layer. Thicknesses of the semiconductor layer and the first insulating layer may be substantially the same as those in an aforementioned embodiment.

(33) A pattern of a first conductive layer is formed. In an exemplary implementation, forming the pattern of the first conductive layer may include: sequentially depositing a second insulating thin film and a first conductive thin film on the base substrate on which the aforementioned patterns are formed, and patterning the first conductive thin film by a patterning process to form a second insulating layer that covers the pattern of the semiconductor layer and the pattern of the first conductive layer arranged on the second insulating layer, as shown in FIG. 28.

In an exemplary implementation, the pattern of the first conductive layer at least includes: a first scan signal line 31, a second scan signal line 32, a third scan signal line 33, a fourth scan signal line 34, a light emitting control line 35, and a seventh plate 77 of the storage capacitor. Structures of the first scan signal line 31 to the fourth scan signal line 34, and the light emitting control line 35 may be substantially the same as those in an aforementioned embodiment.

In an exemplary implementation, the seventh plate 77 may be in a shape of a rectangle, corners of the rectangle may be chamfered, and an orthographic projection of the seventh plate 77 on the base substrate at least partially overlaps an orthographic projection of the third active layer of the third transistor T3 on the base substrate. In an exemplary implementation, the seventh plate 77 may serve as one plate of the storage capacitor and the top gate electrode of the third transistor T3 (a drive transistor) simultaneously.

In an exemplary implementation, materials and thicknesses of the second insulating layer and the first conductive layer may be substantially the same as those in an aforementioned embodiment.

Figure 29:
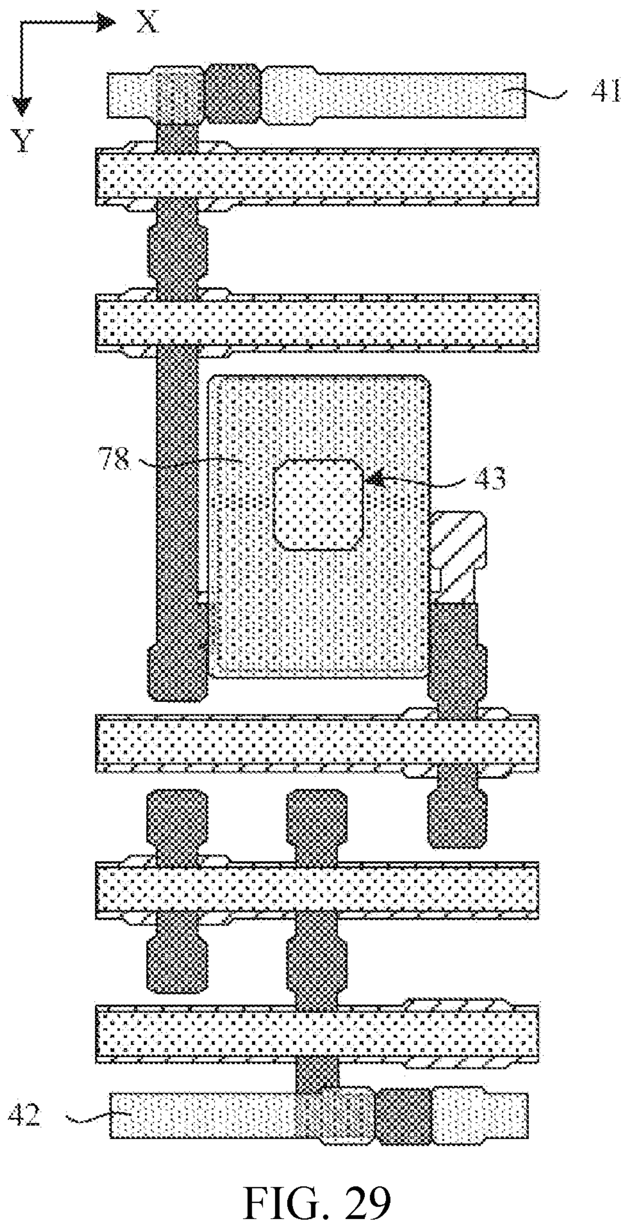
FIG. 29 is a schematic diagram of a further display substrate after a pattern of a second conductive layer is formed according to the present disclosure.

(34) A pattern of a second conductive layer is formed. In an exemplary implementation, forming the pattern of the second conductive layer may include: depositing sequentially a third insulating thin film and a second conductive thin film on the base substrate on which the aforementioned patterns are formed, and patterning the second conductive thin film by a patterning process to form a third insulating layer that covers the first conductive layer and the pattern of the second conductive layer arranged on the third insulating layer, as shown in FIG. 29.

In an exemplary implementation, the pattern of the second conductive layer of each circuit unit at least includes: a first initial sub-line 41, a second initial sub-line 42, and an eighth plate 78 of the storage capacitor, and structures of the first initial sub-line 41 and the second initial sub-line 42 may be substantially the same as those in an aforementioned embodiment.

In an exemplary implementation, a profile of the eighth plate 78 may be in a shape of a rectangle, corners of the rectangle may be chamfered, an orthographic projection of the eighth plate 78 on the base substrate at least partially overlaps the orthographic projection of the seventh plate 77 on the base substrate, the eighth plate 78 may serve as another plate of the storage capacitor, and the seventh plate 77 and the eighth plate 78 form a storage capacitor of the pixel drive circuit.

In an exemplary implementation, the eighth plate 78 is provided with an opening 43 which may be in a shape of a rectangle and may be located in a middle portion of the eighth plate 78, so that the eighth plate 78 forms an annular structure. The opening 43 exposes the third insulating layer that covers the seventh plate 77, and the orthographic projection of the seventh plate 77 on the base substrate includes an orthographic projection of the opening 43 on the base substrate. In an exemplary implementation, the opening 43 is configured to accommodate a first via subsequently formed, and the first via is located within the opening 43 and exposes the seventh plate 77, so that a first connection electrode subsequently formed is connected to the seventh plate 77.

In an exemplary implementation, the third insulating layer is a capacitor insulating layer arranged between the seventh plate and the eighth plate, and may be referred to as a second gate insulating (GI2) layer, a material of the third insulating layer may be SiNx, and a thickness of the third insulating layer may be about 100 nm to 170 nm. For example, the thickness of the third insulating layer may be about 130 nm. In an exemplary implementation, a material and a thickness of the second conductive layer may be substantially the same as those in an aforementioned embodiment.

Figure 30:
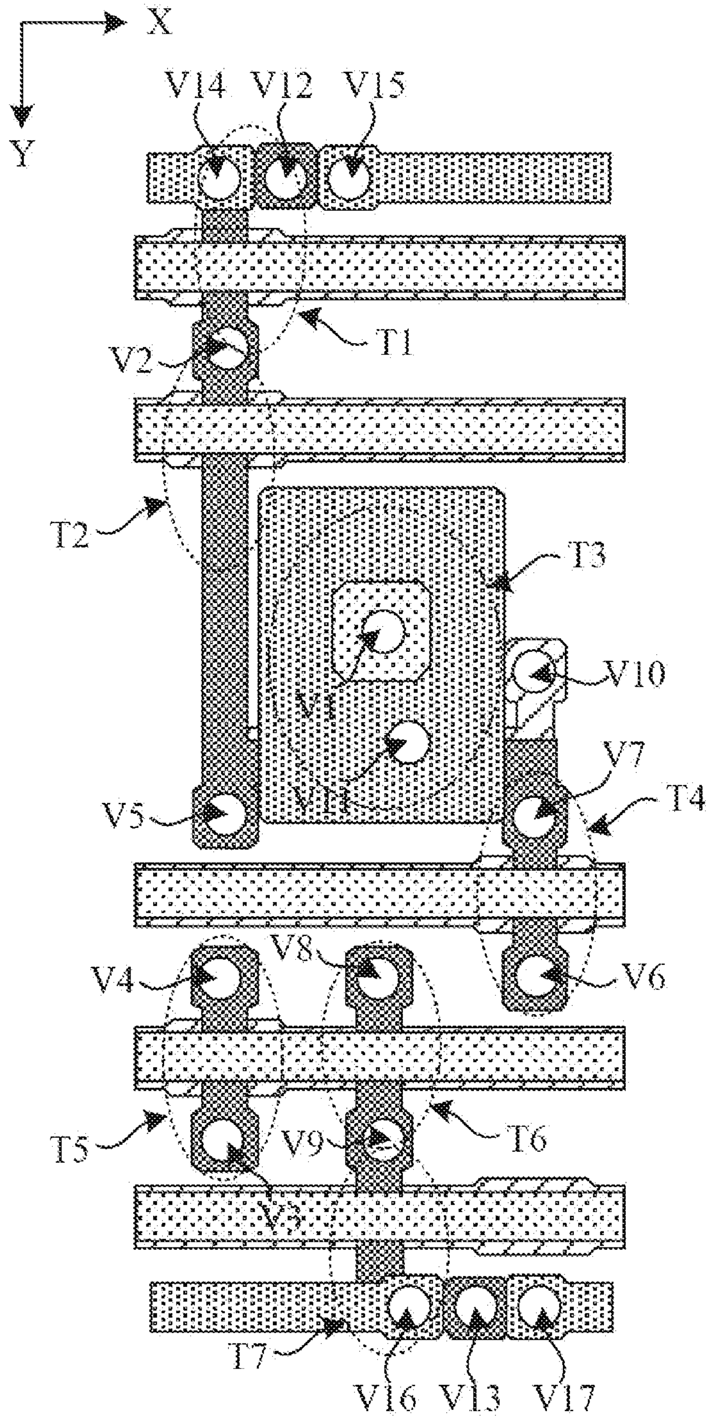
FIG. 30 is a schematic diagram of a further display substrate after a pattern of a fourth insulating layer is formed according to the present disclosure.

(35) A pattern of a fourth insulating layer is formed. In an exemplary implementation, forming the pattern of the fourth insulating layer may include: depositing a fourth insulating thin film on the base substrate on which the aforementioned patterns are formed, and patterning the fourth insulating thin film by a patterning process to form the fourth insulating layer that covers the second conductive layer, the fourth insulating layer being provided with a plurality of vias, as shown in FIG. 30.

In an exemplary implementation, the plurality of vias at least include: a first via V1, a second via V2, a third via V3, a fourth via V4, a fifth via V5, a sixth via V6, a seventh via V7, an eighth via V8, a ninth via V9, a tenth via V10, an eleventh via V11, a twelfth via V12, a thirteenth via V13, a fourteenth via V14, a fifteenth via V15, a sixteenth via V16 and a seventeenth via V17.

In an exemplary implementation, an orthographic projection of the first via V1 on the base substrate is within a range of the orthographic projection of the opening 43 on the base substrate, the fourth insulating layer and the third insulating layer within the first via V1 are etched away to expose a surface of the seventh plate 77, and the first via V1 is configured such that a first connection electrode subsequently formed is connected to the seventh plate 77 through this via.

In an exemplary implementation, an orthographic projection of the second via V2 on the base substrate is within a range of an orthographic projection of a second region of the first active layer (also a first region of the second active layer) on the base substrate, the fourth insulating layer, the third insulating layer and the second insulating layer within the second via V2 are etched away to expose a surface of the second region of the first active layer, and the second via V2 is configured such that the first connection electrode subsequently formed is connected to the second region of the first active layer (also the first region of the second active layer) through this via.

In an exemplary implementation, an orthographic projection of the third via V3 on the base substrate is within a range of an orthographic projection of a first region of the fifth active layer on the base substrate, the fourth insulating layer, the third insulating layer and the second insulating layer within the third via V3 are etched away to expose a surface of the first region of the fifth active layer, and the third via V3 is configured such that a second connection electrode subsequently formed is connected to the first region of the fifth active layer through this via.

In an exemplary implementation, an orthographic projection of the fourth via V4 on the base substrate is within a range of an orthographic projection of a second region of the fifth active layer on the base substrate, the fourth insulating layer, the third insulating layer and the second insulating layer within the fourth via V4 are etched away to expose a surface of the second region of the fifth active layer, and the fourth via V4 is configured such that a third connection electrode subsequently formed is connected to the second region of the fifth active layer through this via.

In an exemplary implementation, an orthographic projection of the fifth via V5 on the base substrate is within a range of an orthographic projection of a second region of the second active layer (also a first region of the third active layer) on the base substrate, the fourth insulating layer, the third insulating layer and the second insulating layer within the fifth via V5 are etched away to expose a surface of the second region of the second active layer, and the fifth via V5 is configured such that the third connection electrode subsequently formed is connected to the second region of the second active layer (also the first region of the third active layer) through this via.

In an exemplary implementation, an orthographic projection of the sixth via V6 on the base substrate is within a range of an orthographic projection of a first region of the fourth active layer on the base substrate, the fourth insulating layer, the third insulating layer and the second insulating layer within the sixth via V6 are etched away to expose a surface of the first region of the fourth active layer, and the sixth via V6 is configured such that a fourth connection electrode subsequently formed is connected to the first region of the fourth active layer through this via.

In an exemplary implementation, an orthographic projection of the seventh via V7 on the base substrate is within a range of an orthographic projection of a second region of the fourth active layer (also a second region of the third active layer) on the base substrate, the fourth insulating layer, the third insulating layer and the second insulating layer within the seventh via V7 are etched away to expose a surface of the second region of the fourth active layer, and the seventh via V7 is configured such that a fifth connection electrode subsequently formed is connected to the second region of the fourth active layer (also the second region of the third active layer) through this via.

In an exemplary implementation, an orthographic projection of the eighth via V8 on the base substrate is within a range of an orthographic projection of a first region of the sixth active layer on the base substrate, the fourth insulating layer, the third insulating layer and the second insulating layer within the eighth via V8 are etched away to expose a surface of the first region of the sixth active layer, and the eighth via V8 is configured such that the fifth connection electrode subsequently formed is connected to the first region of the sixth active layer through this via.

In an exemplary implementation, an orthographic projection of the ninth via V9 on the base substrate is within a range of an orthographic projection of a second region of the sixth active layer (also a second region of the seventh active layer) on the base substrate, the fourth insulating layer, the third insulating layer and the second insulating layer within the ninth via V9 are etched away to expose a surface of the second region of the sixth active layer, and the ninth via V9 is configured such that a sixth connection electrode subsequently formed is connected to the second region of the sixth active layer (also the second region of the seventh active layer) through this via.

In an exemplary implementation, an orthographic projection of the tenth via V10 on the base substrate is within a range of the orthographic projection of the shielding electrode 16 on the base substrate, the fourth insulating layer, the third insulating layer, the second insulating layer and the first insulating layer within the tenth via V10 are etched away to expose a surface of the third connection block 83 of the shielding electrode 16, and the tenth via V10 is configured such that the fifth connection electrode subsequently formed is connected to the shielding electrode 16 through this via.

In an exemplary implementation, an orthographic projection of the eleventh via V11 on the base substrate is within a range of an orthographic projection of the eighth plate 78 on the base substrate, the fourth insulating layer within the eleventh via V11 is etched away to expose a surface of the eighth plate 78, and the eleventh via V11 is configured such that a seventh connection electrode subsequently formed is connected to the eighth plate 78 through this via.

In an exemplary implementation, an orthographic projection of the twelfth via V12 on the base substrate is within a range of an orthographic projection of a first region of the first active layer on the base substrate, the fourth insulating layer, the third insulating layer and the second insulating layer within the twelfth via V12 are etched away to expose a surface of the first region of the first active layer, and the twelfth via V12 is configured such that an eighth connection electrode subsequently formed is connected to the first region of the first active layer through this via.

In an exemplary implementation, an orthographic projection of the thirteenth via V13 on the base substrate is within a range of an orthographic projection of a first region of the seventh active layer on the base substrate, the fourth insulating layer, the third insulating layer and the second insulating layer within the thirteenth via V13 are etched away to expose a surface of the first region of the seventh active layer, and the thirteenth via V13 is configured such that a ninth connection electrode subsequently formed is connected to the first region of the seventh active layer through this via.

In an exemplary implementation, orthographic projections of the fourteenth via V14 and the fifteenth via V15 on the base substrate are within a range of the orthographic projection of the first initial sub-line 41 on the base substrate, the fourth insulating layer within the fourteenth via V14 and the fifteenth via V15 is etched away to expose a surface of the first initial sub-line 41, and the fourteenth via V14 and the fifteenth via V15 are configured such that the eighth connection electrode subsequently formed connects adjacent first initial sub-lines 41 to each other through the vias.

In an exemplary implementation, orthographic projections of the sixteenth via V16 and the seventeenth via V17 on the base substrate are within a range of the orthographic projection of the second initial sub-line 42 on the base substrate, the fourth insulating layer within the sixteenth via V16 and the seventeenth via V17 is etched away to expose a surface of the second initial sub-line 42, and the sixteenth via V16 and the seventeenth via V17 are configured such that the ninth connection electrode subsequently formed connects adjacent second initial sub-lines 42 to each other through the vias.

In an exemplary implementation, a material and a thickness of the fourth insulating layer may be substantially the same as those in an aforementioned embodiment.

Figure 31:
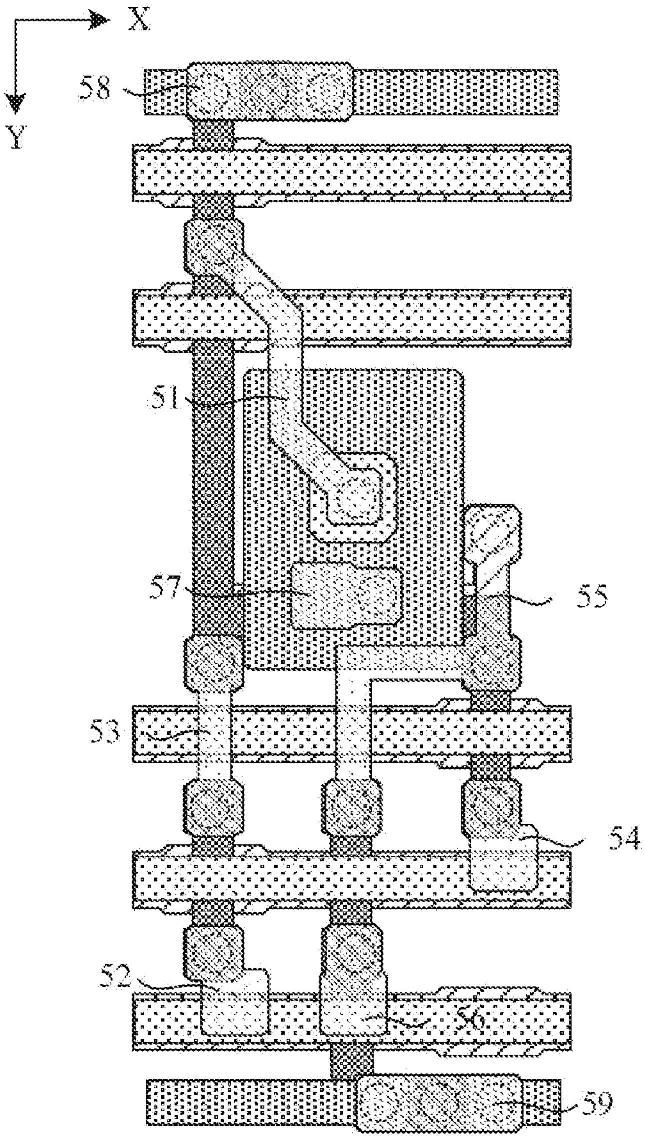
FIG. 31 is a schematic diagram of a further display substrate after a pattern of a third conductive layer is formed according to the present disclosure.

(36) A pattern of a third conductive layer is formed. In an exemplary implementation, forming the third conductive layer may include: depositing a third conductive thin film on the base substrate on which the aforementioned patterns are formed, and patterning the third conductive thin film by a patterning process to form a third conductive layer arranged on the fourth insulating layer, as shown in FIG. 31.

In an exemplary implementation, the third conductive layer of each circuit unit at least includes: a first connection electrode 51, a second connection electrode 52, a third connection electrode 53, a fourth connection electrode 54, a fifth connection electrode 55, a sixth connection electrode 56, a seventh connection electrode 57, an eighth connection electrode 58 and a ninth connection electrode 59.

In an exemplary implementation, the first connection electrode 51 may be in a shape of a broken line in which a main portion extends in the second direction Y, a first end of the first connection electrode 51 is connected to the seventh plate 77 through the first via V1, and a second end of the first connection electrode 51 is connected to the second region of the first active layer (also the first region of the second active layer) through the second via V2, so that the seventh plate 77, the second electrode of the first transistor T1 and the first electrode of the second transistor T2 have a same potential. In an exemplary implementation, the first connection electrode 51 may serve as the first node N1 of the pixel drive circuit.

In an exemplary implementation, the second connection electrode 52 may be in a shape of a polygon, and the second connection electrode 52 is connected to the first region of the fifth active layer through the third via V3. In an exemplary implementation, the second connection electrode 52 is configured to be connected to a first power supply line subsequently formed.

In an exemplary implementation, the third connection electrode 53 may be in a shape of a strip in which a main portion extends in the second direction Y, a first end of the third connection electrode 53 is connected to the second region of the fifth active layer through the fourth via V4, and a second end of the third connection electrode 53 is connected to the second region of the second active layer through the fifth via V5. In an exemplary implementation, the third connection electrode 53 may serve as the second node N2 of the pixel drive circuit.

In an exemplary implementation, the fourth connection electrode 54 may be in a shape of a strip in which a main portion extends in the second direction Y, and the fourth connection electrode 54 is connected to the first region of the fourth active layer through the sixth via V6. In an exemplary implementation, the fourth connection electrode 54 may serve as the first electrode of the fourth transistor T4 (referred to as a data input electrode), and the fourth connection electrode 54 is configured to be connected to a data signal line subsequently formed.

In an exemplary implementation, the fifth connection electrode 55 may be in a shape of a broken line in which a main portion extends in the second direction Y, a first end of the fifth connection electrode 55 is connected to the first region of the sixth active layer through the eighth via V8, a second end of the fifth connection electrode 55 is connected to the third connection block 83 of the shielding electrode 16 through the tenth via V10, a third end of the fifth connection electrode 55 is connected to the second region of the fourth active layer through the seventh via V7, and the third end of the fifth connection electrode 55 is located between the first end and the second end. In an exemplary implementation, the fifth connection electrode 55 may serve as the third node N3 of the pixel drive circuit.

In an exemplary implementation, the sixth connection electrode 56 may be in a shape of a polygon, and the sixth connection electrode 56 is connected to the second region of the sixth active layer (also the second region of the seventh active layer) through the ninth via V9. In an exemplary implementation, the sixth connection electrode 56 may serve as the fourth node N4 of the pixel drive circuit, and is configured to be connected to the anode connection electrode subsequently formed.

In an exemplary implementation, the seventh connection electrode 57 may be in a shape of a polygon, and the seventh connection electrode 57 is connected to the eighth plate 78 through the eleventh via V11. In an exemplary implementation, the seventh connection electrode 57 may serve as the fourth node N4 of the pixel drive circuit, and is configured to be connected to the anode connection electrode subsequently formed.

In an exemplary implementation, the eighth connection electrode 58 may be in a shape of a strip in which a main portion extends in the first direction X, a middle portion of the eighth connection electrode 58 is connected to the first region of the first active layer through the twelfth via V12, and both ends of the eighth connection electrode 58 are connected to the first initial sub-lines 41 located on both sides of the first region of the first active layer through the fourteenth via V14 and the fifteenth via V15, respectively, which, on the one hand, realizes connection between adjacent first initial sub-lines 41 to form a first initial signal line, and on the other hand, realizes connection between the first initial signal line and the first electrode of the first transistor T1 so that a first initial voltage transmitted by the first initial signal line is written to the first electrode of the first transistor T1.

In an exemplary implementation, the ninth connection electrode 59 may be in a shape of a strip in which a main portion extends in the first direction X, a middle portion of the ninth connection electrode 59 is connected to the first region of the seventh active layer through the thirteenth via V13, and both ends of the ninth connection electrode 59 are connected to the second initial sub-lines 42 located on both sides of the first region of the seventh active layer through the sixteenth via V16 and the seventeenth via V17, respectively, which, on the one hand, realizes connection between adjacent second initial sub-lines 42 to form a second initial signal line, and on the other hand, realizes connection between the second initial signal line and the first electrode of the seventh transistor T7 so that a second initial voltage transmitted by the second initial signal line is written to the first electrode of the seventh transistor T7.

In the exemplary implementation, a material and a thickness of the third conductive layer may be substantially the same as those in an aforementioned embodiment.

Figure 32:
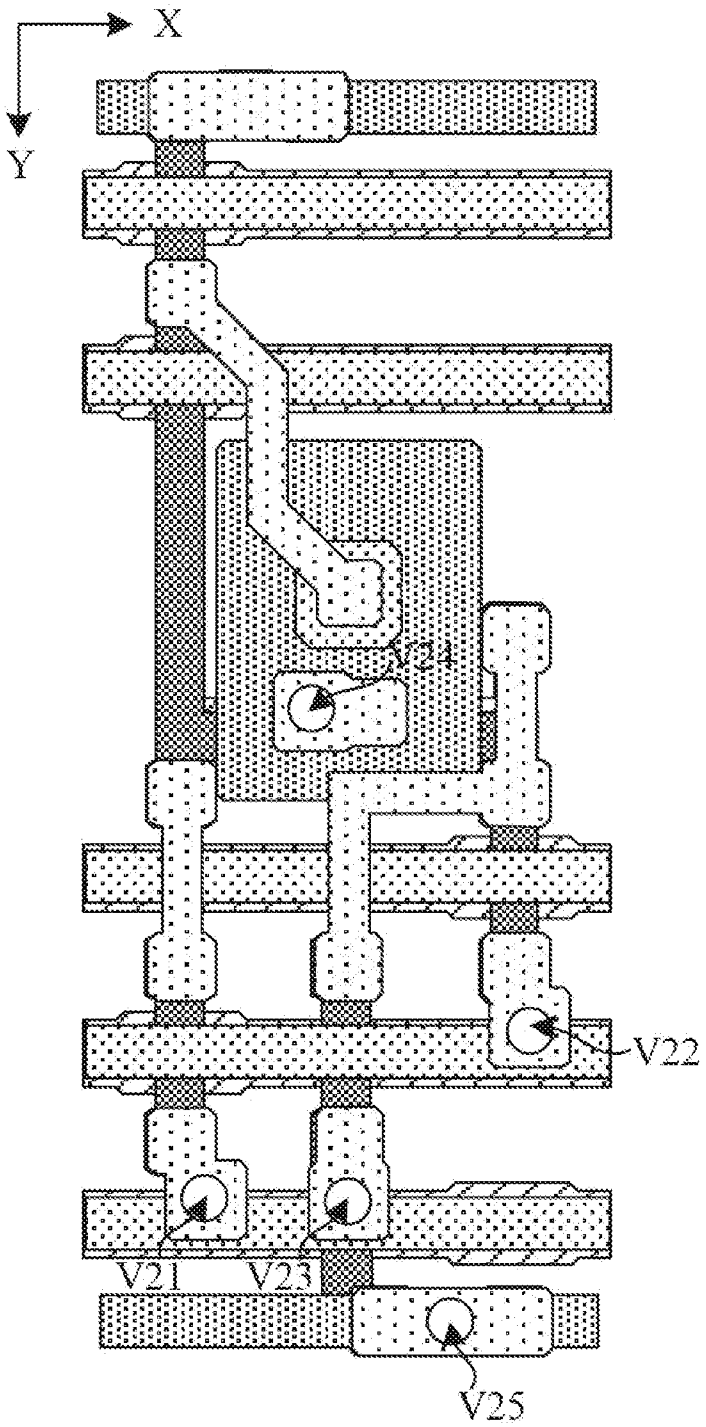
FIG. 32 is a schematic diagram of a further display substrate after a pattern of a first planarization layer is formed according to the present disclosure.

(37) A pattern of a first planarization layer is formed. In an exemplary implementation, forming the pattern of the first planarization layer may include: first depositing a fifth insulating thin film on the base substrate on which the aforementioned patterns are formed, then coating a first planarization thin film, and patterning the first planarization thin film and the fifth insulating thin film by a patterning process to form a fifth insulating layer that covers the pattern of the third conductive layer and the first planarization layer arranged on the fifth insulating layer, the first planarization layer being provided with a plurality of vias, as shown in FIG. 32.

In an exemplary implementation, the plurality of vias in each circuit unit at least include: a twenty-first via V21, a twenty-second via V22, a twenty-third via V23, a twenty-fourth via V24 and a twenty-fifth via V25.

In an exemplary implementation, an orthographic projection of the twenty-first via V21 on the base substrate is within a range of an orthographic projection of the second connection electrode 52 on the base substrate, the first planarization layer and the fifth insulating layer within the twenty-first via V21 are etched away to expose a surface of the second connection electrode 52, and the twenty-first via V21 is configured such that a first power supply line subsequently formed is connected to the second connection electrode 52 through this via.

In an exemplary implementation, an orthographic projection of the twenty-second via V22 on the base substrate is within a range of an orthographic projection of the fourth connection electrode 54 on the base substrate, the first planarization layer and the fifth insulating layer within the twenty-second via V22 are etched away to expose a surface of the fourth connection electrode 54, and the twenty-second via V22 is configured such that a data signal line subsequently formed is connected to the fourth connection electrode 54 through this via.

In an exemplary implementation, an orthographic projection of the twenty-third via V23 on the base substrate is within a range of an orthographic projection of the sixth connection electrode 56 on the base substrate, the first planarization layer and the fifth insulating layer within the twenty-third via V23 are etched away to expose a surface of the sixth connection electrode 56, and the twenty-third via V23 is configured such that an anode connection electrode formed subsequently is connected to the sixth connection electrode 56 through this via.

In an exemplary implementation, an orthographic projection of the twenty-fourth via 24 on the base substrate is within a range of an orthographic projection of the seventh connection electrode 57 on the base substrate, the first planarization layer and the fifth insulating layer within the twenty-fourth via V24 are etched away to expose a surface of the seventh connection electrode 57, and the twenty-fourth via V24 is configured such that the anode connection electrode subsequently formed is connected to the seventh connection electrode 57 through this via.

In an exemplary implementation, an orthographic projection of the twenty-fifth via 25 on the base substrate is within a range of an orthographic projection of the ninth connection electrode 59 on the base substrate, the first planarization layer and the fifth insulating layer within the twenty-fifth via V25 are etched away to expose a surface of the ninth connection electrode 59, and the twenty-fifth via V25 is configured such that an initial connection line subsequently formed is connected to the ninth connection electrode 59 through this via.

In an exemplary implementation, a material and a thickness of the first planarization layer may be substantially the same as those in an aforementioned embodiment.

Figure 33:
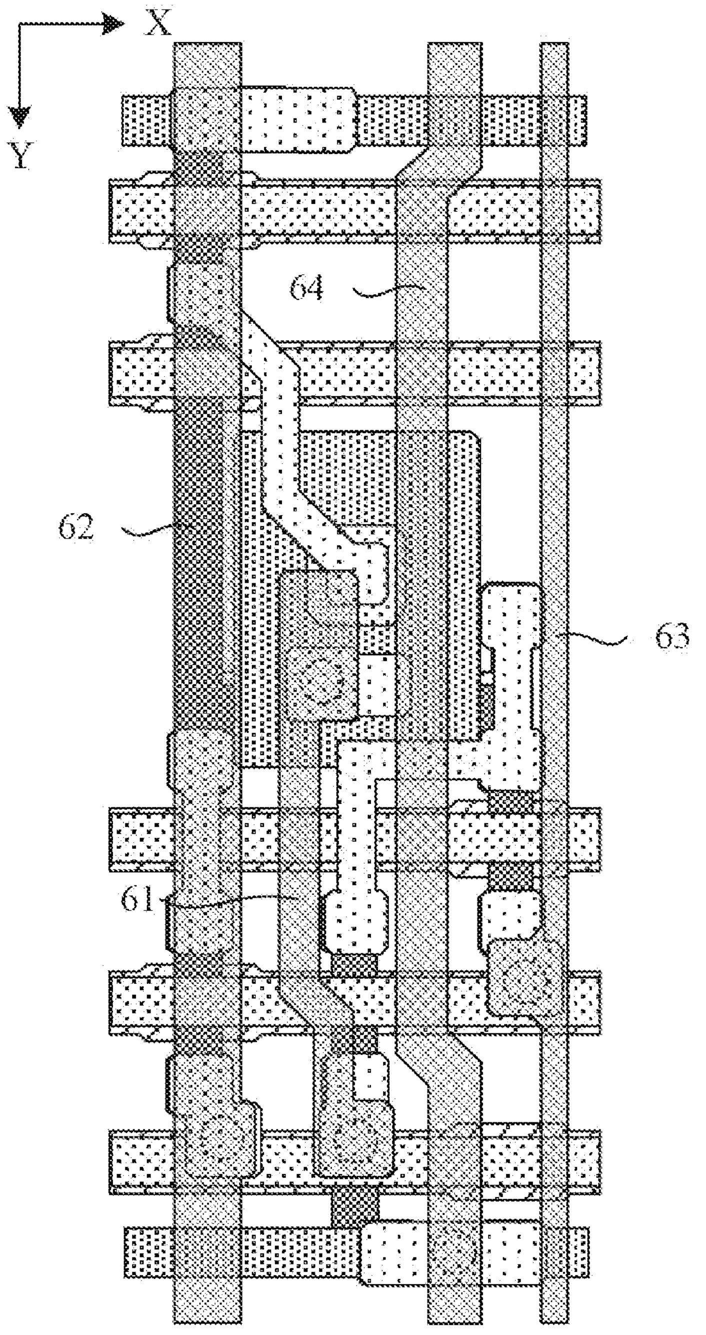
FIG. 33 is a schematic diagram of a further display substrate after a pattern of a fourth conductive layer is formed according to the present disclosure.

(38) A pattern of a fourth conductive layer is formed. In an exemplary implementation, forming the fourth conductive layer may include: depositing a fourth conductive thin film on the base substrate on which the aforementioned patterns are formed, and patterning the fourth conductive thin film by a patterning process to form the fourth conductive layer arranged on the first planarization layer, as shown in FIG. 33.

In an exemplary implementation, the fourth conductive layer of each circuit unit at least includes: an anode connection electrode 61, a first power supply line 62, a data signal line 63 and an initial connection line 64.

In an exemplary implementation, the anode connection electrode 61 may be in a shape of a broken line in which a main portion extends in the second direction Y, a first end of the anode connection electrode 61 is connected to the sixth connection electrode 56 through the twenty-third via V23, and a second end of the anode connection electrode 61 is connected to the seventh connection electrode 57 through the twenty-fourth via. The sixth connection electrode 56 is connected to the second region of the sixth active layer (also the second region of the seventh active layer) through a via, and the seventh connection electrode 57 is connected to the eighth plate 78 through a via, thereby realizing that the eighth plate 78, the second electrode of the sixth transistor T6 and the second electrode of the seventh transistor T7 have a same potential (the fourth node N4 in the pixel drive circuit). In an exemplary implementation, the anode connection electrode 61 is configured to be connected to an anode subsequently formed, thereby enabling the pixel drive circuit to output a drive current to a light emitting device.

In an exemplary implementation, the anode connection electrode 61 may be provided with a first bump, or may be provided with a second bump, or may be provided with a first bump and a second bump, which is not limited here in the present disclosure.

In an exemplary implementation, the first power supply line 62 may be in a shape of a straight line or a broken line in which a main portion extends in the second direction Y, and the first power supply line 62 is connected to the second connection electrode 52 through the twenty-first via V21. Since the second connection electrode 52 is connected to the first region of the fifth active layer through a via, it is realized that the first power supply line 62 can write a first power supply signal to the first electrode of the fifth transistor T5.

In an exemplary implementation, an orthographic projection of the first power supply line 62 on the base substrate may at least partially overlap the orthographic projection of the first connection electrode 51 on the base substrate, so that the first power supply line 62 can be used as a shielding electrode, which can effectively shield the influence of data voltage jump on key nodes in the pixel drive circuit, thereby avoiding the influence of data voltage jump on the potential of the key nodes in the pixel drive circuit, and improving the display effect.

In an exemplary implementation, the orthographic projection of the first power supply line 62 on the base substrate may at least partially overlap the orthographic projection of the third connection electrode 53 on the base substrate, so that the first power supply line 62 can be used as a shielding electrode, which can effectively shield the influence of data voltage jump on key nodes in the pixel drive circuit, thereby avoiding the influence of data voltage jump on the potential of the key nodes in the pixel drive circuit, and improving the display effect.

In an exemplary implementation, the data signal line 63 may be in a shape of a straight line in which a main portion extends in the second direction Y, and the data signal line 63 is connected to the fourth connection electrode 54 through the twenty-second via V22. Since the fourth connection electrode 54 is connected to the first region of the fourth active layer through a via, connection between the data signal line 63 and the first electrode of the fourth transistor T4 is realized, and the data signal line 63 can write a data signal to the first electrode of the fourth transistor T4.

In an exemplary implementation, the initial connection line 64 may be in a shape of a straight line or a broken line in which a main portion extends in the second direction Y, and the initial connection line 64 is connected to the ninth connection electrode 59 through the twenty-fifth via V25. The second initial sub-line 42 and the ninth connection electrode 59 form a second initial signal line for transmitting a second initial signal, and the initial connection line 64 is connected to the ninth connection electrode 59, so that the second initial signal line extending in the first direction X and the initial connection line 64 extending in the second direction Y form an initial connection line of a network communication structure in a display region, which may reduce, to the greatest extent, the resistance of the initial signal line, reduce a voltage drop of an initial voltage, and effectively improve uniformity of the initial voltage in the display substrate, thus effectively improving the display uniformity and improving the display attribute and the display quality.

In an exemplary implementation, the initial connection line 64, the ninth connection electrode 59 and the second initial sub-line 42 are respectively arranged in different conductive layers, the initial connection line 64 is connected to the ninth connection electrode 59 through a via, and the ninth connection electrode 59 is connected to the second initial sub-line 42 through a via.

In an exemplary implementation, a material and a thickness of the fourth conductive layer may be substantially the same as those in an aforementioned embodiment.

Subsequently, a second planarization thin film is coated on the base substrate on which the aforementioned patterns are formed, and the second planarization thin film is patterned by a patterning process to form a second planarization layer that covers the pattern of the fourth conductive layer. The second planarization layer is provided with an anode via, an orthographic projection of the anode via on the base substrate is within a range of the orthographic projection of the anode connection electrode on the base substrate, and the anode via is configured such that the anode subsequently formed is connected to the anode connection electrode through this via. In an exemplary implementation, a material and a thickness of the second planarization layer may be substantially the same as those in an aforementioned embodiment.

At this point, the drive circuit layer has been prepared on the base substrate. In a plane parallel to the display substrate, the drive circuit layer may include a plurality of circuit units, each circuit unit may include a pixel drive circuit, and a first scan signal line, a second scan signal line, a third scan signal line, a fourth scan signal line, a light emitting control line, a first initial signal line, a second initial signal line, a first power supply line and a data signal line which are connected to the pixel drive circuit. In a plane perpendicular to the display substrate, the drive circuit layer may include a shielding conductive layer, a first insulating layer, a semiconductor layer, a second insulating layer, a first conductive layer, a third insulating layer, a second conductive layer, a fourth insulating layer, a third conductive layer, a fifth insulating layer, a first planarization layer, a fourth conductive layer and a second planarization layer which are arranged sequentially on the base substrate. The shielding conductive layer may at least include a shielding electrode and a plurality of shielding lines, the semiconductor layer may at least include active layers of a first transistor to a seventh transistor, the first conductive layer may at least include a first plate of a storage capacitor and a plurality of scan signal lines, the second conductive layer may at least include a second plate of the storage capacitor, a first initial sub-line and a second initial sub-line, the third conductive layer may at least include a first connection electrode to a ninth connection electrode, and the fourth conductive layer may at least include an anode connection electrode, a first power supply line and a data signal line.

As can be seen from the structure and preparation process of the display substrate described above, the two plates of the storage capacitor of the exemplary embodiment are located in the first conductive layer and the second conductive layer, respectively, and the third insulating layer between the first conductive layer and the second conductive layer is made of silicon nitride, which may ensure the capacitor performance. In the exemplary embodiment, the bottom gate electrodes of the plurality of transistors are arranged in the shielding conductive layer, and the top gate electrodes of the plurality of transistors are arranged in the first conductive layer, which may effectively ensure shielding of the oxide transistors and improve the electrical performance of the transistors. The preparation process in the present disclosure may be compatible well with an existing preparation process, which is simple in process implementation, is easy to implement, and has a high production efficiency, a low production cost and a high yield.

Figure 34:
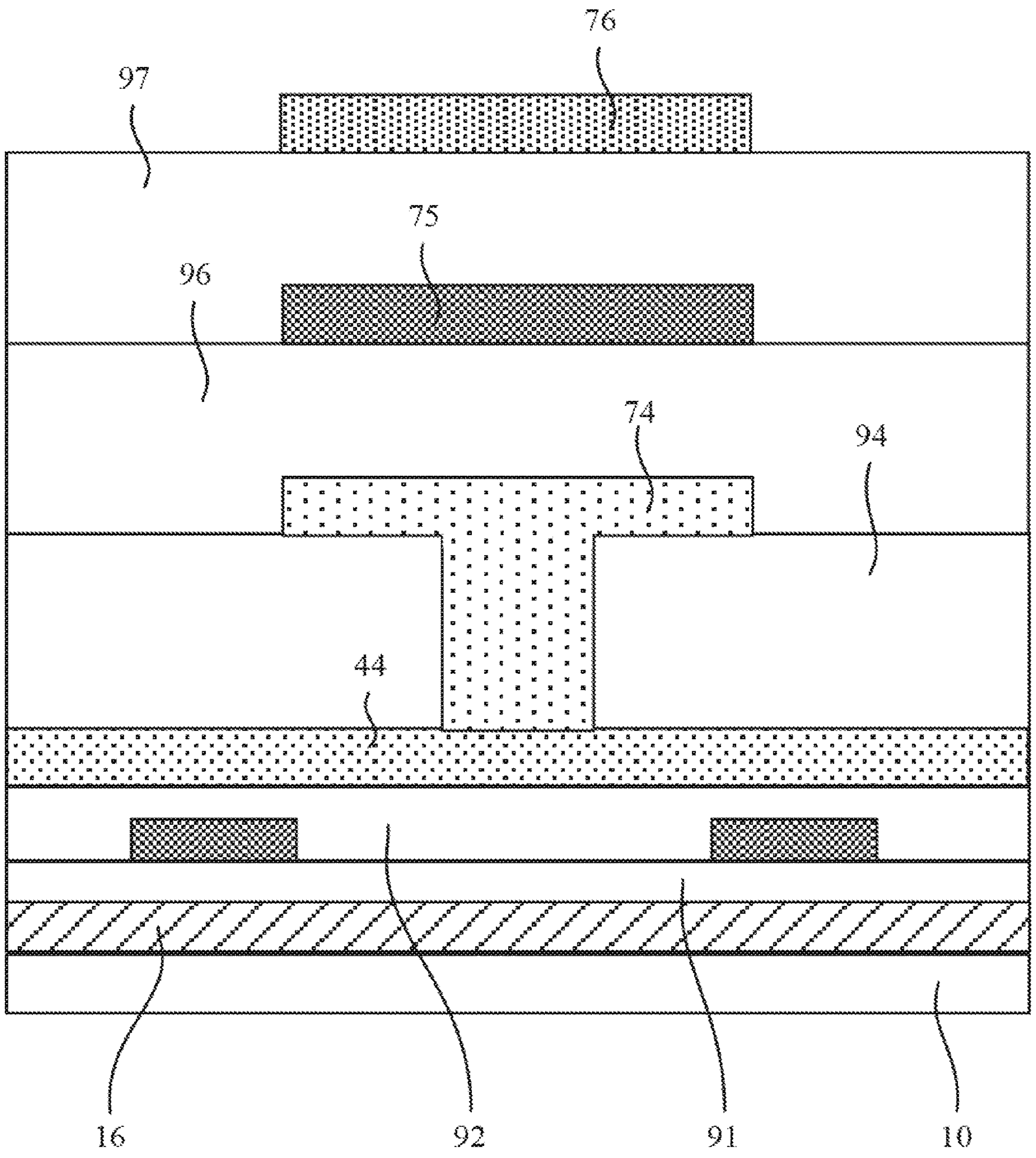
FIG. 34 is a schematic diagram of a planar structure of a further display substrate according to an exemplary embodiment of the present disclosure.

FIG. 34 is a schematic diagram of a planar structure of a further display substrate according to an exemplary embodiment of the present disclosure. As shown in FIG. 34, a main structure of this exemplary embodiment is substantially the same as that shown in FIG. 15, except that the drive circuit layer may further include: a second planarization layer 97 arranged on a side of the fourth conductive layer away from the base substrate and a fifth conductive layer arranged on a side of the second planarization layer 97 away from the base substrate.

In an exemplary implementation, the third conductive layer may at least include a fourth plate 74 of the storage capacitor, the fourth conductive layer may at least include a fifth plate 75 of the storage capacitor, and the fifth conductive layer may at least include a sixth plate 76 of the storage capacitor. An orthographic projection of the fourth plate 74 on the base substrate at least partially overlaps an orthographic projection of the fifth plate 75 on the base substrate, the fourth plate 74 and the fifth plate 75 form a third storage capacitor, an orthographic projection of the sixth plate 76 on the base substrate at least partially overlaps the orthographic projection of the fifth plate 75 on the base substrate, the fifth plate 75 and the sixth plate 76 form a fourth storage capacitor, and the third storage capacitor and the fourth storage capacitor form a storage capacitor with a parallel structure.

In an exemplary implementation, the fourth plate 74 may be connected to the third gate electrode 44 through a via, and the sixth plate 76 may be connected to the third gate electrode 44 or the fourth plate 74 through a via, so that the fourth plate 74 and the sixth plate 76 have a same potential, the fifth plate 75 may be connected to the anode connection electrode, and the fourth plate 74 located in the third conductive layer, the fifth plate 75 located in the fourth conductive layer and the sixth plate 76 located in the fifth conductive layer form a storage capacitor with a parallel structure.

In an exemplary implementation, only the first planarization layer 96, or the fifth insulating layer and the first planarization layer 96, may be arranged between the third conductive layer and the fourth conductive layer, and the drive circuit layer may include the third insulating layer and the second conductive layer, which is not limited here in the present disclosure.

Figure 35:
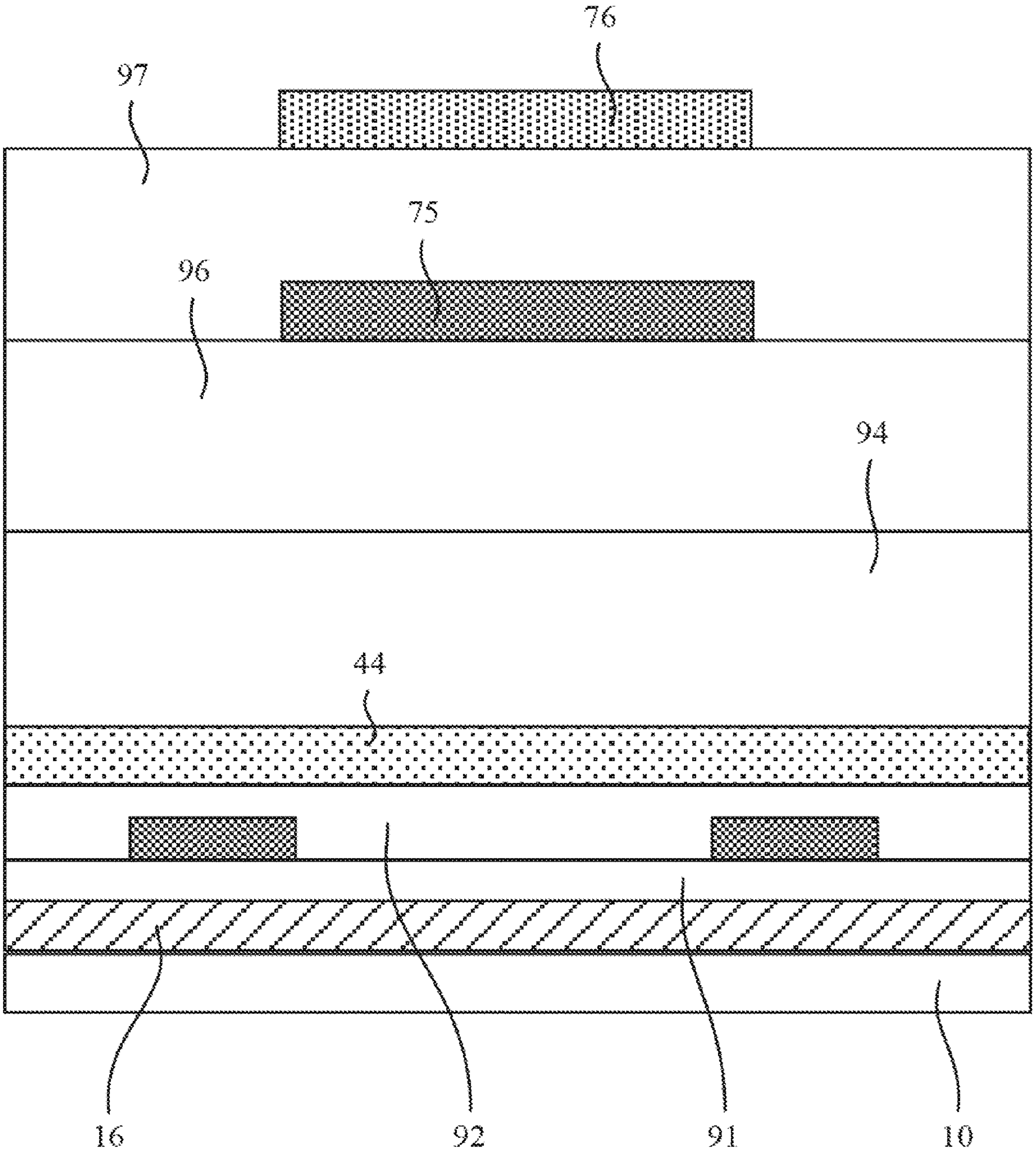
FIG. 35 is a schematic diagram of a planar structure of a still further display substrate according to an exemplary embodiment of the present disclosure.

FIG. 35 is a schematic diagram of a planar structure of a still further display substrate according to an exemplary embodiment of the present disclosure. As shown in FIG. 35, a main structure of this exemplary embodiment is substantially the same as that shown in FIG. 15, except that the drive circuit layer may further include: a second planarization layer 97 arranged on a side of the fourth conductive layer away from the base substrate and a fifth conductive layer arranged on a side of the second planarization layer 97 away from the base substrate.

In an exemplary implementation, no fourth plate is provided in the third conductive layer, the fourth conductive layer may at least include a fifth plate 75 of the storage capacitor, the fifth conductive layer may at least include a sixth plate 76 of the storage capacitor, an orthographic projection of the sixth plate 76 on the base substrate at least partially overlaps an orthographic projection of the fifth plate 75 on the base substrate, and the fifth plate 75 and the sixth plate 76 form a storage capacitor.

In an exemplary implementation, the fifth plate 75 may be connected to the anode connection electrode, the fifth plate 75 has a potential of the fourth node, the sixth plate 76 may be connected to the third gate electrode 44 through a via, the sixth plate 76 has a potential of the first node, and the fifth plate 75 located in the fourth conductive layer and the sixth plate 76 located in the fifth conductive layer form a storage capacitor.

Figure 36:
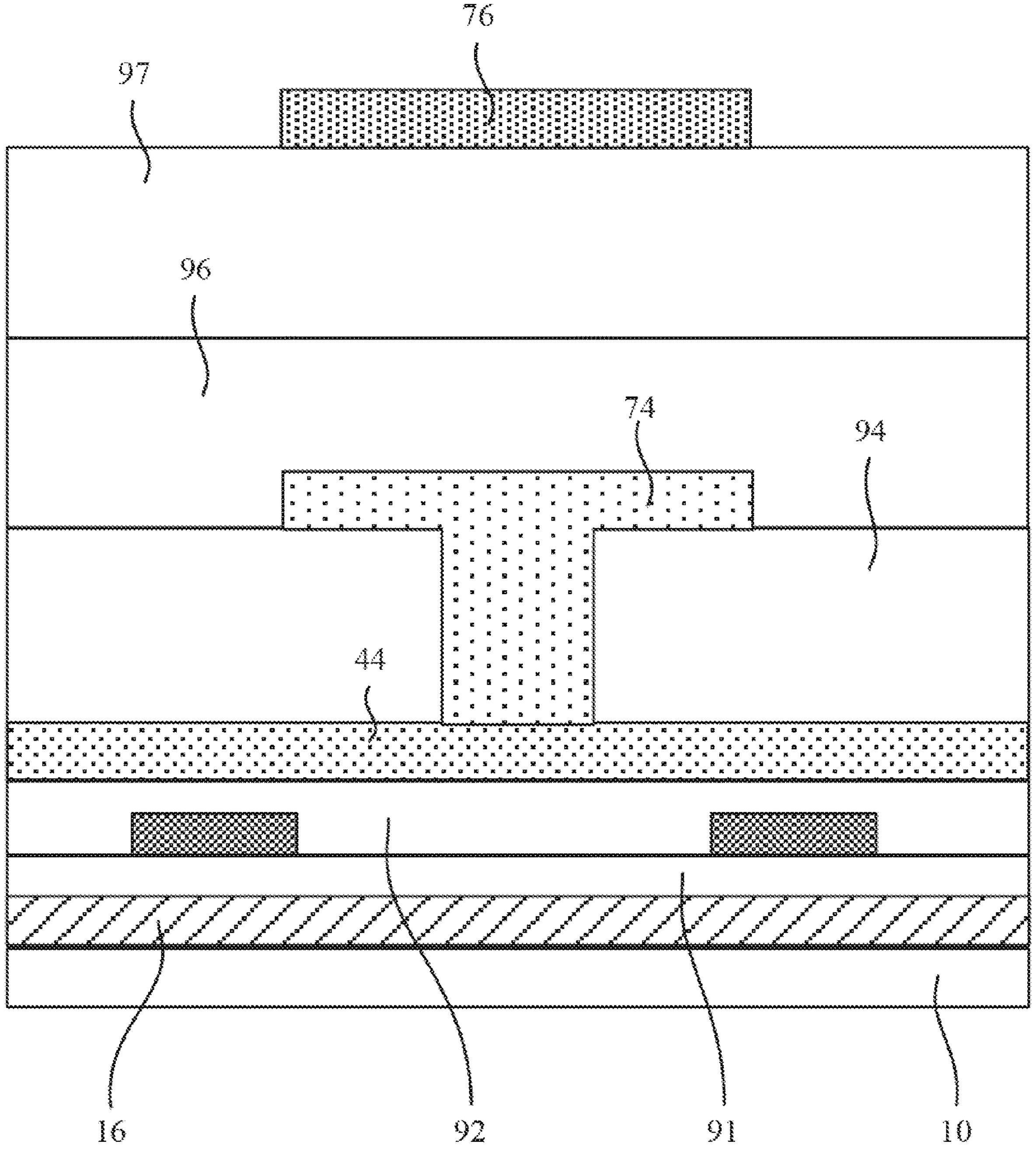
FIG. 36 is a schematic diagram of a planar structure of a still further display substrate according to an exemplary embodiment of the present disclosure.

FIG. 36 is a schematic diagram of a planar structure of a still further display substrate according to an exemplary embodiment of the present disclosure. As shown in FIG. 36, a main structure of this exemplary embodiment is substantially the same as that shown in FIG. 15, except that the drive circuit layer may further include: a second planarization layer 97 arranged on a side of the fourth conductive layer away from the base substrate and a fifth conductive layer arranged on a side of the second planarization layer 97 away from the base substrate.

In an exemplary implementation, the third conductive layer may at least include a fourth plate 74 of the storage capacitor, no fifth plate is arranged in the fourth conductive layer, the fifth conductive layer may at least include a sixth plate 76 of the storage capacitor, an orthographic projection of the sixth plate 76 on the base substrate at least partially overlaps an orthographic projection of the fourth plate 74 on the base substrate, and the fourth plate 74 and the sixth plate 76 form a storage capacitor.

In an exemplary implementation, the fourth plate 74 may be connected to the third gate electrode 44 through a via, the fourth plate 74 has the potential of the first node, the sixth plate 76 may be connected to the anode connection electrode, the sixth plate 76 has the potential of the fourth node, and the fourth plate 74 located in the third conductive layer and the sixth plate 76 located in the fifth conductive layer form a storage capacitor.

In an exemplary implementation, the storage capacitor structure shown in FIG. 5, the storage capacitor structure shown in FIG. 15, the storage capacitor structure shown in FIG. 24, and the storage capacitor structures shown in FIG. 34 to FIG. 36 may be combined with each other to form a storage capacitor structure in which a plurality of storage capacitors are connected in parallel to improve, to the greatest extent, the capacity of the storage capacitor, which is not limited here in the present disclosure.

The structure shown above and the preparation process thereof in the present disclosure are merely exemplary description. In an exemplary implementation, corresponding structures may be changed and patterning processes may be added or reduced according to actual needs, which is not limited here in the present disclosure.

In an exemplary implementation, the display substrate of the present disclosure may be applied to other display apparatus having a pixel drive circuit, such as quantum dot display and the like, which is not limited here in the present disclosure.

The present disclosure further provides a preparation method for a display substrate to manufacture the display substrate provided by the embodiments described above. In an exemplary implementation, the display substrate includes a plurality of circuit units, at least one circuit unit includes a pixel drive circuit, the pixel drive circuit includes a storage capacitor and a plurality of oxide transistors, the storage capacitor includes a first capacitor plate and a second capacitor plate, an orthographic projection of the first capacitor plate on a plane of the display substrate at least partially overlaps an orthographic projection of the second capacitor plate on the plane of the display substrate, and a capacitor insulating layer is arranged between the first capacitor plate and the second capacitor plate; and the preparation method includes:

forming a semiconductor layer and a first source-drain metal layer on a base substrate in a direction away from the base substrate, at least one capacitor insulating layer being arranged on a side of the semiconductor layer close to the base substrate, or at least one capacitor insulating layer being arranged on a side of the first source-drain metal layer away from the base substrate.

The present disclosure further provides a display apparatus which includes the aforementioned display substrate. The display apparatus may be any product or component with a display function, such as a mobile phone, a tablet computer, a television, a display, a laptop computer, a digital photo frame, or a navigator, and the embodiments of the present invention are not limited thereto.

Although the implementations disclosed in the present disclosure are described as above, the described contents are only implementations which are used for facilitating the understanding of the present disclosure, and are not intended to limit the present invention. Any skilled person in the art to which the present disclosure pertains may make any modifications and variations in forms and details of implementations without departing from the spirit and scope of the present disclosure. However, the patent protection scope of the present invention should be subject to the scope defined by the appended claims.

The invention claimed is:

1. A display substrate, comprising a plurality of circuit units, wherein at least one circuit unit comprises a pixel drive circuit, the pixel drive circuit comprises a storage capacitor and a plurality of oxide transistors, the storage capacitor at least comprises a first capacitor plate and a second capacitor plate, an orthographic projection of the first capacitor plate on a plane of the display substrate at least partially overlaps an orthographic projection of the second capacitor plate on the plane of the display substrate, and a capacitor insulating layer is arranged between the first capacitor plate and the second capacitor plate; and on a plane perpendicular to the display substrate, at least one circuit unit comprises a semiconductor layer and a first source-drain metal layer arranged on a base substrate in a direction away from the base substrate, at least one capacitor insulating layer is arranged on a side of the semiconductor layer close to the base substrate, or at least one capacitor insulating layer is arranged on a side of the first source-drain metal layer away from the base substrate, wherein on the plane perpendicular to the display substrate, at least one circuit unit at least comprises a shielding conductive layer, a first insulating layer, a first gate metal layer, a second insulating layer, the semiconductor layer, a third insulating layer, a second gate metal layer, a fourth insulating layer and the first source-drain metal layer arranged sequentially on the base substrate in the direction away from the base substrate, the first capacitor plate comprises a first plate arranged in the shielding conductive layer, the second capacitor plate comprises a second plate arranged in the first gate metal layer, an orthographic projection of the first plate on the base substrate at least partially overlaps an orthographic projection of the second plate on the base substrate, and the first plate and the second plate form a first storage capacitor.

2. The display substrate according to claim 1, wherein the first capacitor plate further comprises a third plate arranged in the second gate metal layer, an orthographic projection of the third plate on the base substrate at least partially overlaps the orthographic projection of the second plate on the base substrate, and the third plate and the second plate form a second storage capacitor.

3. The display substrate according to claim 2, wherein the third plate is connected to the first plate through a connection electrode, and the first storage capacitor and the second storage capacitor form a storage capacitor with a parallel structure.

4. The display substrate according to claim 3, wherein the plurality of oxide transistors at least comprise a drive transistor, the drive transistor comprises a bottom gate electrode and a top gate electrode, the bottom gate electrode of the drive transistor is arranged in the first gate metal layer, the top gate electrode of the drive transistor is arranged in the second gate metal layer, the bottom gate electrode of the drive transistor and the second plate are connected to each other to form an integrated structure, and the top gate electrode of the drive transistor and the third plate are connected to each other to form an integrated structure.

5. The display substrate according to claim 4, wherein the plurality of oxide transistors further comprise a compensation transistor and a first reset transistor, a first electrode of the first reset transistor is connected to a first initial signal line, a second electrode of the compensation transistor is connected to a first electrode of the drive transistor, and a second electrode of the first reset transistor and a first electrode of the compensation transistor are connected to the top gate electrode of the drive transistor.

6. The display substrate according to claim 4, wherein the plurality of oxide transistors further comprise a light emitting transistor and a second reset transistor, a first electrode of the light emitting transistor is connected to a second electrode of the drive transistor, a first electrode of the second reset transistor is connected to a second initial signal line, and a second electrode of the light emitting transistor and a second electrode of the second reset transistor are connected to the bottom gate electrode of the drive transistor.

7. A display apparatus, comprising the display substrate according to claim 1.

8. A preparation method for a display substrate, wherein the display substrate comprises a plurality of circuit units, at least one circuit unit comprises a pixel drive circuit, the pixel drive circuit comprises a storage capacitor and a plurality of oxide transistors, the storage capacitor comprises a first capacitor plate and a second capacitor plate, an orthographic projection of the first capacitor plate on a plane of the display substrate at least partially overlaps an orthographic projection of the second capacitor plate on the plane of the display substrate, and a capacitor insulating layer is arranged between the first capacitor plate and the second capacitor plate; the preparation method comprising:

forming a semiconductor layer and a first source-drain metal layer on a base substrate in a direction away from the base substrate, at least one capacitor insulating layer being arranged on a side of the semiconductor layer close to the base substrate, or at least one capacitor insulating layer being arranged on a side of the first source-drain metal layer away from the base substrate, wherein on a plane perpendicular to the display substrate, a shielding conductive layer, a first insulating layer, a first gate metal layer, a second insulating layer, the semiconductor layer, a third insulating layer, a second gate metal layer, a fourth insulating layer and the first source-drain metal layer are arranged sequentially on the base substrate in the direction away from the base substrate, the first capacitor plate comprises a first plate arranged in the shielding conductive layer, the second capacitor plate comprises a second plate arranged in the first gate metal layer, an orthographic projection of the first plate on the base substrate at least partially overlaps an orthographic projection of the second plate on the base substrate, and the first plate and the second plate form a first storage capacitor.

* * * * *